(12) United States Patent
Yui et al.

(10) Patent No.: US 6,455,211 B1
(45) Date of Patent: *Sep. 24, 2002

(54) PATTERN TRANSFER METHOD AND APPARATUS, AND DEVICE MANUFACTURING METHOD

(75) Inventors: Yoshikiyo Yui, Utsunomiya; Masato Muraki, Inagi, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,135

(22) Filed: Feb. 3, 1999

(30) Foreign Application Priority Data

Feb. 9, 1998 (JP) .......................................... 10-027488
Oct. 26, 1998 (JP) .......................................... 10-304275
Jan. 19, 1999 (JP) .......................................... 11-010763

(51) Int. Cl.$^7$ ................................................. G03F 9/00
(52) U.S. Cl. ............................................ 430/22; 430/5
(58) Field of Search .......................... 430/22, 30, 5; 356/399, 401; 250/491; 257/797

(56) References Cited

U.S. PATENT DOCUMENTS 5,864,142 A  1/1999  Muraki et al. ........... 250/491.1
5,973,766 A  * 10/1999  Matsuura et al. ............. 355/52

FOREIGN PATENT DOCUMENTS

JP        2647835       5/1997

* cited by examiner

Primary Examiner—Mark F. Huff
Assistant Examiner—Saleha R. Mohamedulla
(74) Attorney, Agent, or Firm—Fitzpatrick, Cella, Harper & Scinto

(57) ABSTRACT

The joint precision of a transfer pattern is improved by correcting the relative positions between the partial transfer patterns on a transfer mask and a transfer medium. The positions of alignment marks for the partial transfer patterns on the transfer mask are measured (step 23), and the actual coordinate system of the alignment marks is calculated based on the measured positions (step 25). Parameters that represent the relative relationship between the actual coordinate system calculated in step 25 and a design coordinate system are calculated (step 26), and the transfer positions of the partial transfer patterns to the transfer medium are calculated based on the calculated parameters (step 29). After that, a mask stage and wafer stage are driven based on the transfer positions calculated in step 29 to sequentially transfer patterns by exposure (steps 34 to 40).

40 Claims, 43 Drawing Sheets

FINALLY CORRECTED LATTICE

=

VIRTUAL LATTICE

+

FABRICATION COORDINATE SYSTEM

PATTERN TRANSFER METHOD AND APPARATUS, AND DEVICE MANUFACTURING METHOD

BACKGROUND OF THE INVENTION

The present invention relates to a transfer method and apparatus, which use a transfer mask formed with a plurality of partial transfer patterns and a plurality of alignment marks, and which transfer the partial transfer patterns onto a transfer medium in turn, and consequently transfer a pattern obtained by joining the plurality of partial patterns, and a method of manufacturing a device using the transfer method.

As semiconductor devices continue to shrink in feature size and their performance and functions improve, lithography apparatuses now have higher resolutions and larger field angles, and the transfer scheme is changing to the step-and-scan scheme via the full wafer scheme and step-and-repeat scheme. In such a trend, even in an exposure apparatus that uses a charged beam such as an electron beam that can expect higher resolution, a scan reduction transfer system that uses a transfer mask has been proposed.

However, in such apparatus, a divided mask obtained by dividing a transfer pattern into a plurality of partial transfer patterns is used owing to considerable drop of image performance upon broadening of the field angle, limitations on the structure of a mask used, and the like, and these divided patterns are transferred while they are joined in turn, thus obtaining a desired pattern.

The divided mask is obtained by lining up divided partial transfer patterns at predetermined positions on a single mask substrate, and is formed on, e.g., a silicon wafer by the same technique as a semiconductor process such as lithography, etching, or the like.

In a transfer method using the divided mask, since the joint precision between neighboring partial transfer patterns is important, the divided partial transfer patterns must be lined up at predetermined positions on the mask with very high precision. However, these partial transfer patterns of the divided mask and their matrix suffer geometrical errors produced during mask formation, such as a matrix error, rotation error, magnification error, orthogonality error, distortion, and the like. Furthermore, these errors are also caused by distortions of the divided mask due to changes in temperature, mechanical stress, aging, and the like. These errors impair the aforementioned joint precision, and defects are consequently produced in the chip obtained.

In order to solve such problem, as disclosed in Japanese Patent No. 2647835, the position of the overall mask is obtained using dedicated marks, and the next partial transfer pattern to be transferred by exposure is driven to the exposure position using a virtual coordinate system obtained based on the position data of the mask. After that, using alignment marks dedicated to the partial transfer patterns, the patterns are aligned pattern by pattern. Such method is called the dye-by-dye method, and is capable of accurate alignment since it aligns pattern by pattern.

However, with the aforementioned method, after each partial transfer pattern is temporarily driven using the virtual coordinate system, partial transfer patterns are aligned pattern by pattern using alignment marks dedicated to those patterns. Hence, measurement and driving processes for alignment are required upon transferring each partial transfer pattern, and these measurement and driving times lower the throughput of the overall apparatus. This problem has larger influences on the throughput as the number of divisions of the mask increases.

Furthermore, with the aforementioned method, a so-called 2nd layer requires alignment marks on a transfer medium, i.e., a wafer. However, depending on the way the transfer mask is divided, the wafer does not often have any marks corresponding to a partial transfer pattern on the transfer mask. For example, when a transfer pattern is divided into partial transfer patterns in a 5×5 matrix, since partial transfer patterns in a 3×3 matrix near the center of the matrix are present inside the actual element pattern region, it is impossible to transfer alignment marks to this region in advance. Hence, in practice, alignment cannot be done by the above-mentioned method.

SUMMARY OF THE INVENTION

It is, therefore, an object of the present invention to provide a mask pattern transfer method and apparatus, device manufacturing method, and transfer mask, which can improve the joint precision of partial transfer patterns upon obtaining a desired pattern by sequentially transferring a plurality of divided partial transfer patterns onto a transfer medium.

According to the first aspect of the present invention, a transfer method which uses a transfer mask formed with a plurality of partial transfer patterns and a plurality of alignment marks, transfers the partial transfer patterns in turn onto a transfer medium, and consequently transfers a pattern obtained by joining the plurality of transfer patterns, comprises: the measurement step of measuring positions of the alignment marks formed on the transfer mask; the coordinate system determination step of determining an actual coordinate system of the plurality of partial transfer patterns formed on the transfer mask on the basis of measurement results in the measurement step; and the alignment step of sequentially aligning the partial transfer patterns to the transfer medium on the basis of the actual coordinate system determined in the coordinate system determination step, and transfer is done every time alignment is made in the alignment step.

In the transfer method according to the first aspect of the present invention, for example, the alignment step preferably has the parameter calculation step of calculating parameters that represent a relationship between the actual coordinate system of the plurality of partial transfer patterns and a design coordinate system of the plurality of partial transfer patterns, and includes the step of sequentially aligning the partial transfer patterns to the transfer medium on the basis of the parameters.

The transfer method according to the first aspect of the present invention, preferably further comprises the step of calculating a fabrication coordinate system of the plurality of transfer patterns; and correcting the actual coordinate system on the basis of the fabrication coordinate system, and the parameter calculation step includes the step of calculating parameters that represent a relationship between the corrected actual coordinate system and the design coordinate system.

In the transfer method according to the first aspect of the present invention, for example, the correction step preferably includes the step of calculating a difference between an actual position and design position of each of the partial transfer patterns and correcting the actual coordinate system on the basis of the difference.

In the transfer method according to the first aspect of the present invention, for example, the alignment step preferably further has the transfer position determination step of determining positions of the partial transfer patterns and the transfer medium upon transferring the partial transfer patterns onto the transfer medium on the basis of the parameters, and includes the step of moving the corresponding pattern and the transfer medium in turn to the positions determined in units of partial transfer patterns.

The transfer method according to the first aspect of the present invention preferably further comprises the designation step of designating the alignment marks to be measured in the measurement step of the transfer mask, and the measurement step includes the step of measuring the positions of the alignment marks designated in the designation step.

The transfer method according to the first aspect of the present invention preferably further comprises the profile calculation step of calculating profiles that indicate discrepancy levels between design and actual partial transfer patterns in units of partial transfer patterns on the basis of the measurement results in the measurement step, and the alignment step has the correction step of matching the actual partial transfer pattern with the corresponding design partial transfer pattern by moving the transfer mask on the basis of the calculated profiles every time the partial transfer pattern is transferred.

The transfer method according to the first aspect of the present invention preferably further comprises the profile calculation step of calculating profiles that indicate rotation amounts and/or magnifications between design and actual partial transfer patterns in units of partial transfer patterns on the basis of the measurement results in the measurement step, and the alignment step has the correction step of matching the actual partial transfer pattern with the corresponding design partial transfer pattern by moving the transfer mask on the basis of the calculated profiles every time the partial transfer pattern is transferred.

The transfer method according to the first aspect of the present invention preferably further comprises the profile calculation step of calculating a profile that represents discrepancy levels between design and actual partial transfer patterns on the basis of the measurement results in the measurement step, and the alignment step has the correction step of matching a plurality of actual partial transfer patterns with a plurality of design partial transfer patterns by moving the transfer mask on the basis of the calculated profile.

The transfer method according to the first aspect of the present invention preferably further comprises the profile calculation step of calculating a profile that represents rotation amounts and/or magnifications between design and actual partial transfer patterns on the basis of the measurement results in the measurement step, and the alignment step has the correction step of matching a plurality of actual partial transfer patterns with a plurality of design partial transfer patterns by moving the transfer mask on the basis of the calculated profile.

In the transfer method according to the first aspect of the present invention, for example, a charged beam is preferably used upon transferring the partial transfer patterns in turn onto the transfer medium.

In the transfer method according to the first aspect of the present invention, for example, a charged beam having an arcuated section is preferably used upon transferring the partial transfer patterns in turn onto the transfer medium.

According to the second aspect of the present invention, a transfer method which uses a transfer mask formed with a plurality of partial transfer patterns and a plurality of alignment marks, transfers the partial transfer patterns in turn onto a transfer medium formed with a lower-layer pattern and a plurality of alignment marks, and consequently transfers an upper-layer pattern obtained by joining the plurality of transfer patterns to overlap the lower-layer pattern on the transfer medium, comprises: the first measurement step of measuring positions of the alignment marks formed on the transfer mask; the first coordinate system determination step of determining a first coordinate system as an actual coordinate system of the plurality of partial transfer patterns formed on the transfer mask on the basis of measurement results in the first measurement step; the second measurement step of measuring positions of the alignment marks formed on the transfer medium; the second coordinate system determination step of determining a second coordinate system as an actual coordinate system of the lower-layer pattern on the transfer medium on the basis of measurement results in the second measurement step; and the alignment step of sequentially aligning the partial transfer patterns to the lower-layer pattern on the basis of the first and second coordinate systems, and transfer is done every time alignment is made in the alignment step.

In the transfer method according to the second aspect of the present invention, for example, the alignment step preferably includes the step of sequentially aligning the partial transfer patterns to the transfer medium while correcting positions of the transfer mask and transfer medium to match both the first and second coordinate systems with a reference coordinate system.

The transfer method according to the second aspect of the present invention preferably further comprises: the first parameter calculation step of calculating first parameters that represent a relationship between the first coordinate system and a reference coordinate system; and the second parameter calculation step of calculating second parameters that represent a relationship between the second coordinate system and the reference coordinate system, and the alignment step includes the step of sequentially aligning the partial transfer patterns to the transfer medium on the basis of the first and second parameters.

The transfer method according to the second aspect of the present invention, preferably further comprises the steps of: calculating a fabrication coordinate system of the plurality of transfer patterns; and correcting the first coordinate system on the basis of the fabrication coordinate system, and the first parameter calculation step includes the step of calculating first parameters that represent a relationship between the corrected first coordinate system and the reference coordinate system.

In the transfer method according to the second aspect of the present invention, for example, the correction step preferably includes the step of calculating a difference between an actual position and design position of each of the partial transfer patterns and correcting the first coordinate system on the basis of the difference.

In the transfer method according to the second aspect of the present invention, for example, the alignment step preferably has: the first transfer position determination step of determining positions to which the partial transfer patterns are to be moved upon transferring the partial transfer patterns onto the transfer medium in units of partial transfer patterns on the basis of the first parameters; and the second transfer position determination step of determining positions to which the transfer medium is to be moved upon transferring the partial transfer patterns onto the transfer medium in units of partial transfer patterns on the basis of the second parameters, and the alignment step includes the step of moving the corresponding partial transfer pattern and transfer medium to the positions determined in the first and second transfer position determination steps every time the partial transfer pattern is transferred.

The transfer method according to the second aspect of the present invention preferably further comprises the designation step of designating the alignment marks to be measured in the first measurement step of the transfer mask, and the first measurement step includes the step of measuring positions of the alignment marks designated in the designation step.

The transfer method according to the second aspect of the present invention preferably further comprises the designation step of designating the alignment marks to be measured in the second measurement step of the transfer medium, and the second measurement step includes the step of measuring positions of the alignment marks designated in the designation step.

The transfer method according to the second aspect of the present invention preferably further comprises: the first designation step of designating the alignment marks to be measured in the first measurement step of the transfer mask; and the second designation step of designating the alignment marks to be measured in the second measurement step of the transfer medium, and the first measurement step includes the step of measuring positions of the alignment marks designated in the first designation step, and the second measurement step includes the step of measuring positions of the alignment marks designated in the second designation step.

The transfer method according to the second aspect of the present invention preferably further comprises the profile calculation step of calculating profiles that indicate discrepancy levels between design and actual partial transfer patterns in units of partial transfer patterns on the basis of the measurement results in the first measurement step, and the alignment step has the correction step of matching the actual partial transfer pattern with the corresponding design partial transfer pattern by moving the transfer mask on the basis of the calculated profiles every time the partial transfer pattern is transferred.

The transfer method according to the second aspect of the present invention preferably further comprises the profile calculation step of calculating profiles that indicate rotation amounts and/or magnifications between design and actual partial transfer patterns in units of partial transfer patterns on the basis of the measurement results in the first measurement step, and the alignment step has the correction step of matching the actual partial transfer pattern with the corresponding design partial transfer pattern by moving the transfer mask on the basis of the calculated profiles every time the partial transfer pattern is transferred.

The transfer method according to the second aspect of the present invention preferably further comprises the profile calculation step of calculating a profile that represents discrepancy levels between design and actual partial transfer patterns on the basis of the measurement results in the first measurement step, and the alignment step has the correction step of matching a plurality of actual partial transfer patterns with a plurality of design partial transfer patterns by moving the transfer mask on the basis of the calculated profile.

In the transfer method according to the second aspect of the present invention, for example, the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns, the method preferably further comprises the calculation step of calculating profiles that indicate discrepancy levels between design and actual partial patterns on the transfer medium in units of partial patterns on the basis of the measurement results in the second measurement step, and the alignment step preferably has the correction step of correcting an image to be transferred onto the transfer medium via the corresponding partial transfer pattern on the basis of the calculated profiles every time the partial transfer pattern is transferred, thereby aligning the corresponding partial transfer pattern to the corresponding partial pattern on the transfer medium.

In the transfer method according to the second aspect of the present invention, for example, the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns, the method preferably further comprises the calculation step of calculating profiles that indicate rotation amounts and/or magnifications between design and actual partial patterns on the transfer medium in units of partial patterns on the basis of the measurement results in the second measurement step, and the alignment step preferably has the correction step of correcting an image to be transferred onto the transfer medium via the corresponding partial transfer pattern on the basis of the calculated profiles every time the partial transfer pattern is transferred, thereby aligning the corresponding partial transfer pattern to the corresponding partial pattern on the transfer medium.

In the transfer method according to the second aspect of the present invention, for example, the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns, the method preferably further comprises the calculation step of calculating a profile that represents discrepancy levels between design and actual partial patterns on the transfer medium on the basis of the measurement results in the second measurement step, and the alignment step preferably has the correction step of commonly correcting a plurality of images to be transferred onto the transfer medium via the plurality of partial transfer patterns on the basis of the calculated profile, thereby aligning the partial transfer patterns to the corresponding partial patterns on the transfer medium.

In the transfer method according to the second aspect of the present invention, for example, the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns, the method preferably further comprises: the first profile calculation step of calculating first profiles that represent discrepancy levels between design and actual partial transfer patterns on the basis of the measurement results in the first measurement step; and the calculation step of calculating second profiles that represent discrepancy levels between design and actual partial patterns on the transfer medium on the basis of the measurement results in the second measurement step, and the alignment step preferably has: the first correction step of matching each of the actual partial transfer pattern with the corresponding design partial transfer pattern by moving the transfer mask on the basis of the calculated first profiles; and the second correction step of correcting an image to be transferred onto the transfer medium via each of the partial transfer patterns on the basis of the calculated second profiles, thereby aligning the partial transfer patterns to the corresponding partial patterns on the transfer medium.

In the transfer method according to the second aspect of the present invention, for example, a charged beam is preferably used upon transferring the partial transfer patterns in turn onto the transfer medium.

In the transfer method according to the second aspect of the present invention, for example, a charged beam having an arcuated section is preferably used upon transferring the partial transfer patterns in turn onto the transfer medium.

According to the third aspect of the present invention, a transfer method which uses a transfer mask formed with a plurality of partial transfer patterns and a plurality of alignment marks, transfers the partial transfer patterns in turn onto a transfer medium, and consequently transfers a pattern obtained by joining the plurality of transfer patterns, comprises: the dividing step of dividing the plurality of partial transfer patterns into a plurality of groups; the measurement step of measuring positions of the alignment marks corresponding to the partial transfer patterns that belong to the divided groups; the coordinate system determination step of determining actual coordinate systems of the partial transfer patterns that belong to the groups on the basis of measurement results in the measurement step; and the alignment step of sequentially aligning the partial transfer patterns that belong to the group of interest to the transfer medium in units of groups on the basis of the coordinate system of the group of interest determined in the coordinate system determination step, and transfer is done every time alignment is made in the alignment step.

According to the fourth aspect of the present invention, a transfer method which uses a transfer mask formed with a plurality of partial transfer patterns and a plurality of alignment marks, transfers the partial transfer patterns in turn onto a transfer medium, and consequently transfers a pattern obtained by joining the plurality of transfer patterns, comprises: the dividing step of dividing the plurality of partial transfer patterns into a plurality of groups, and executing, in units of groups: the measurement step of measuring positions of the alignment marks corresponding to the partial transfer patterns that belong to the group of interest; the coordinate system determination step of determining actual coordinate systems of the partial transfer patterns that belong to the group of interest on the basis of measurement results in the measurement step; and the alignment step of sequentially aligning the partial transfer patterns that belong to the group of interest to the transfer medium on the basis of the coordinate system of the group of interest determined in the coordinate system determination step, and transfer is done every time alignment is made in the alignment step.

According to the fifth aspect of the present invention, a transfer apparatus which uses a transfer mask formed with a plurality of partial transfer patterns and a plurality of alignment marks, transfers the partial transfer patterns in turn onto a transfer medium, and consequently transfers a pattern obtained by joining the plurality of transfer patterns, comprises: measurement means for measuring positions of the alignment marks formed on the transfer mask; coordinate system determination means for determining an actual coordinate system of the plurality of partial transfer patterns formed on the transfer mask on the basis of measurement results of the measurement means; and alignment means for sequentially aligning the partial transfer patterns to the transfer medium on the basis of the actual coordinate system determined by the coordinate system determination means, and transfer is done every time alignment is made by the alignment means.

According to the sixth aspect of the present invention, a transfer apparatus which uses a transfer mask formed with a plurality of partial transfer patterns and a plurality of alignment marks, transfers the partial transfer patterns in turn onto a transfer medium formed with a lower-layer pattern and a plurality of alignment marks, and consequently transfers an upper-layer pattern obtained by joining the plurality of transfer patterns to overlap the lower-layer pattern on the transfer medium, comprises: first measurement means for measuring positions of the alignment marks formed on the transfer mask; first coordinate system determination means for determining a first coordinate system as an actual coordinate system of the plurality of partial transfer patterns formed on the transfer mask on the basis of measurement results of the first measurement means; second measurement means for measuring positions of the alignment marks formed on the transfer medium; second coordinate system determination means for determining a second coordinate system as an actual coordinate system of the lower-layer pattern on the transfer medium on the basis of measurement results of the second measurement means; and alignment means for sequentially aligning the partial transfer patterns to the lower-layer pattern on the basis of the first and second coordinate systems, and transfer is done every time alignment is made by the alignment means.

According to the seventh aspect of the present invention, a transfer apparatus which uses a transfer mask formed with a plurality of partial transfer patterns and a plurality of alignment marks, transfers the partial transfer patterns in turn onto a transfer medium, and consequently transfers a pattern obtained by joining the plurality of transfer patterns, comprises: dividing means for dividing the plurality of partial transfer patterns into a plurality of groups; measurement means for measuring positions of the alignment marks corresponding to the partial transfer patterns that belong to the divided groups; coordinate system determination means for determining actual coordinate systems of the partial transfer patterns that belong to the groups on the basis of measurement results of the measurement means; and alignment means for sequentially aligning the partial transfer patterns that belong to the group of interest to the transfer medium in units of groups on the basis of the coordinate system of the group of interest determined by the coordinate system determination means, and transfer is done every time alignment is made by the alignment means.

According to the eighth aspect of the present invention, a method of manufacturing a device using lithography, comprises the steps of: applying a resist on a substrate; transferring a pattern onto the resist by one of the above-mentioned transfer methods; and developing the resist transferred with the pattern.

Further objects, features and advantages of the present invention will become apparent from the following detailed description of embodiments of the present invention with reference to the accompanying drawings.

DETAILED DESCRIPTION OF THE PREFERRED EMBODIMENTS

The preferred embodiments of the present invention will be described hereinafter with reference to the accompanying drawings.

First Embodiment

Figure 21:
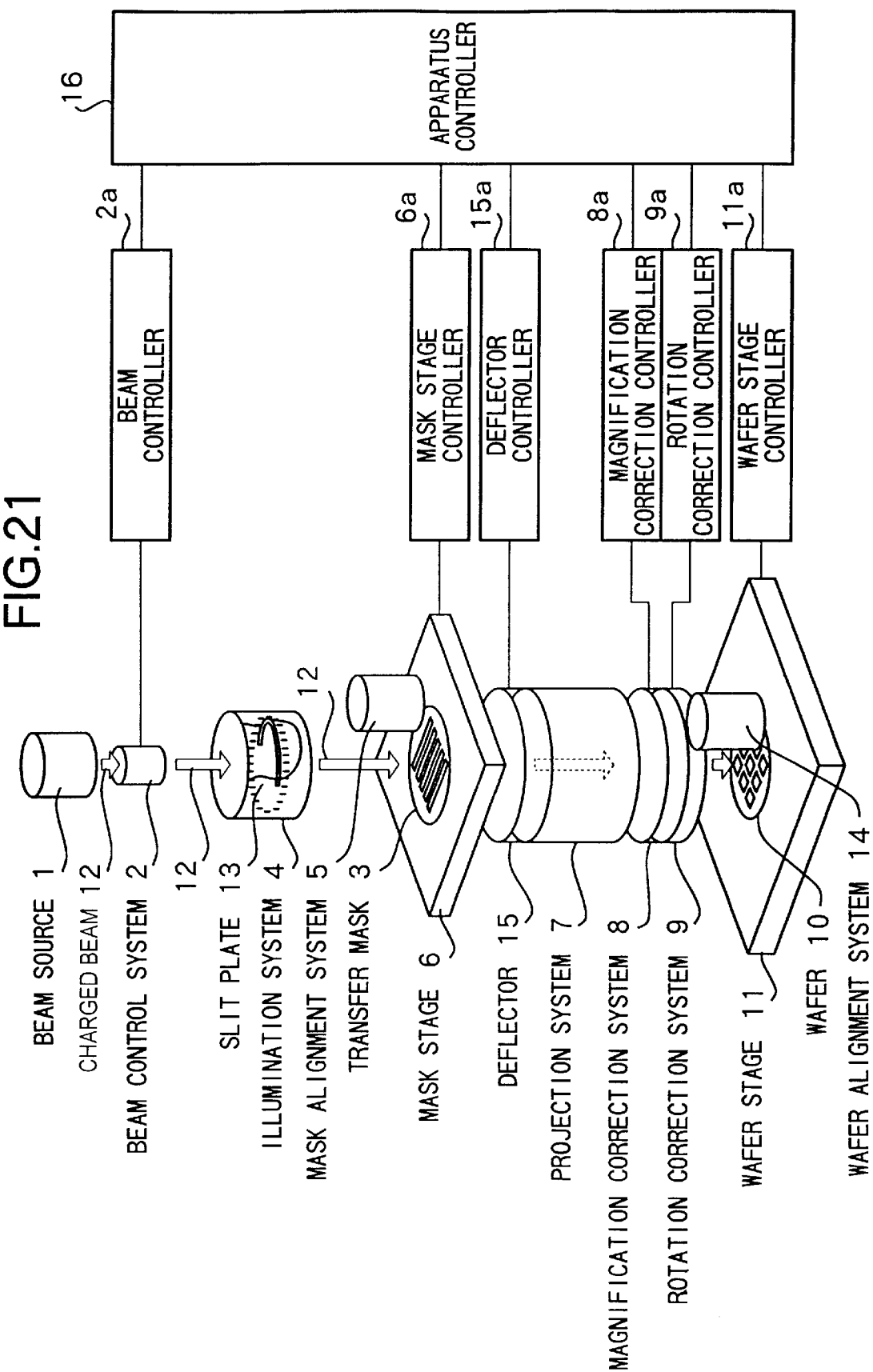
FIG. 21 is a schematic view showing an example of the arrangement of an exposure apparatus for manufacturing semiconductor devices, to which the transfer method of the present invention can be applied.

FIG. 21 is a schematic perspective view showing an example of the arrangement of an exposure apparatus for manufacturing semiconductor devices and its control system, to which a transfer method of the present invention can be applied. Note that the second to ninth embodiments to be described later use the same apparatus.

The control system for the exposure apparatus for manufacturing semiconductor devices has a beam controller 2a for controlling the dose of a charged beam 12 emitted by a beam source 1, a mask stage controller 6a for moving a mask stage 6, a deflector controller 15a for controlling a deflector 15, a magnification correction controller 8a and rotation correction controller 9a for respectively controlling a magnification correction system 8 and rotation correction system 9, which in turn correct the magnification and rotation amount, respectively, of the pattern of a transfer mask 3 to be exposed onto a wafer 10, a wafer stage controller 11a for moving a wafer stage 11, and an apparatus controller 16 for controlling these controllers. The apparatus controller controls the processes described in flow charts to be described later.

The dose of a charged beam 12 as a charged particle beam such as an electron beam, ion beam, or the like, emitted by the beam source 1 is controlled when the beam controller 2a turns on/off a beam control system 2, and that beam 12 enters an illumination system 4, which irradiates the transfer mask 3 on the mask stage 6 with the charged beam.

Note that the illumination system 4 includes a slit plate 13 formed with an arcuated slit, and the charged beam 12, which has passed through the illumination system 4, is shaped into an arcuated pattern in a plane perpendicular to the optical axis. Using the arcuated beam pattern, the imaging position is set near the outer peripheral portion of the charged beam 12, which is separated from the optical axis. As a result, curvature of field can be suppressed to a negligible level, and the exposure region can be broadened. In this embodiment, the charged beam 12 uses an arcuated beam pattern, but the beam pattern is not limited to such specific shape.

The mask stage 6 is driven by the mask stage controller 6a on the basis of correction values which are measured and calculated by a mask alignment system 5, thus aligning the transfer mask 3 and transfer beam 12.

The charged beam 12 irradiated onto the transfer mask 3 projects the pattern on the transfer mask 3 onto a projection system 7 after it is deflected by the deflector 15. Furthermore, after the projection magnification is corrected by the magnification correction system 8 and image rotation is corrected by the rotation correction system 9, the pattern is projected onto the wafer 10 on the wafer stage 11, thus transferring the pattern on the transfer mask 3 onto the wafer.

Note that the wafer stage 11 controlled by the wafer stage controller 11 aligns the wafer 10 on the basis of values measured and calculated by a wafer alignment system 14. Upon transfer, the scan moving directions, orthogonality levels, scale magnifications, and the like of the mask stage 6 and wafer stage 11 are adjusted in advance, and the coordinate system after these adjustments is used as a reference coordinate system throughout the following processes.

A transfer method of the present invention will be explained below taking as an example a process for printing a pattern on the transfer mask 3 as a so-called 1st mask shown in FIG. 2 onto the wafer 10.

Figure 2A:
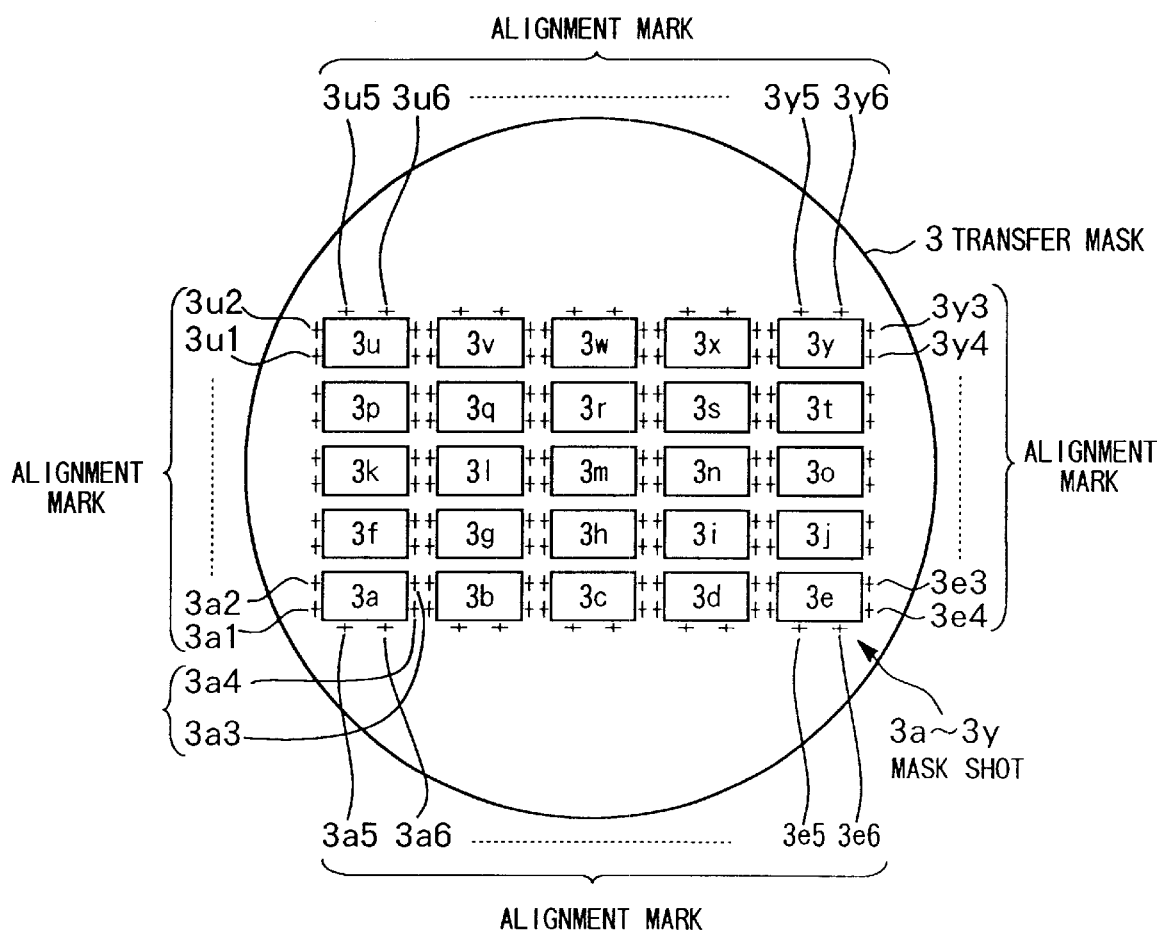
FIGS. 2A and 2B are schematic views for explaining mask shots and wafer shots in the first embodiments.
Figure 2B:
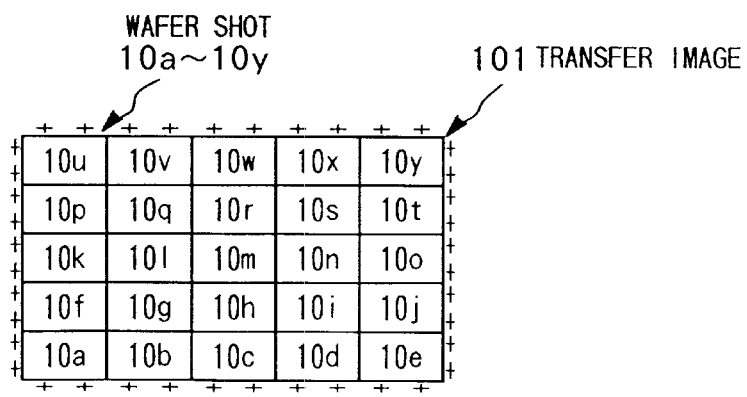

FIGS. 2A and 2B respectively show the transfer mask 3, which has a 5×5 matrix of partial transfer patterns, and a transfer image 101 obtained by transferring mask shots 3a to 3y as the partial transfer patterns on the transfer mask 3 onto the wafer 10 by exposure.

The mask shots 3a to 3y are obtained by dividing the transfer image 101 into a plurality of shots. Around each of the mask shots 3a to 3y on the transfer mask 3, alignment marks 3a1 to 3y6 for defining the position of each of the mask shots 3a to 3y on the transfer mask 3 are formed.

For example, the position of the mask shot 3a is defined by the alignment marks 3a1 to 3a6. These mask shots 3a to 3y on the transfer mask 3 are transferred onto the wafer 10 without any gaps: the mask shot 3a is transferred onto a wafer shot 10a as a shot on the wafer 10, the mask shot 3b is transferred onto a wafer shot 10b, and so forth, thus obtaining a desired transfer image 101. In this case, the alignment marks (e.g., 3a1, 3a2, 3a5, 3a6, and the like) around the transfer image of those of the mask shots 3a to 3e, 3f, 3j, 3k, 3o, 3p, 3t, and 3u to 3y are also transferred onto the wafer 10, and are used in alignment of the 2nd and subsequent layers as in embodiments to be described later.

Figure 1A:
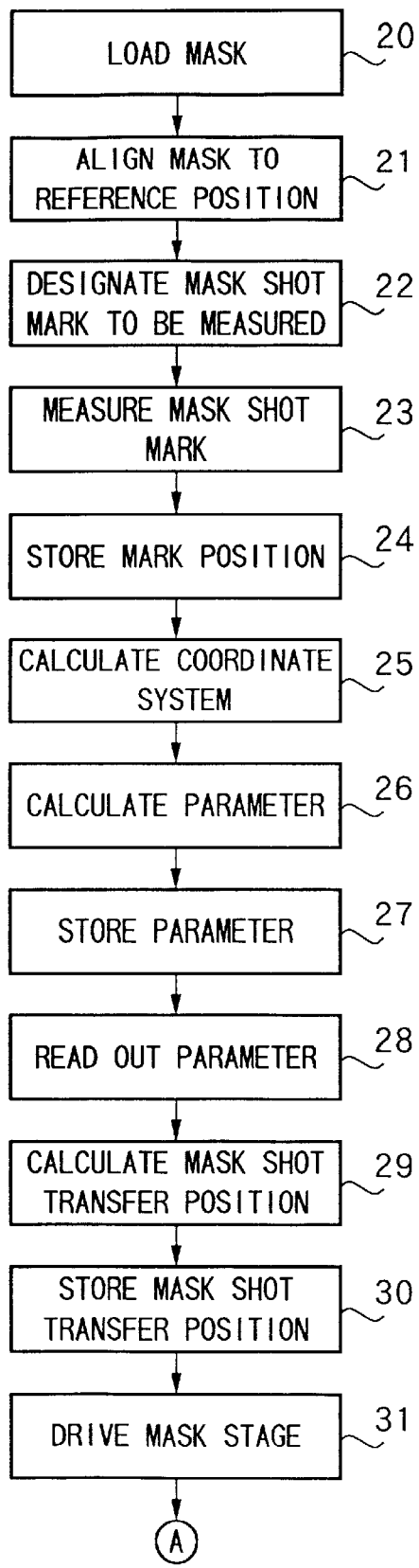
FIGS. 1A and 1B are flow charts for explaining a mask shot transfer method according to the first embodiment of the present invention.
Figure 1B:
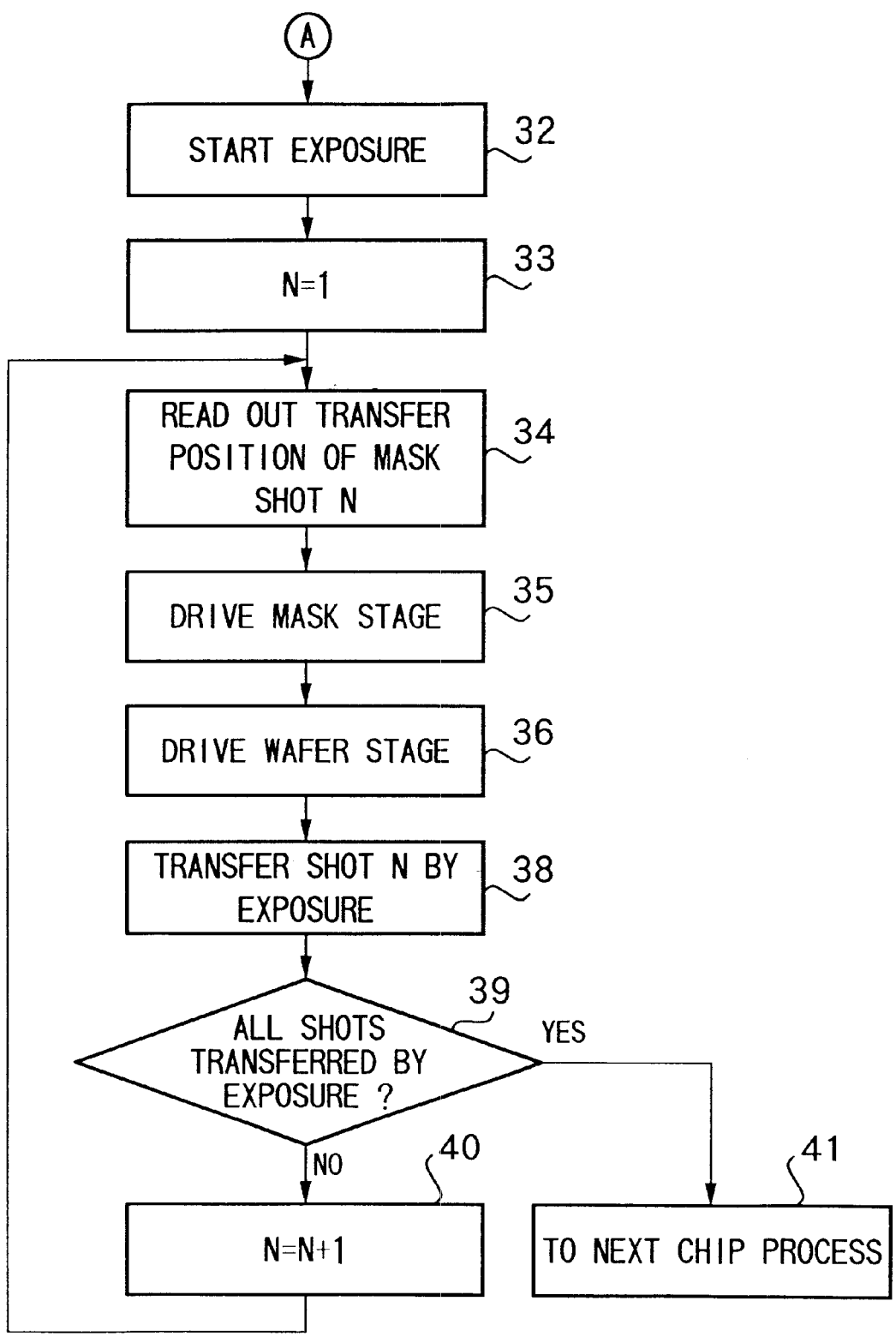

FIGS. 1A and 1B are flow charts showing the aforementioned process in detail, and a basic flow of the present invention.

The flow shown in FIGS. 1A and 1B will be explained in turn with reference to FIGS. 2A and 2B and FIG. 21. Assume that the wafer 10 has already been loaded into the apparatus.

The transfer mask 3 is loaded onto the mask stage 6 (step 20), its position is measured by the mask alignment system 5, and the mask stage 6 is driven to align the mask to the reference position (step 21). In this case, the above-mentioned reference coordinate system is used as a reference, and the reference axis of the charged beam 12 and other apparatus references match this reference coordinate system. Hence, the reference alignment reduces to aligning the transfer mask 3 to the reference axis of the charged beam 12 and other apparatus references.

After the transfer mask 3 is located at the reference position, alignment marks to be measured upon alignment are designated (step 22). In this case, the alignment marks 3a1 to 3a4, 3c1 to 3c4 3e1 to 3e4 3k1 to 3k4, 3m1 to 3m4, 3o1 to 3o4, 3u1 to 3u4, 3w1 to 3w4, and 3y1 to 3y4 corresponding to the mask shots 3a, 3c, 3e, 3k, 3m, 3o, 3u, 3w, and 3y are designated. In this step, the alignment marks of all the mask shots may be designated. However, as the number of marks to be measured becomes larger, the measurement time becomes longer. Hence, a decrease in throughput of the apparatus must be taken into consideration.

Subsequently, the positions of the alignment marks 3a1 to 3a4, 3c1 to 3c4 3e1 to 3e4 3k1 to 3k4, 3m1 to 3m4, 3o1 to 3o4, 3u1 to 3u4, 3w1 to 3w4, and 3y1 to 3y4 corresponding to the mask shots 3a, 3c, 3e, 3k, 3m, 3o, 3u, 3w, and 3y are measured by the mask alignment system 5 (step 23). More specifically, in case of the mask shot 3a, the positions of the alignment marks 3a1, 3a2, 3a3, and 3a4 are measured.

In this case, the alignment marks 3a5 and 3a6 may be designated. However, when the positions of the alignment marks 3a1 to 3a4 are detected, the position of the mask shot 3a can be specified. Hence, the alignment marks 3a1 to 3a4 need only be designated.

After the positions of the alignment marks 3a1 to 3a4, 3c1 to 3c4 3e1 to 3e4 3k1 to 3k4, 3m1 to 3m4, 3o1 to 3o4, 3u1 to 3u4, 3w1 to 3w4, and 3y1 to 3y4 of the mask shots 3a, 3c, 3e, 3k, 3m, 3o, 3u, 3w, and 3y are measured, the measured positions of the alignment marks are stored in units of marks (step 24).

Finally, the positions of the alignment marks 3a1 to 3a4, 3c1 to 3c4 3e1 to 3e4 3k1 to 3k4, 3m1 to 3m4, 3o1 to 3o4, 3u1 to 3u4, 3w1 to 3w4, and 3y1 to 3y4 stored in step 24 are read out to calculate the actual coordinate system of the mask shots 3a to 3y (step 25).

Figure 3:
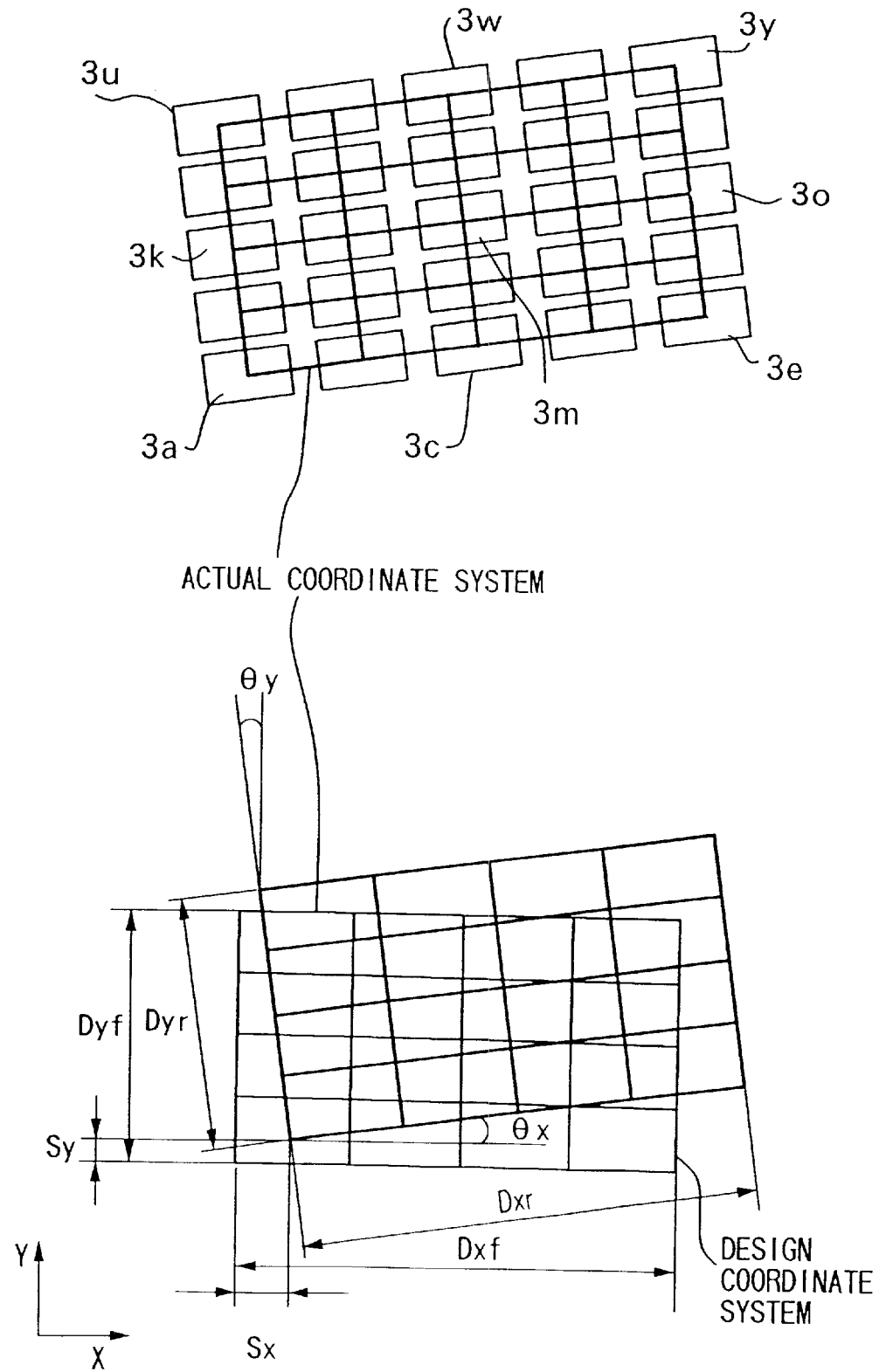
FIG. 3 is a schematic view for explaining the coordinate system of mask shots in the first embodiment.

FIG. 3 shows the difference between the actual coordinate system obtained based on the position data of the alignment marks, and a design coordinate system.

The actual coordinate system is calculated as follows. That is, a virtual lattice is assumed, and the differences between the actual positions of the mask shots 3a, 3c, 3e, 3k, 3m, 3o, 3u, 3w, and 3y, and the positions of individual lattice points of the virtual lattice corresponding to these mask shots are evaluated by, e.g., the method of least squares. Then, the lattice that fits best is used as the actual coordinate system.

In FIG. 3, Sx and Sy are translation (shift) components in the x- and y-axis directions. If θx and θy are rotation components about the x- and y-axes, θx represents the rotation component of the overall coordinate system, and θx−θy represents the orthogonality level component. Also, a value obtained by normalizing a length Dxr of the actual coordinate system viewed from the design coordinate system by a design length Dxf, in this case, Dxr/Dxf represents magnification (scale magnification) in the x-axis direction, and similarly Dyr/Dyf represents magnification in the y-axis direction.

Upon calculating the actual coordinate system in step 25, lattice fitting is done using values each obtained by subtracting the fabrication position of each partial transfer pattern of the transfer mask, which is obtained in advance, from the actual position of each shot to be measured. Lattice fitting is done again with respect to the obtained virtual lattice and a fabrication coordinate system of the partial transfer patterns, which is obtained in advance, thereby obtaining an actual coordinate system. In this way, upon lattice fitting, positional variations of the partial transfer patterns can be evaluated while removing the influences of random components resulting from fabrication errors of the partial transfer patterns, thus allowing more accurate pattern transfer.

Figure 33:
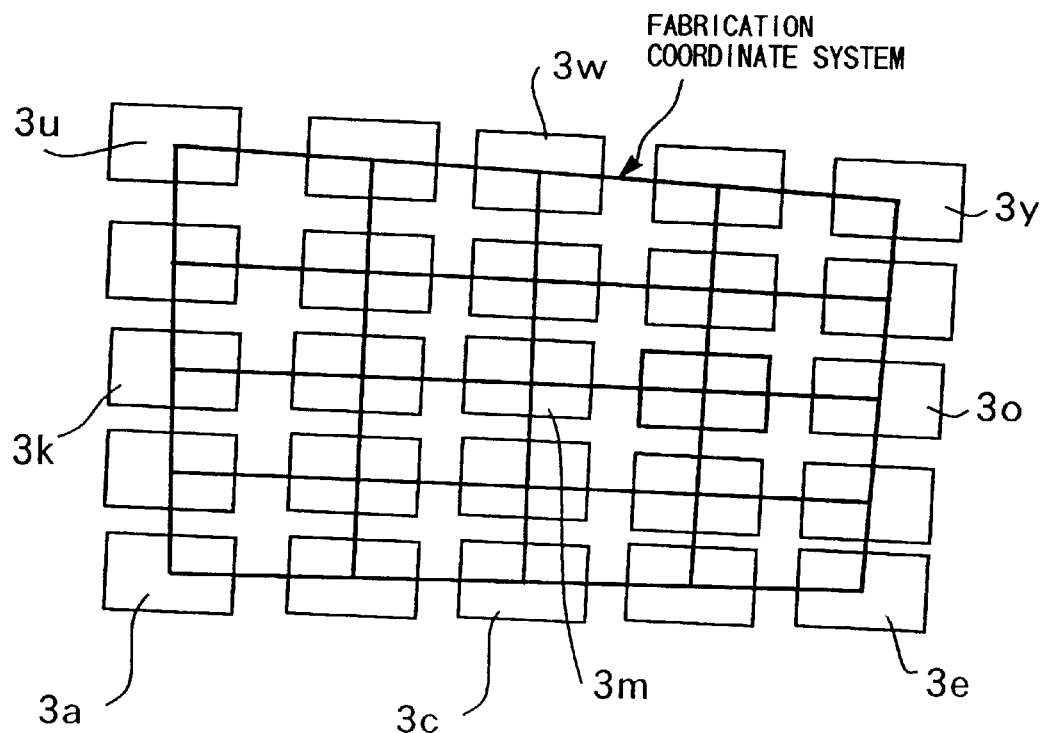
FIG. 33 shows a fabrication coordinate system of partial transfer patterns of the transfer mask shown in FIG. 2A.

FIG. 33 shows a fabrication coordinate system of the partial transfer patterns of the transfer mask 3. Upon fabrication of the transfer mask, the positions of the partial transfer patterns have errors with respect to the design coordinate system. By measuring alignment marks related to the respective partial transfer patterns in advance, the fabrication positions and coordinate system of the partial transfer patterns can be obtained.

The following explanation will be given using FIGS. 35A to 35C, 36, and 37 as explanatory views associated with the two stages of lattice fitting for the coordinate systems.

Figure 35A:
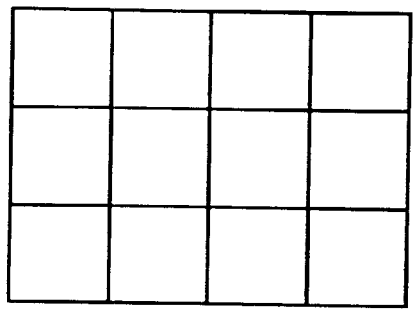
FIG. 35A shows a design coordinate system.
Figure 35B:
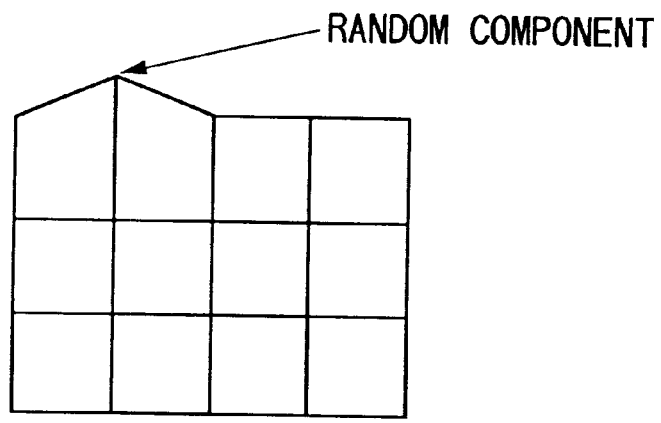
FIG. 35B shows a fabrication coordinate system.
Figure 35C:
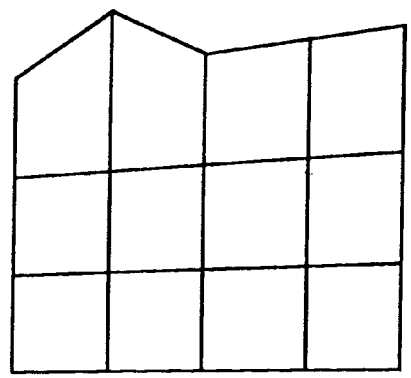
FIG. 35C shows an actual coordinate system.

FIGS. 35A to 35C show lattices of the respective coordinate systems.

FIG. 35A shows a design coordinate system.

FIG. 35B shows a fabrication coordinate system of the transfer mask that has been fabricated based on the design coordinate system shown in FIG. 35A. In this process, since the mask is not set in an exposure apparatus, errors produced in the coordinate system are all accounted for by random components as those produced upon fabrication.

FIG. 35C shows an actual coordinate system that contains linear components as errors produced when the mask is set in the exposure apparatus in addition to random components or errors of the fabrication coordinate system shown in FIG. 35B.

Figure 36:
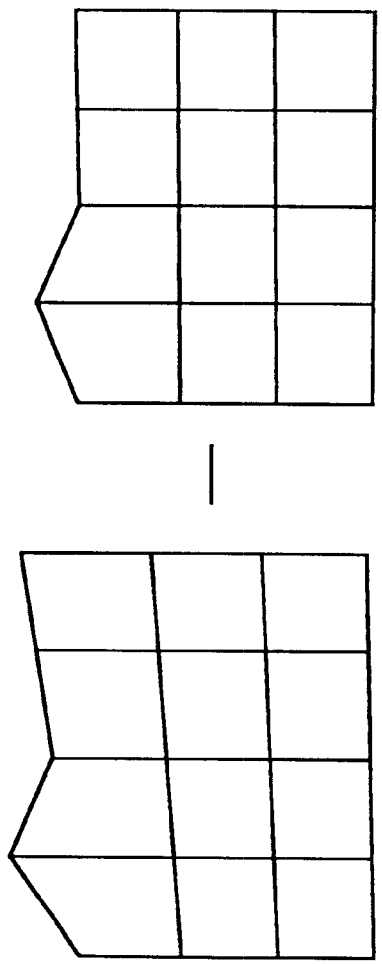
FIG. 36 is a view for explaining first-stage fitting.

As shown in FIG. 36, paying attention to the linear components alone as variation components, lattice fitting is done as first-stage fitting. More specifically, in this fitting, the lattice of the fabrication coordinate system (errors: random components) is subtracted from that of the actual coordinate system (errors: linear and random components), thereby obtaining a virtual lattice as a lattice in which only variation components fit in the lattice of the actual coordinate system. To attain fitting, alignment marks related to the respective fabrication partial transfer patterns are measured in advance to obtain the fabrication positions and coordinate system of the fabrication transfer patterns.

Figure 37:
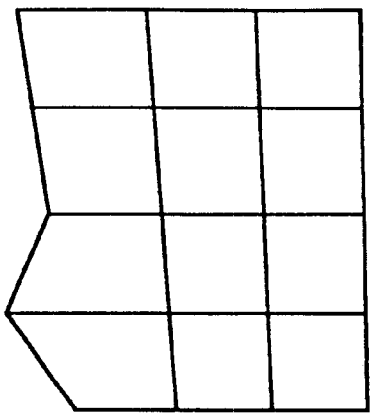
FIG. 37 is a view for explaining second-stage fitting.
Figure 37:
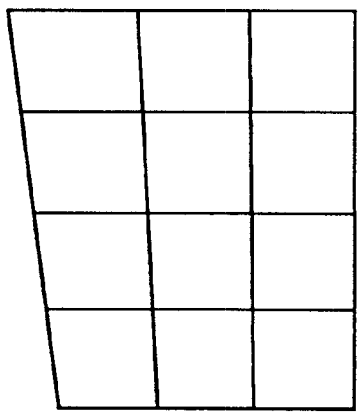
Figure 37:
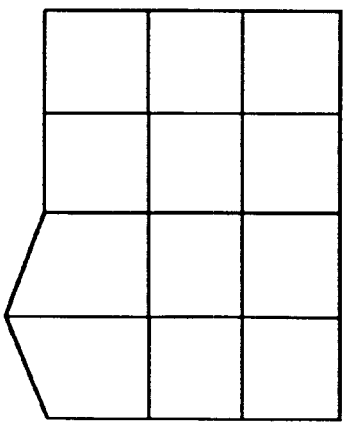

Subsequently, as shown in FIG. 37, re-fitting is done as second-stage lattice fitting that pays attention to the random components. More specifically, by adding the fabrication coordinate system to the virtual lattice in which only variation components fit, a lattice in which the variation and random components fit is obtained. In this way, the lattice, the linear and random components of which have been corrected via the two stages of fitting, is used as that of the actual coordinate system.

According to the aforementioned method, upon lattice fitting, positional variations of the partial transfer patterns can be evaluated while removing the influences of random components resulting from fabrication errors of the partial transfer patterns, thus allowing more accurate pattern transfer.

Note that the actual coordinate system need not always be calculated by the aforementioned method but may be calculated by other methods.

The calculation of the actual coordinate system will be explained in detail below.

The design coordinate system is an equal-interval orthogonal coordinate system that does not contain any errors, as shown in FIG. 35A. However, the fabrication coordinate system that has been fabricated based on this design coordinate system and indicates the positions of the respective partial transfer patterns of the transfer mask 3 has errors with respect to the design coordinate system, as shown in FIG. 33. The errors of the fabrication coordinate system often include random components produced for some reason. The fabrication coordinate system herein means the coordinate system of the transfer mask 3 which is not set in the exposure apparatus, i.e., the coordinate system which does not have any errors resulting from the influences of temperature rise in the exposure apparatus, self-weight deformation upon mask support, and the like.

Furthermore, the transfer mask 3 having the above-mentioned fabrication coordinate system is influenced by its ambient environment such as temperature rise in the exposure apparatus, self-weight deformation upon mask support, and the like, when it is set in the exposure apparatus. As a result, so-called linear component errors, i.e., variation components due to thermal expansion, stress deformation, and the like are included in the coordinate system. The coordinate system that contains these errors is an actual coordinate system.

Such actual coordinate system is calculated by fitting the lattice that represents the design coordinate system to that representing the actual coordinate system using a statistical method such as the method of least squares, or the like.

The aforementioned statistical method is effective for correcting variation components due to thermal expansion, stress deformation, and the like. However, when the statistical method is executed while random components remain unremoved, if these random components are large, they are over-corrected.

To avoid such problem, as an example of the method of calculating the actual coordinate system as one that contains errors including linear and random components, the method of fitting the lattices of the coordinate systems in two stages is preferably used.

These differences, i.e., parameters are calculated (step 26), and are stored (step 27).

In the steps described so far, all the parameters associated with the transfer positions of mask shots are determined and stored. In the subsequent steps, the actual exposure positions of mask shots are determined, and the mask stage 6 and wafer stage 11 are driven on the basis of the stored parameters to start actual exposure.

The stored parameters are read out (step 28), the transfer positions of mask shots on the design coordinate system (reference coordinate system) are calculated on the basis of the shift components Sx and Sy and orthogonality level component $\theta x$–$\theta y$ of these parameters, and the design positions of the mask shots (step 29), and are stored (step 30).

Upon correcting the orthogonality level component $\theta x$–$\theta y$, so-called stepwise correction for shifting the x-coordinate in correspondence with the y-coordinate is used. Furthermore, the scale magnifications Dxr/Dxf and Dyr/Dyf are supplied from the mask stage controller 6a to the mask stage 6 as drive parameters, and the rotation amount of the mask stage 6 is detected on the basis of the rotation component θx. Then, a θ stage (not shown) on the mask stage 6 that carries the transfer mask 3 is rotated to correct the rotation component of the transfer mask 3 (step 31).

When exposure starts (step 32), a mask shot number N is reset to 1 (step 33), and the control enters the subsequent shot exposure loop. Note that the mask shot number N=1 corresponds to the mask shot 3a.

Upon the first execution (N=1) of this loop, the transfer position of the first mask shot 3a stored in step 30 is read out (step 34). The mask stage 6 having x-, y-, and θ-axes is driven to move the mask shot 3a to the readout transfer position (step 35). At the same time, the wafer stage 11 is driven (step 36) to move the wafer 10 to a position where the first mask shot 3a is to be transferred. The positions of the stages driven in these steps 35 and 36 are start positions of a relative scan. At this time, exposure preparation for this shot is complete.

The beam control system 2 is driven to irradiate the mask shot 3a with the charged beam 12, thus starting transfer of the wafer shot 10a on the wafer 10. In this case, the entire mask shot 3a is transferred onto the wafer 10 while scanning the mask stage 6 and wafer stage 11 relative to the charged beam 12 (step 38).

Upon completion of exposure for this shot, it is checked if exposure for all the shots is complete (step 39). If shots to be exposed still remain, and the next shot is to be exposed, the mask shot number N is incremented by 1 (step 40), and the flow returns to step 34.

By similarly executing the loop of steps 34 to 40 for N equal to or larger than 2, a similar process is done for the mask shots 3b to 3y.

Upon completion of the processes for all the mask shots 3a to 3y, the control exits this loop, and advances to the next chip process (step 41).

With the above-mentioned process, a desired chip or a single pattern has been transferred onto the wafer 10. In order to transfer a plurality of chips onto the wafer 10, steps 33 to 41 in the aforementioned flow need only be repeated in correspondence with the number of chips.

Note that the differences between the transfer position of each mask shot read out in step 34, and the design transfer position may be calculated, and may be corrected by driving the mask stage 6 to the design transfer position and then driving the deflector 15 in step 35.

As described above, the actual coordinate system of each partial transfer pattern is calculated using some of the alignment marks 3a1 to 3y6 corresponding to the mask shots 3a to 3y as partial transfer patterns on the transfer mask 3, and parameters representing the relative relationship between that actual coordinate system and design coordinate system are calculated. Based on these parameters, the transfer position of each partial transfer pattern can be corrected. In this way, a high-precision transfer image 101 can be obtained while shortening the time required for alignment.

Second Embodiment

In this embodiment, shot profiles such as a magnification error, rotation error, and the like of a mask shot itself are taken into consideration, and are allowed to be corrected, thus further improving the joint precision of partial transfer patterns.

Figure 7:
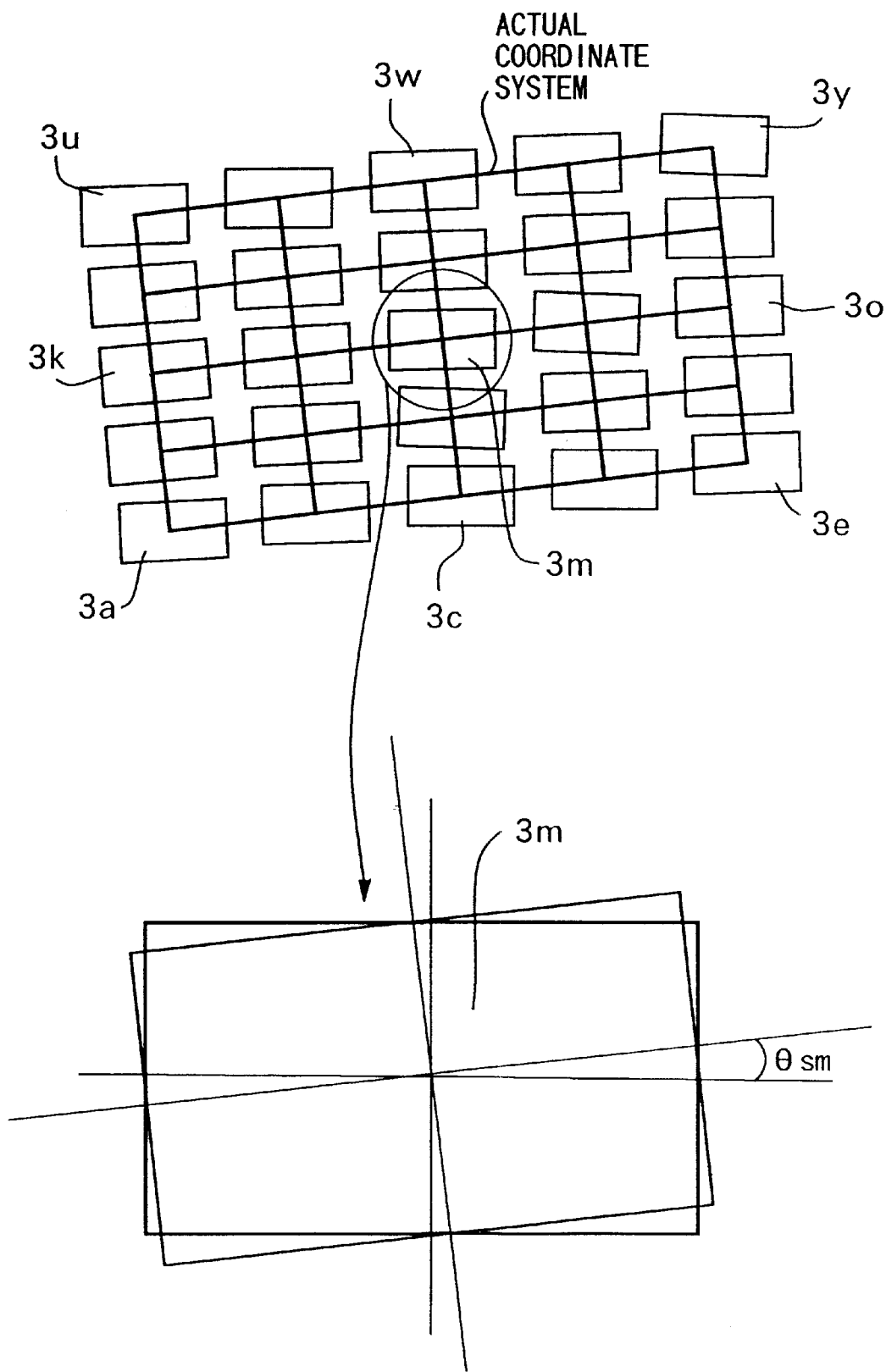
FIG. 7 is a schematic view for explaining shot profiles of mask shots in the second embodiment.

This embodiment is effective when a mask shot itself has been rotated or expanded/shrunk with respect to the coordinate system of the mask shot. FIG. 7 shows a state wherein mask shots 3a to 3y have been rotated, and a state wherein a mask shot 3m has been rotated by θsm.

The transfer method of this embodiment will be described below using the mask shot layout shown in FIGS. 2A and 2B used in the description of the first embodiment, and FIGS. 5A and 5B.

Figure 5A:
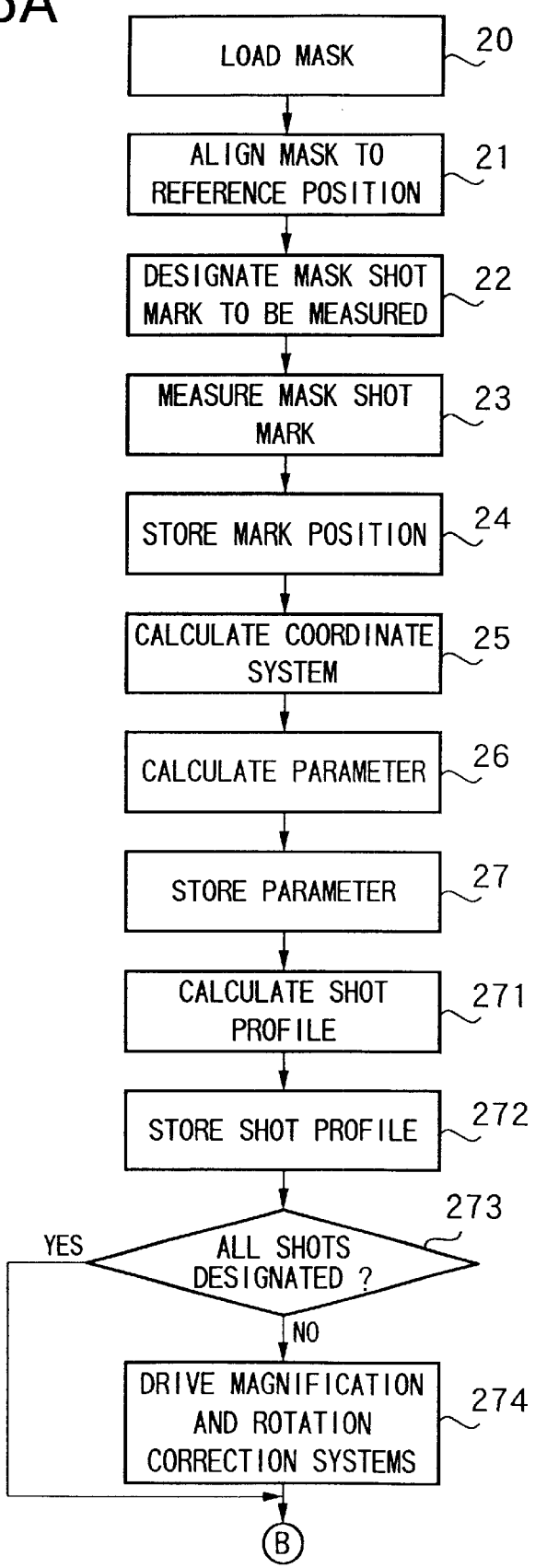
FIGS. 5A and 5B are flow charts for explaining a mask shot transfer method according to the second embodiment of the present invention.
Figure 5B:
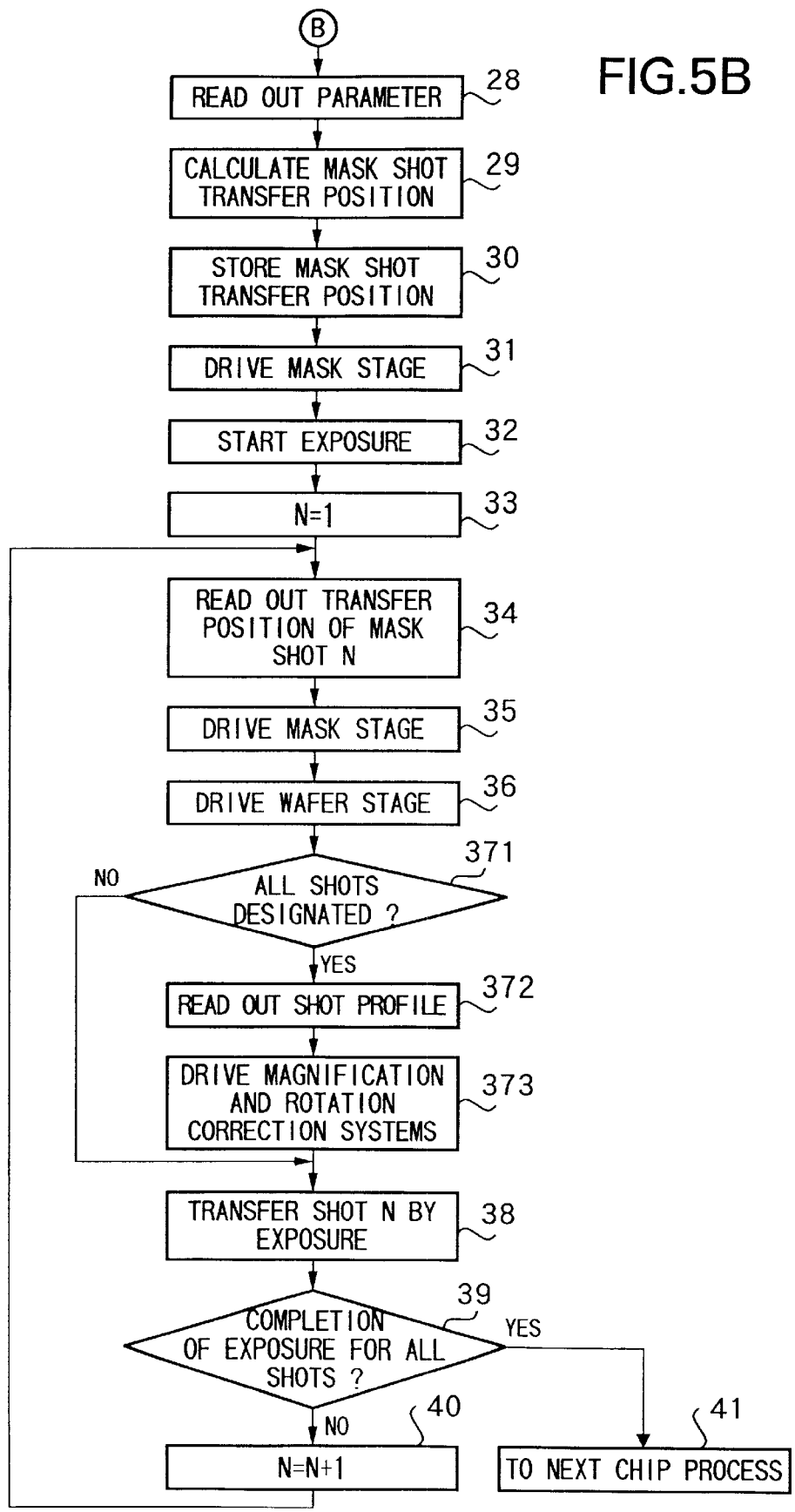

FIGS. 5A and 5B are flow charts for explaining the transfer method of this embodiment.

Steps 20 to 27 are the same as those in the first embodiment. That is, after the transfer mask 3 shown in FIG. 2A is loaded into the apparatus and is aligned to the reference position, the designated alignment marks are measured. The alignment marks to be designated are the same as those in the first embodiment. However, in this embodiment, all the marks may be designated. In this embodiment, when all the marks are designated, another effect can be expected.

The positions of the marks are calculated based on the measurement results of the alignment marks, and the actual coordinate system of each mask shot is calculated. Then, parameters that represent the relative relationship between this coordinate system and design coordinate system are calculated and stored.

The positions of the alignment marks stored in step 24 are read out, and the shot profiles of the mask shots are calculated (step 271). The profiles to be calculated include shot magnification and shot rotation amount.

Figure 4:
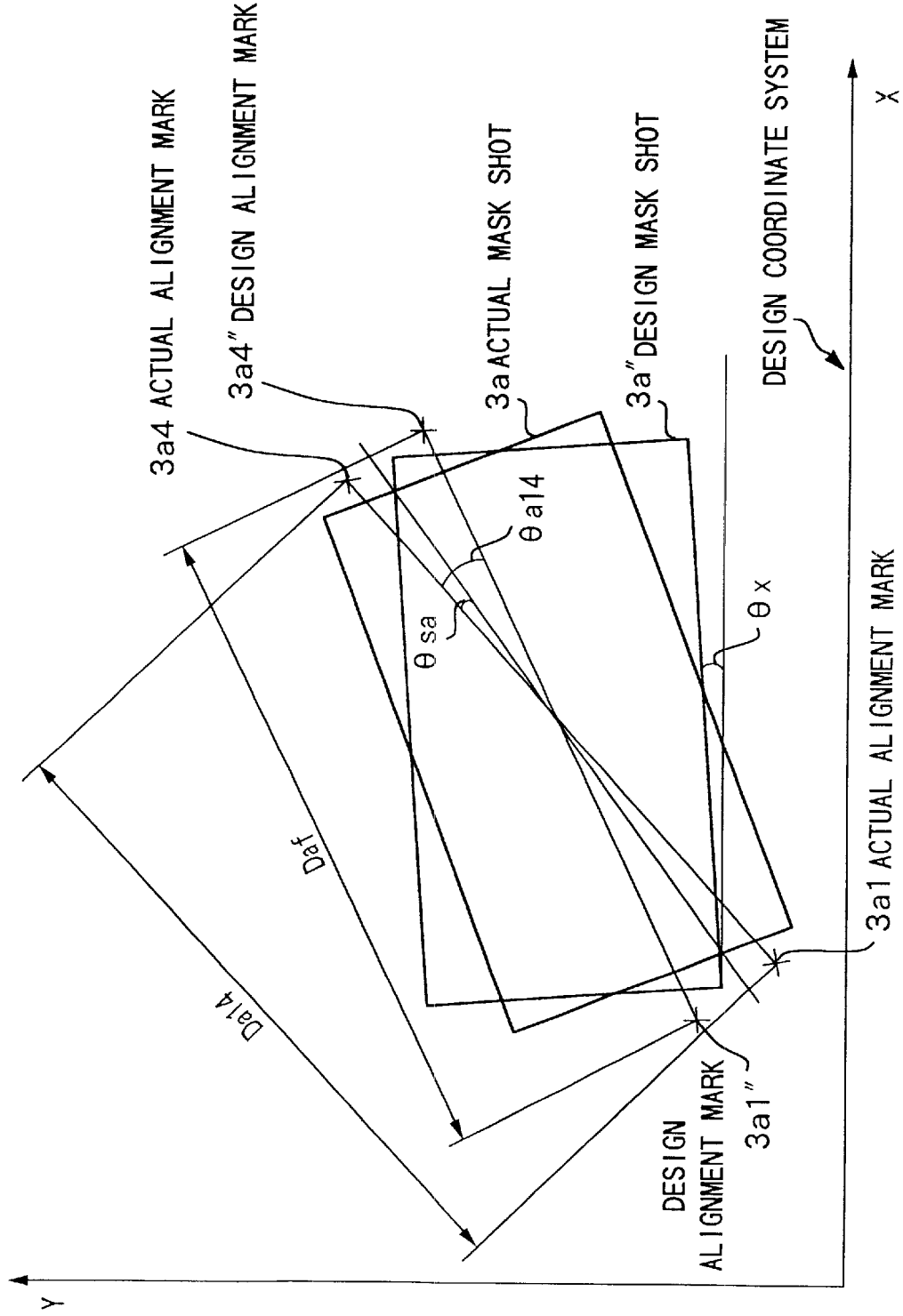
FIG. 4 is a schematic view for explaining shot profiles of mask shots in the first embodiment.

For example, assuming a state wherein an actual mask shot 3a has a tilt with respect to a design mask shot 3a", and is enlarged or reduced. The shot magnification is calculated as follows. For example, in case of the mask shot 3a in FIG. 4, if Da14 represents the spacing between the actual mark positions of the alignment marks 3a1 and 3a4, and Daf represents their design spacing, Da14/Daf is calculated to obtain the shot magnification. Similarly, taking the mask shot 3a as an example, an amount obtained by subtracting the rotation amount θx of the coordinate system from an angle θa14 a line segment that passes two points of the actual positions of the alignment marks 3a1 and 3a4 makes with a design line segment, is calculated to obtain a shot rotation amount θsa.

If not all the mask shots are designated in step 22, the average values of the shot magnifications and shot rotation amounts of the designated mask shots are calculated, and an average shot magnification Mm and average shot rotation amount θm are stored (step 272). On the other hand, if all the mask shots are designated in step 22, all the shot magnifications and shot rotation amounts of the mask shots are stored (step 272).

It is checked if marks to be measured of all the mask shots are designated in step 22 (step 273). If marks of all the mask shots are designated, the flow skips the next step 274; otherwise, the flow advances to step 274. This is because if the average shot magnification Mm and average shot rotation amount θm are used, all the mask shots can be corrected by the same amounts by driving the magnification correction system 8 and rotation correction system 9 in advance (step 274). By contrast, if all the mask shots are designated in step 22, the shot magnification and shot rotation amount of each mask shot can be optimally and independently corrected.

In this case, in a shot exposure loop to be described later, correction must be done in units of shots by driving the magnification correction system 8 and rotation correction system 9. For this reason, if all the mask shots are designated, the flow skips step 274.

The subsequent steps 28 to 31 are the same as those in the first embodiment. That is, after the transfer positions of the mask shots are calculated and stored, and the rotation component of the transfer mask 3 is corrected by driving the θ stage of the mask stage 6, a series of exposure processes are started in step 32.

Furthermore, as in the first embodiment, the mask shot number N is reset to 1 (step 33), and the flow advances to steps 34 to 40 that form the shot exposure loop. Steps 34 to 36 are the same as those in the first embodiment. That is, the transfer position of each mask shot is read out to drive the mask stage 6, and the wafer stage 11 is driven to a position on the wafer 10 where the transfer image of the mask shot of interest is to be transferred, thus preparing for the start of relative scan exposure.

It is then checked if all the mask shots are designated in step 22 (step 371). If all the mask shots are designated, i.e., if correction associated with shot profiles is made in units of mask shots, the shot profiles of the mask shot of interest stored in step 272 are read out (step 372). The shot magnification is corrected by driving the magnification correction system 8, and the shot rotation amount is corrected by driving the rotation correction system 9 (step 373).

If not all the mask shots are designated in step 22, i.e., if correction associated with shot profiles is made using the average shot magnification Mm and average shot rotation amount θm to apply the same correction amount to all the mask shots, since the magnification correction system 8 and rotation correction system 9 have already been driven based on the average shot magnification Mm and average shot rotation amount θm in step 274, the flow skips steps 372 and 373, i.e., jumps to the next step. After that, relative scan exposure is done for that shot (step 38), thus completing the processes for one shot.

The subsequent steps are the same as those in the first embodiment. The loop of steps 34 to 40 repeats itself in correspondence with the number of shots. Upon completion of exposure of all the shots, the flow branches at step 39 and advances to the next chip process.

As described above, this embodiment also pays attention to the shot profiles of each shot, and corrects the shot magnification and shot rotation amount of the shot itself, thus obtaining a transfer image 101 with higher joint precision.

Third Embodiment

A transfer method for the 2nd and subsequent layers will be explained below using the shot layout shown in FIGS. 6A and 6B, the flow charts shown in FIGS. 8A to 9B, FIG. 10 that explains the coordinate system of wafer shots, and FIG. 11 that explains the shot profiles of wafer shots.

Note that the 2nd layer indicates a transfer image (not shown) to be transferred to overlap the transfer image 101 as the 1st layer, which has already been transferred onto the wafer 10, as has been described in the first embodiment.

Figure 6A:
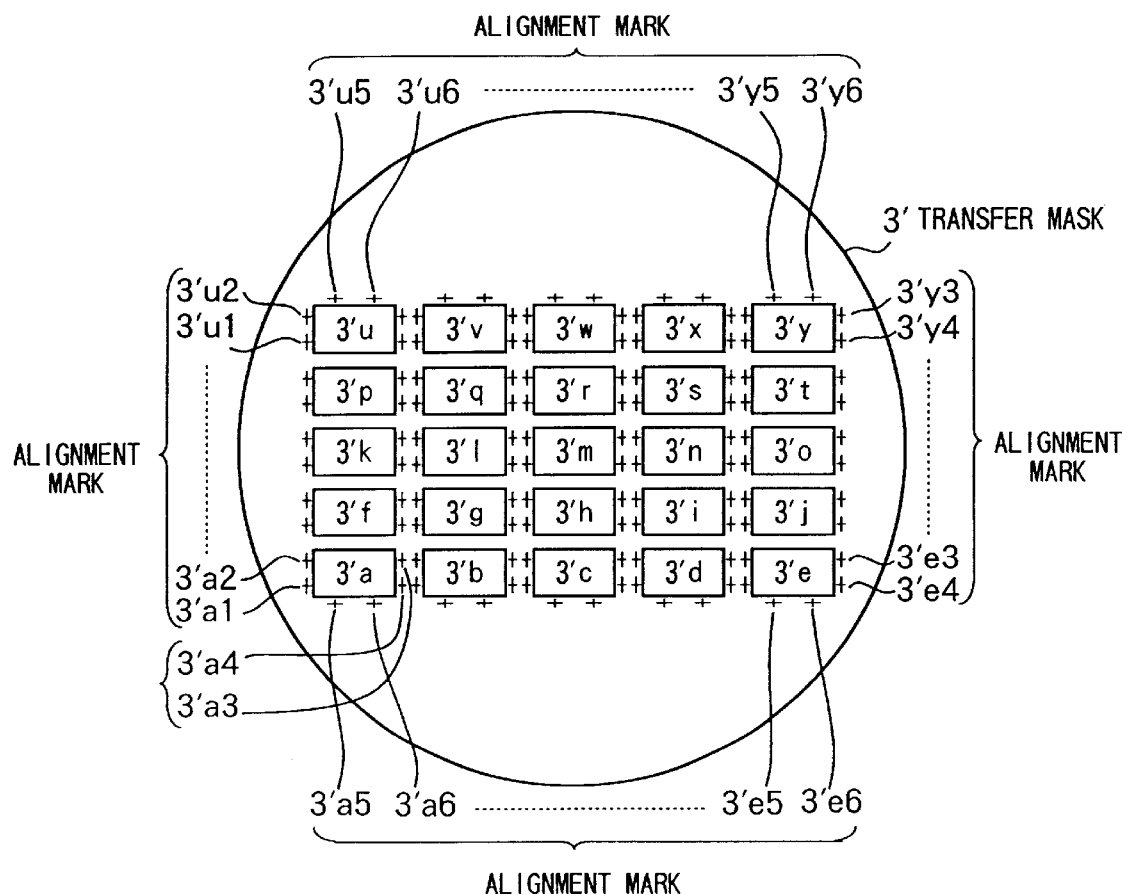
FIGS. 6A and 6B are schematic views for explaining mask shots and wafer shots in the third and fourth embodiments.
Figure 6B:
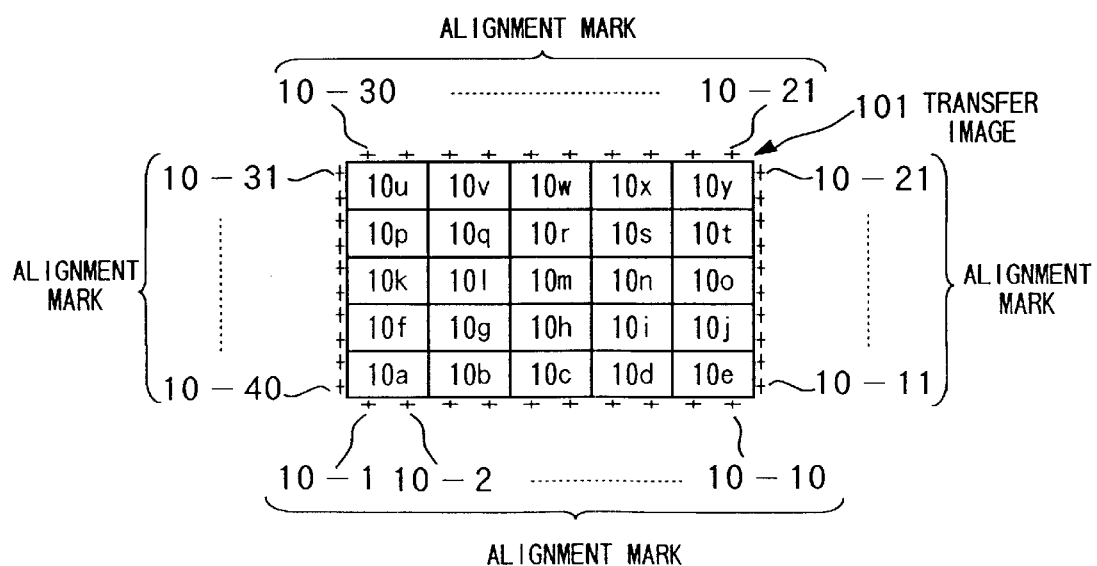

FIGS. 6A and 6B respectively show a transfer mask 3' having mask shots 3'a to 3'y which must overlap the corresponding mask shots 3a to 3y shown in FIG. 2A, and the transfer image 101 obtained by transferring the mask shots 3a to 3y on the transfer mask 3 described in the first embodiment onto the mask 10 together with the alignment marks around the patterns by exposure.

The mask shots 3'a to 3'y are partial transfer patterns obtained by dividing the transfer pattern to be transferred to overlap the transfer image 101 as the 1st layer into a plurality of patterns. The transfer mask 3' is formed with alignment marks 3'a1 to 3'y6 on the two sides of the mask shots 3'a to 3'y, the lower side of the shots 3'a to 3'e, and the upper side of the shots 3'u to 3'y. On the wafer 10, alignment marks 10-1 to 10-30 have already been transferred in the previous process.

The transfer method of this embodiment will be explained below with reference to the flow charts shown in FIGS. 8A and 8B, and FIGS. 9A and 9B.

Figure 8A:
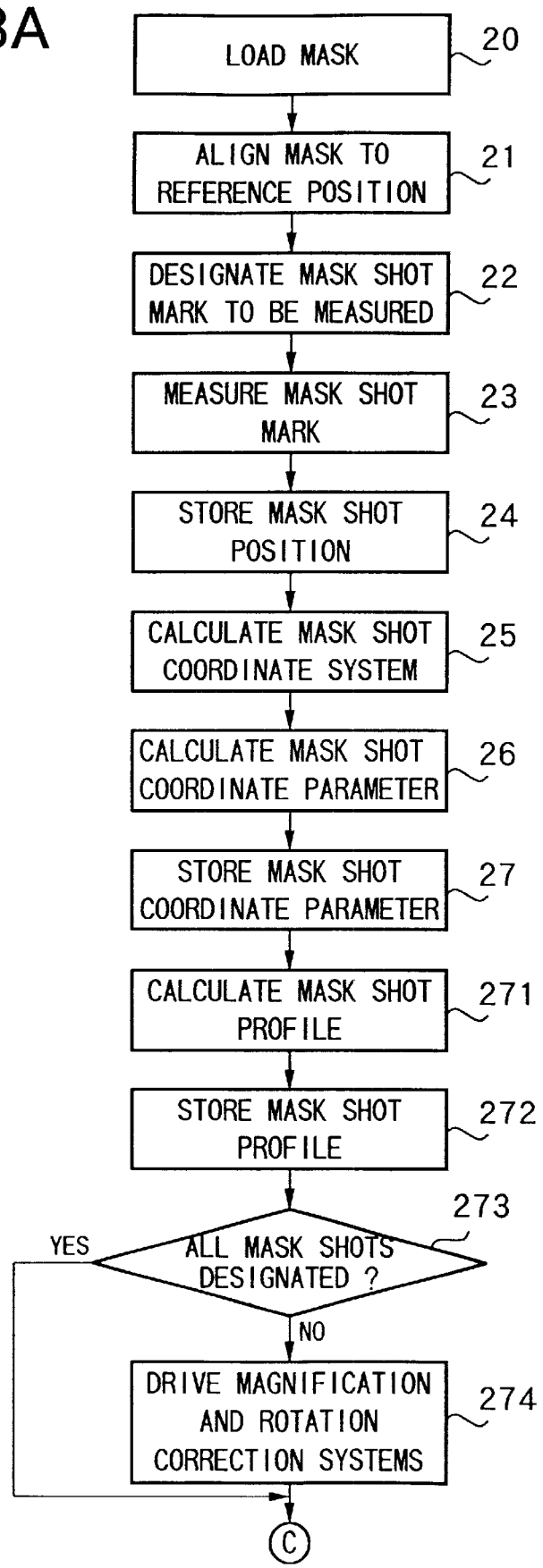
FIGS. 8A and 8B are flow charts for explaining a mask shot transfer method according to the third embodiment of the present invention.
Figure 8B:
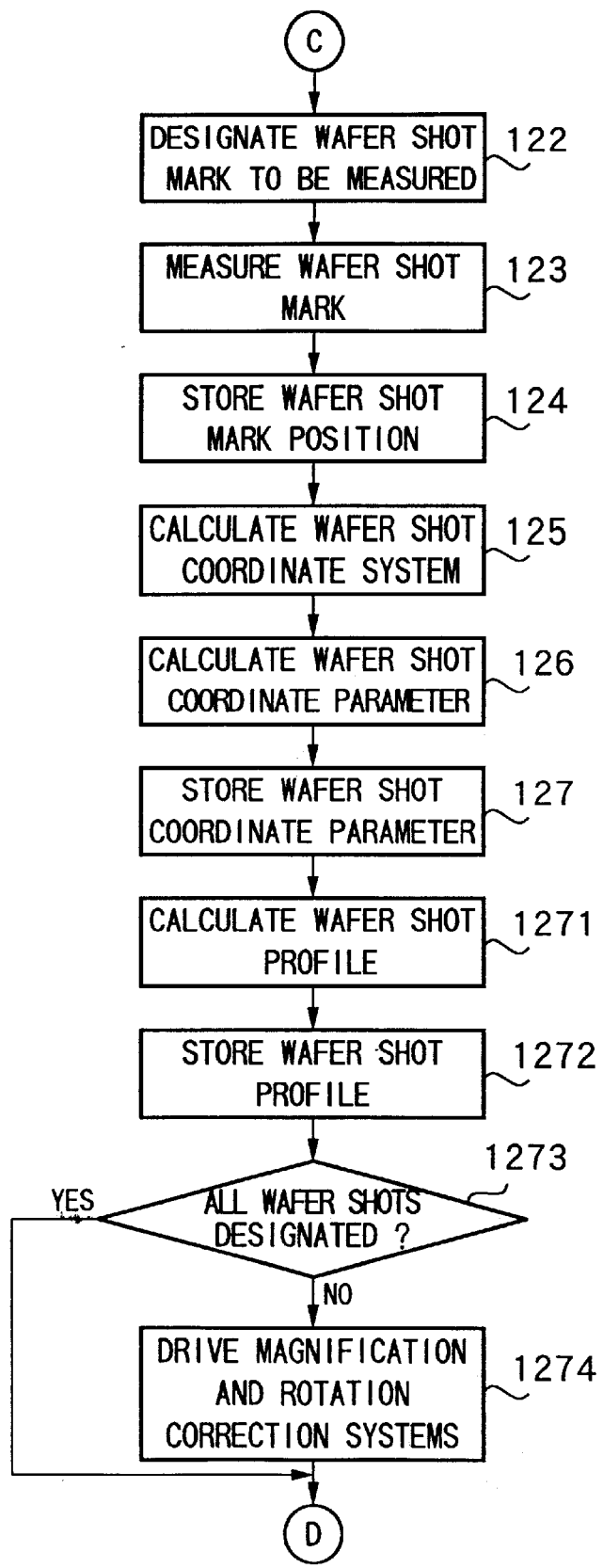

Referring to FIGS. 8A and 8B, steps 20 to 27 and steps 271 to 274 are the same as those in the second embodiment. More specifically, upon completion of these steps, the measurements and processes for the respective mask shots, calculation of parameters that pertain to the coordinate system of the mask shots, and processes that pertain to mask shot profiles are complete.

Upon calculating the actual coordinate system in step 25, lattice fitting is done using values each obtained by subtracting the fabrication position of each partial transfer pattern of the transfer mask, which is obtained in advance, from the actual position of each shot to be measured. Lattice fitting is done again with respect to the obtained virtual lattice and a fabrication coordinate system of the partial transfer patterns, which is obtained in advance, thereby obtaining an actual coordinate system. In this way, upon lattice fitting, positional variations of the partial transfer patterns can be evaluated while removing the influences of random components resulting from fabrication errors of the partial transfer patterns, thus allowing more accurate pattern transfer.

Figure 34:
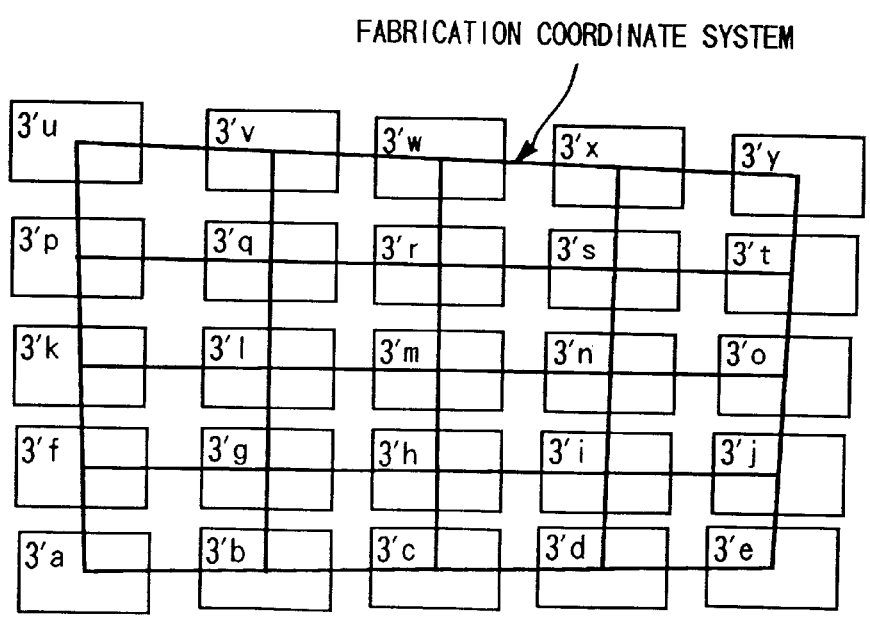
FIG. 34 shows a fabrication coordinate system of partial transfer patterns of the transfer mask shown in FIG. 6A.

FIG. 34 shows a fabrication coordinate system of the partial transfer patterns of the transfer mask 3'. Upon fabrication of the transfer mask, the positions of the partial transfer patterns have errors with respect to the design coordinate system as in the transfer mask 3. Even in the transfer mask used in the processes for the 2nd and subsequent layers, by measuring alignment marks related to the respective partial transfer patterns in advance, the fabrication positions and coordinate system of the partial transfer patterns can be obtained as in the 1st mask process.

In steps 122 to 127, the same processes as those for the mask shots and mask shot coordinate system in steps 22 to 27 are done for wafer shots and wafer shot coordinate system.

Wafer shots 10a, 10c, 10e, 10k, 10o, 10u, 10w, and 10y are designated (step 122). In this case, note that the alignment marks that have already transferred onto the wafer are only those corresponding to the outer peripheral wafer shots.

The positions of alignment marks 10-1 to 10-40 corresponding to the wafer shots 10a, 10c, 10e, 10k, 10o, 10u, 10w, and 10y designated in step 122 are measured (step 123), and are stored (step 124).

Furthermore, the actual wafer shot coordinate system is calculated based on these positions of the alignment marks 10-1 to 10-40 (step 125). Also, parameters that represent the relative relationship between the actual coordinate system and design coordinate system are calculated (step 126) and are stored (step 127).

Figure 10:
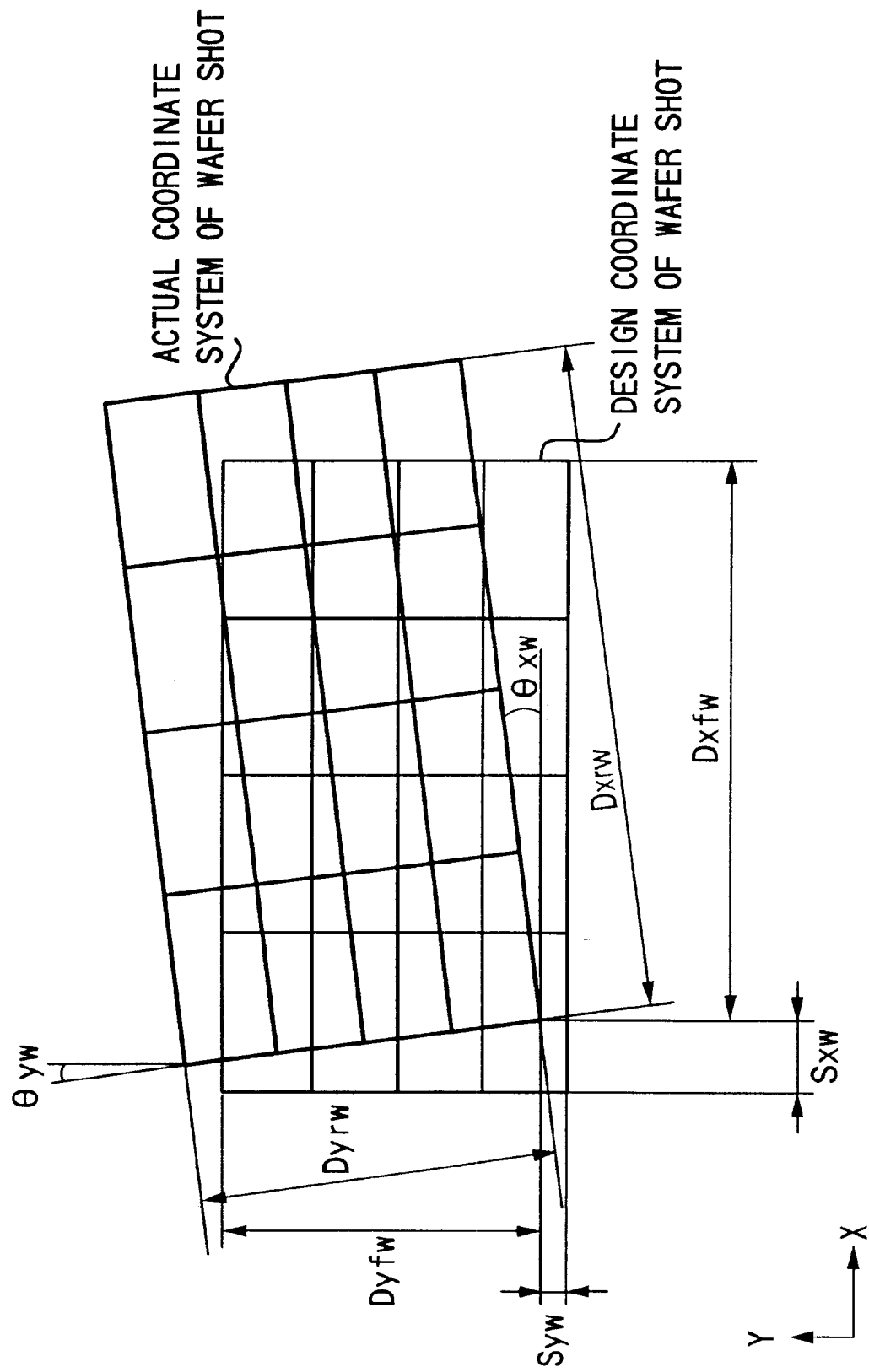
FIG. 10 is a schematic view for explaining the coordinate system of wafer shots in the third embodiment.
Figure 11:
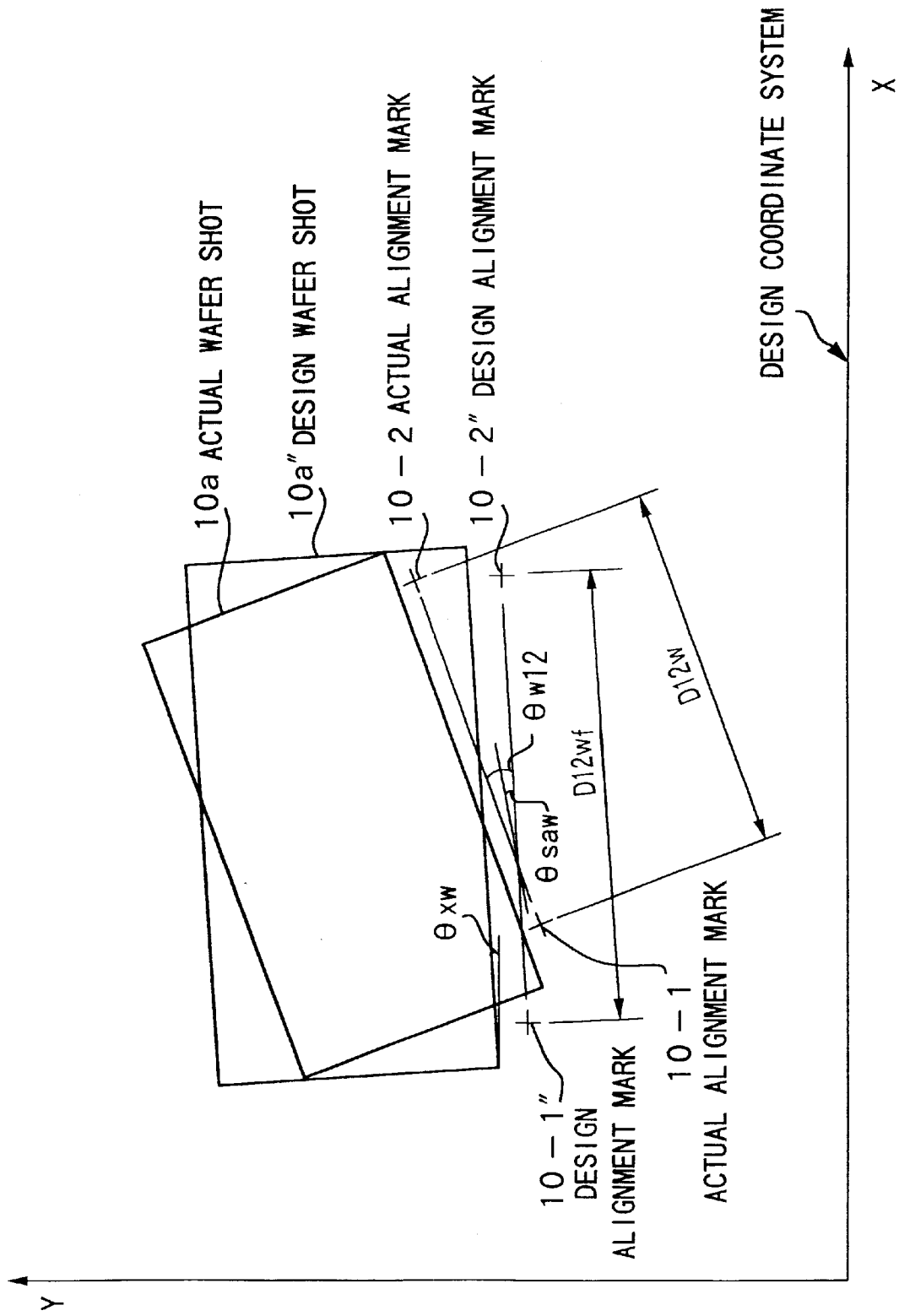
FIG. 11 is a schematic view for explaining shot profiles of wafer shots in the third embodiment.
Figure 12A:
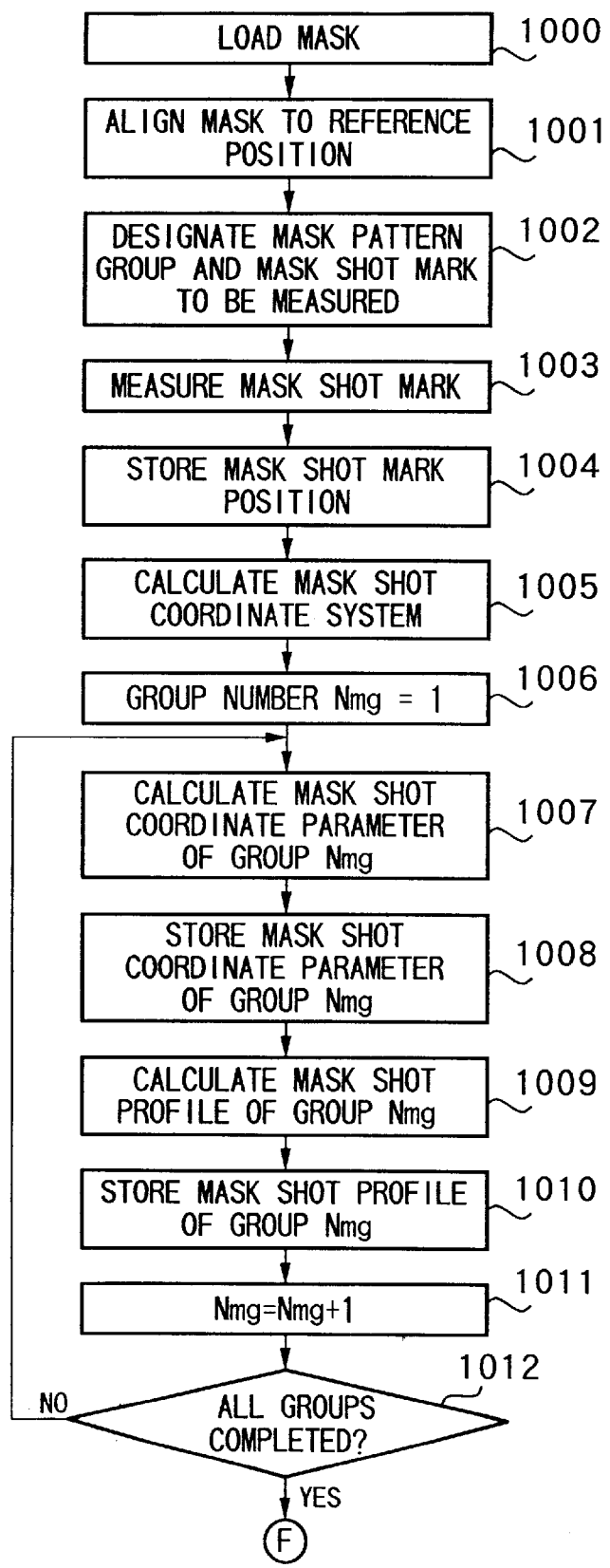
FIGS. 12A and 12B are flow charts for explaining a mask shot transfer method according to the fourth embodiment of the present invention.
Figure 12B:
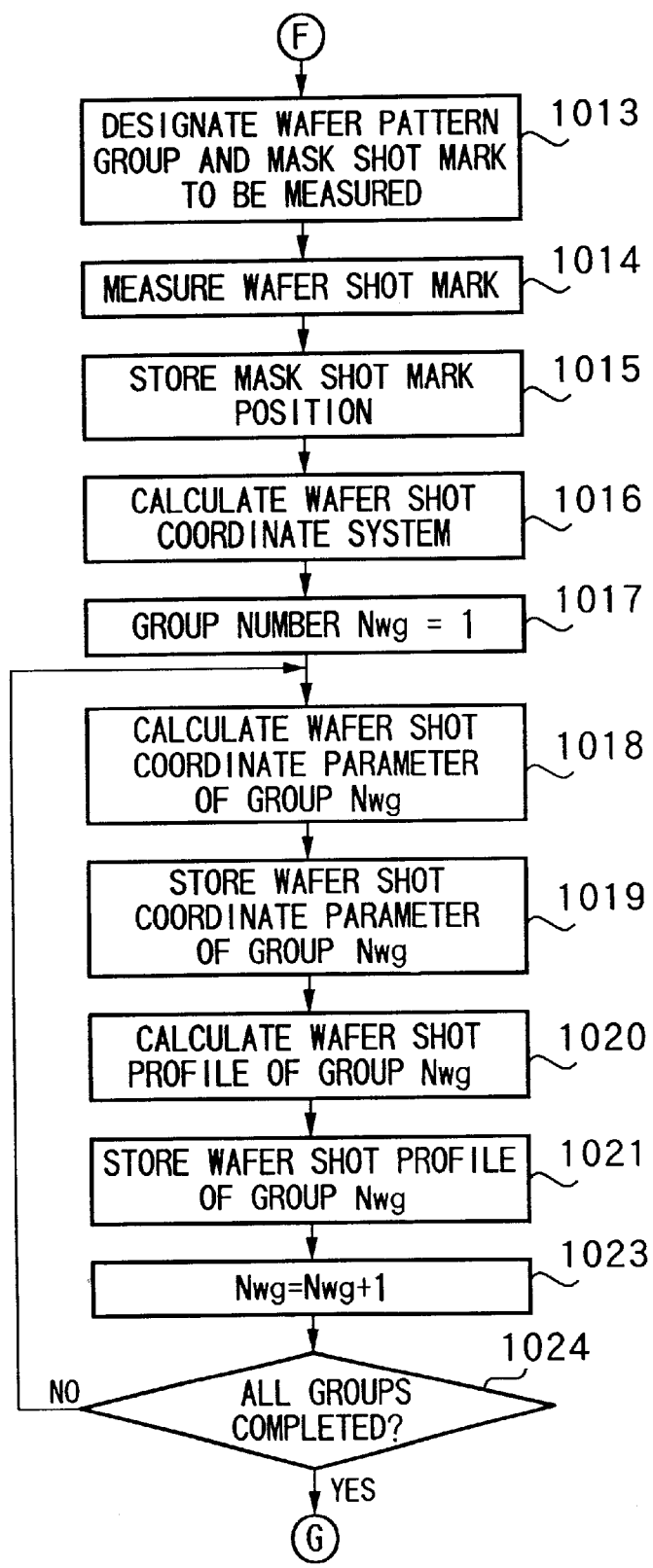
Figure 13:
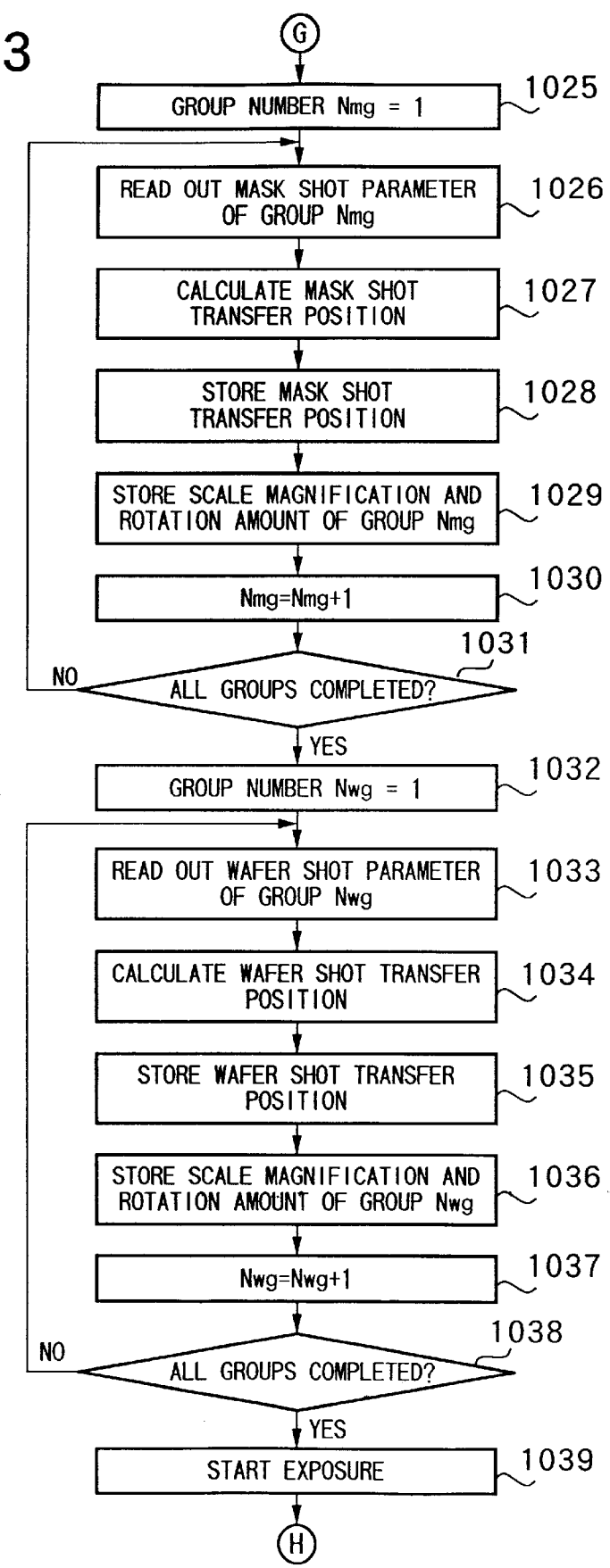
FIG. 13 is a flow chart for explaining a mask shot transfer method according to the fourth embodiment of the present invention.
Figure 14A:
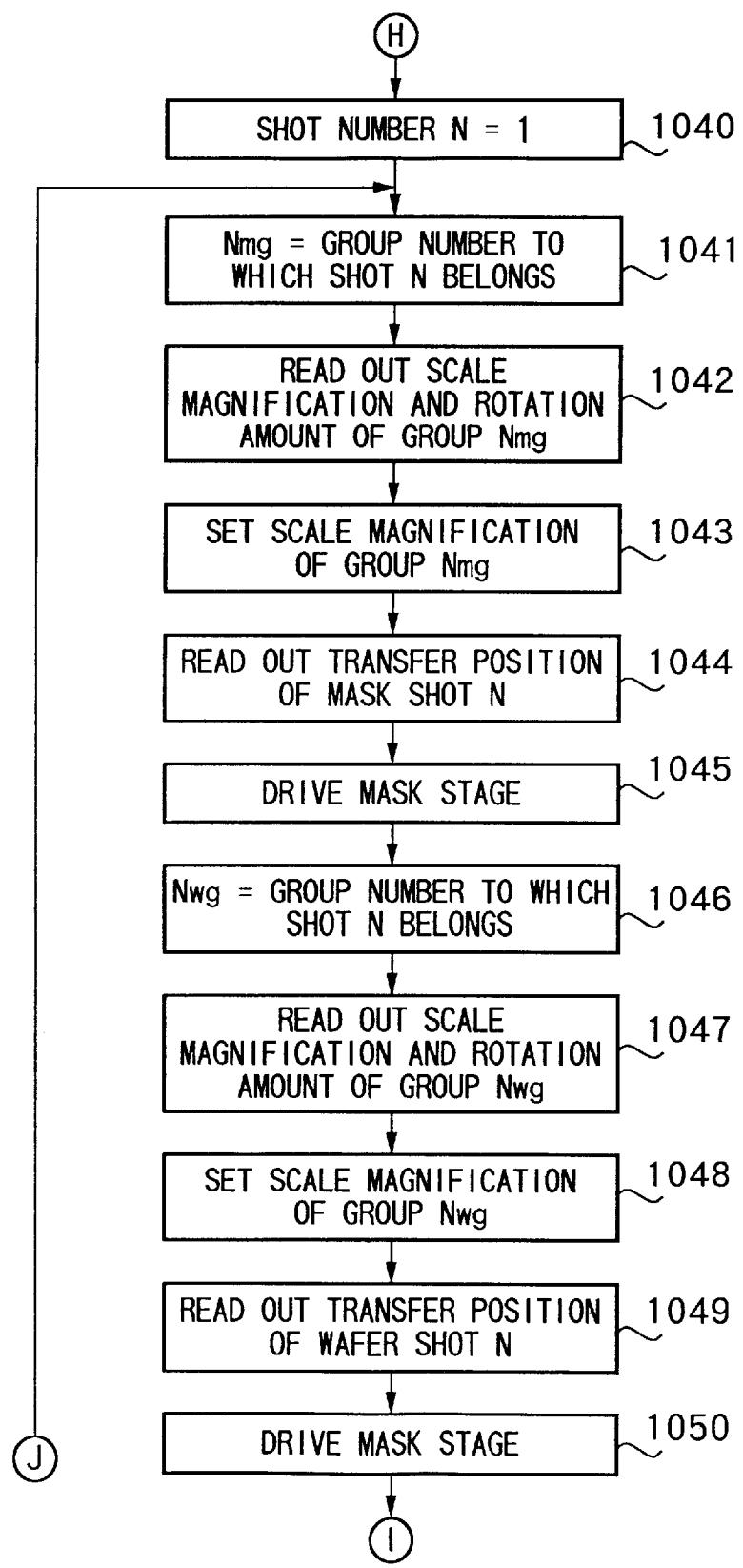
FIGS. 14A and 14B are flow charts for explaining a mask shot transfer method according to the fourth embodiment of the present invention.
Figure 14B:
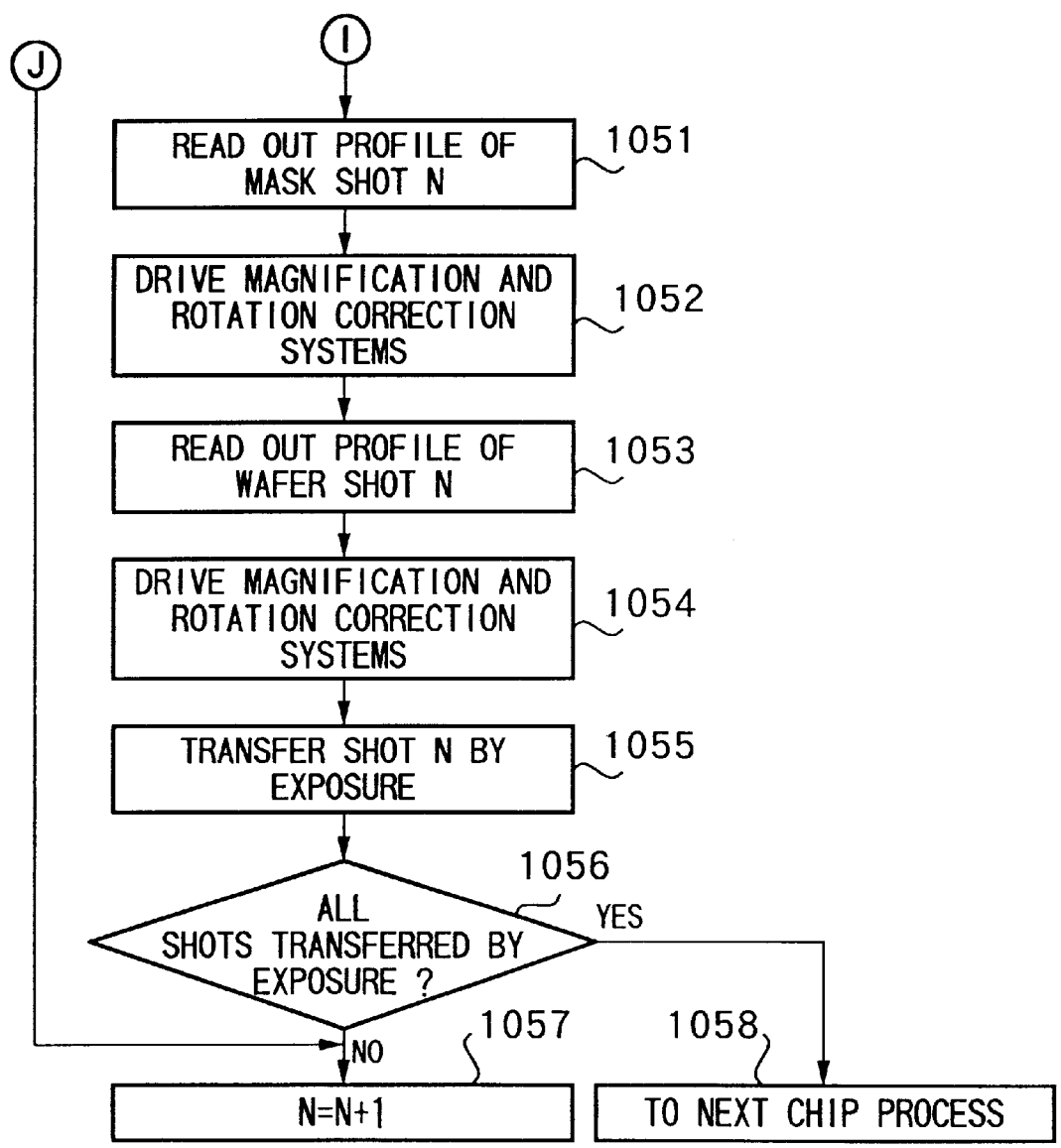

Upon completion of these steps, as shown in FIG. 10, parameters equivalent to those obtained by the processes for the mask shots, i.e., shift components Sxw and Syw in the x- and y-axis directions, rotation components θxw and θyw about the x- and y-axes, and magnifications (scale magnifications) Dxrw/Dxfw and Dyrw/Dyfw in the x- and y-axis directions are obtained. Note that θxw represents the rotation component of the entire coordinate system, and θxw−θyw represents the orthogonality level component.

Parameters that represent the relative relationship between the design wafer shot coordinate system, which serves as the reference coordinate system of the apparatus, and the actual wafer shot coordinate system are obtained by comparison. However, since parameters that represent the relative relationship between the design mask shot coordinate system and actual mask shot coordinate system obtained by comparison in association with mask shots are those obtained by comparison with the design coordinate system which serves as the reference coordinate system of the apparatus, parameters may be obtained by comparing the actual mask shot coordinate system and actual wafer shot coordinate system.

Steps 1271 to 1274 are processes associated with the shot profiles of wafer shots. In these steps, processes equivalent to those (steps 271 to 274) associated with the profiles of mask shots are done for the wafer shots.

The positions of the alignment marks stored in step 124 are read out to calculate the shot profiles of the wafer shots (step 1271). The profiles to be calculated include shot magnification and shot rotation amount. The shot magnification is calculated as follows. For example, referring to FIG. 11, given the wafer shot 10a, if D12w represents the spacing between the actual mark positions of the alignment marks 10-1 and 10-2, and D12wf represents their design spacing, D12w/D12wf is calculated to obtain the shot magnification. Similarly, given the wafer shot 10a as an example, an amount obtained by subtracting the rotation amount θxw of the coordinate system from an angle θw12 a line segment that passes two points of the alignment marks 10-1 and 10-2 of the actual wafer shot 10a makes with a line segment that passes two points of alignment marks 10-1" and 10-2" of a design wafer shot 10a", is calculated to obtain a shot rotation amount θsaw. In this case, if not all the wafer shots are designated in step 122, the average values of the shot magnifications and shot rotation amounts of the designated wafer shots are calculated, and an average shot magnification Mmw and average shot rotation amount θmw are stored (step 1272). On the other hand, if all the wafer shots 10a to 10y are designated in step 122, the shot magnifications and shot rotation amounts of the wafer shots 10a to 10y are stored in step 1272.

It is checked if marks to be measured of all the wafer shots 10a to 10y are designated in step 122 (step 1273). If all the wafer shots are designated, the flow skips the next step 1274; otherwise, step 1274 is executed.

In this embodiment, since the partial patterns on the transfer mask 3 of the 1st layer form a 5×5 matrix, only the alignment marks corresponding to the outer peripheral wafer shots 10a to 10e, 10f, 10j, 10k, 10o, 10p, 10t, and 10u to 10y of the wafer shots 10a to 107 have been transferred. Hence, in step 122, only these outer peripheral wafer shots 10a to 10e, 10f, 10j, 10k, 10o, 10p, 10t, and 10u to 10y can be designated in step 122, and the shot magnifications and shot rotation amounts are corrected using the average shot magnification Mmw and average shot rotation amount θmw (step 1274).

The flow skips step 1274, i.e., all the wafer shots 10a to 10y can be designated in step 122 when the shot layout allows transfer of alignment marks corresponding to all the mask shots on the 1st layer onto the wafer 10, e.g., when the pattern of the transfer mask is divided into partial patterns in a 2×2 matrix or into partial patterns lined up in the x- or y-direction.

Note that the magnification correction system 8 and rotation correction system 9 are driven again in step 1274 if they have already been driven in step 274.

Figure 9A:
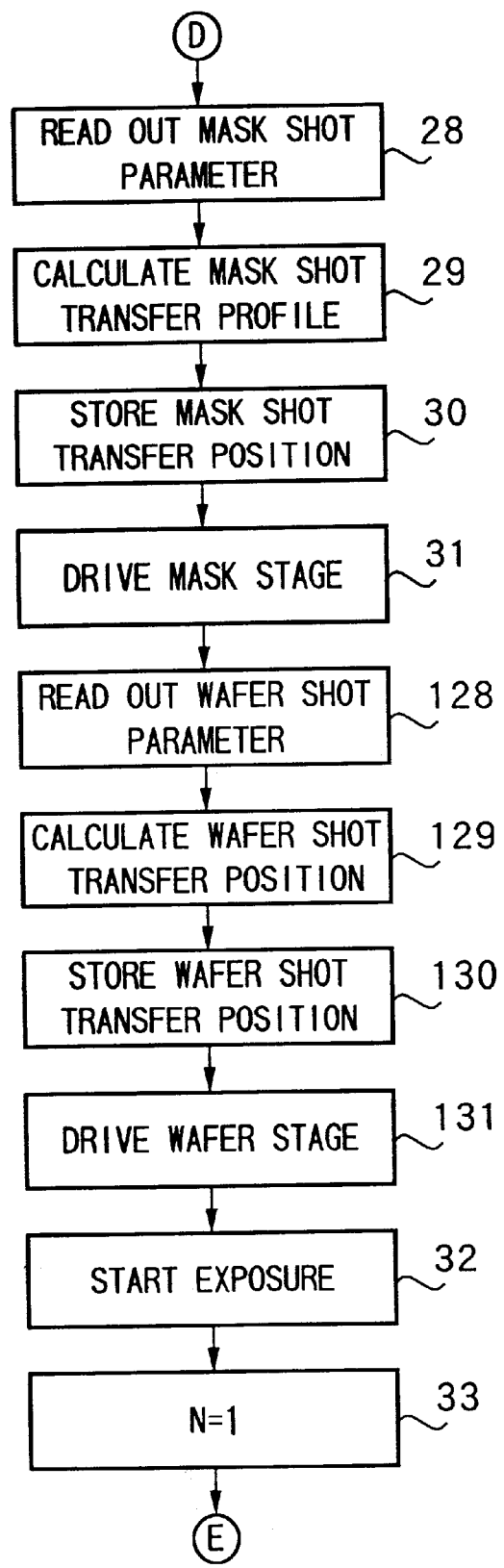
FIGS. 9A and 9B are flow charts for explaining a mask shot transfer method according to the third embodiment of the present invention.
Figure 9B:
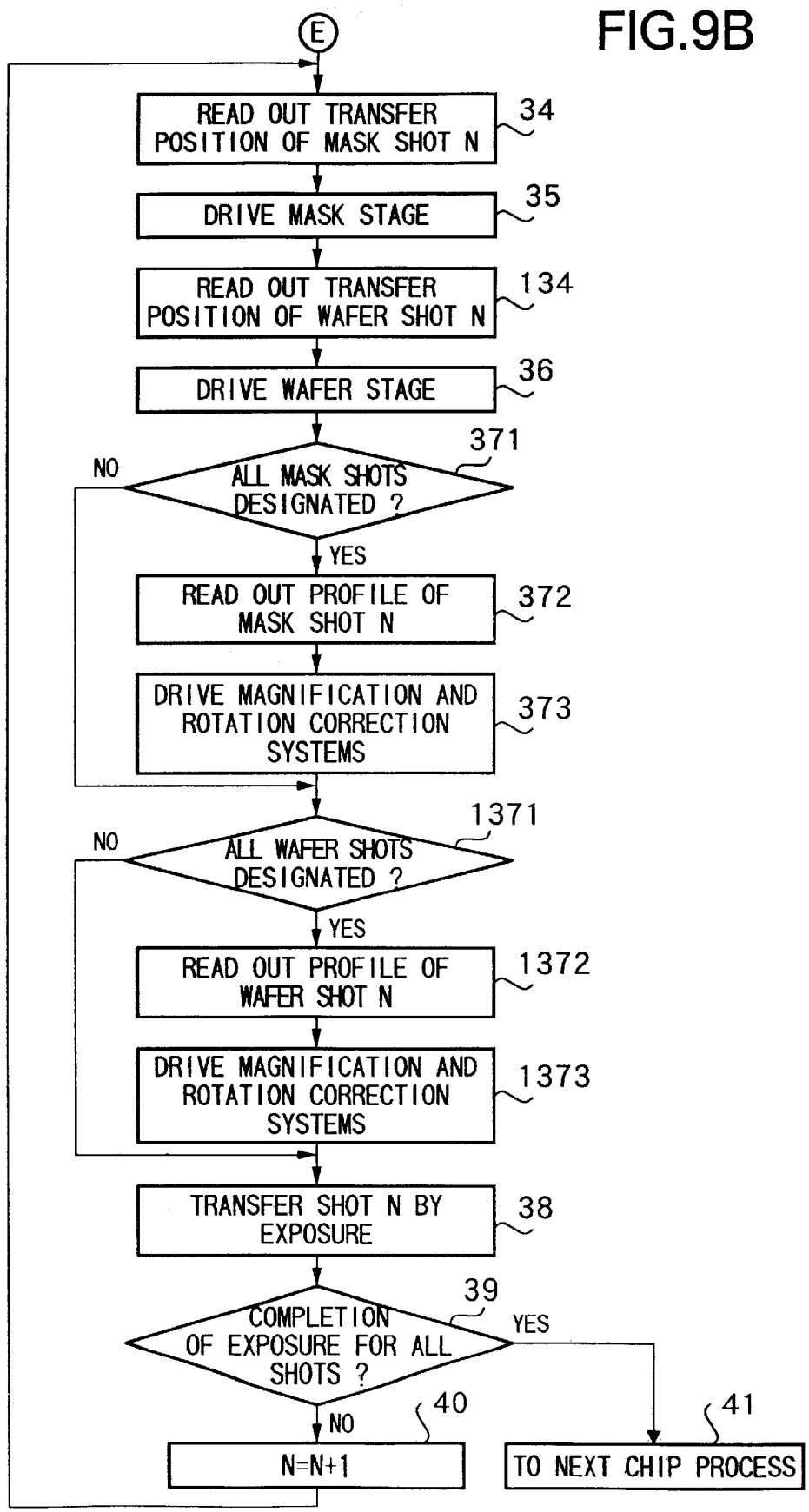

The subsequent processes will be described in detail using the flow charts shown in FIGS. 9A and 9B.

Steps 28 to 31 are the same as those in the first embodiment. That is, the mask shot parameters are read out (step 28), the transfer positions of the mask shots are calculated (step 29), and are stored (step 30). Also, the scale magnifications are supplied to the mask stage 6 and the θ stage on the mask stage 6 are driven to correct the rotation component of the mask (step 31).

In steps 128 to 131, processes equivalent to those in steps 28 to 31 that pertain to mask shots are done for the wafer shots.

The stored parameters are read out (step 128).

Based on the shift components Sxw and Syw and orthogonality level component θxw–θyw of the readout parameters, the transfer positions of the wafer shots are calculated (step 129) and are stored (step 130). Upon correcting the orthogonality level component θxw–θyw, so-called stepwise correction for shifting the x-coordinate in correspondence with the y-coordinate is used. Furthermore, the scale magnifications Dxrw/Dxfw and Dyrw/Dyfw are supplied to the wafer stage 11 as drive parameters, and the rotation amount of the wafer 10 is detected on the basis of the rotation component θxw. Then, a θ stage on the wafer stage 11 that carries the wafer 10 is rotated to correct the rotation component of the wafer (step 131).

When exposure starts (step 32), a shot number N is reset to 1 (step 33), and the control enters the subsequent shot exposure loop. When the number N=1, the mask shot to be transferred is 3'a, and the transferred image overlaps the wafer shot 10a.

Subsequently, the transfer position of the mask shot corresponding to the current shot number of the mask shots 3'a to 3'y is read out (step 34), and the mask stage 6 is driven based on the readout transfer position, thus moving the mask shot of interest to the transfer position (step 35).

On the other hand, the position of the wafer shot which corresponds to the shot number of the wafer shots 10a to 107 and on which the image of the mask shot of interest is to overlap is read out (step 134), and the wafer stage 11 is driven based on the readout position, thus moving the wafer shot of interest to that position (step 36).

Note that these positions of the mask shots 3'a to 3'y and wafer shots 10a to 10y are scan start positions of the subsequent relative scan exposure with respect to the charged beam 12.

Steps 371 to 373 are the same as those in the second embodiment mentioned above.

Steps 1371 to 1373 correspond to mask shot profile correction steps 371 to 373, and in these steps, the control conditionally branches depending on the way the shot magnification and shot rotation amount as wafer shot profiles are corrected.

It is checked if all the wafer shots 10a to 10y are designated in step 122 (step 1371). If all the wafer shots 10a to 10y are designated, i.e., if correction associated with shot profiles is to be done in units of wafer shots, the shot profiles of the wafer shot of interest stored in step 1272 are read out (step 1372), the shot magnification is corrected by driving the magnification correction system 8, and the shot rotation amount is corrected by driving the rotation correction system 9 (step 1373).

If all the wafer shots 10a to 10y are not designated, i.e., if correction associated with shot profiles is done using the average shot magnification Mmw and average shot rotation amount θmw to apply the same correction amounts to all the wafer shots 10a to 10y, since the magnification correction system 8 and rotation correction system 9 have already been driven on the basis of the average shot magnification Mmw and average shot rotation amount θmw in step 1274, the control conditionally branches in step 1371 to skip steps 1372 and 1373.

As mentioned above, in this embodiment, since only the outer peripheral wafer shots have been designated in step 122, correction has been already been done on the basis of the average shot magnification Mmw and average shot rotation amount θmw in step 1274. Hence, the control skips steps 1372 and 1373.

After that, the beam control system 2 is driven to irradiate the mask shot 3'a with the charged beam 12, the image of the mask shot 3'a begins to be transferred to overlap the wafer shot 10a on the wafer 10, and relative scan exposure is done by moving the mask stage 6 and wafer stage 11 relative to each other (step 38), thus completing processing for one shot.

The subsequent steps are the same as those in the first and second embodiments, and the loop of steps 34 to 40 repeats itself for the number of shots. Upon completion of exposure for all the shots, the flow branches in step 39 and advances to the next chip processes.

To restate, since the relative positions between the alignment marks 3'a1 to 3'y6 of the mask shots 3'a to 3'y and the alignment marks 10-1 to 10-40 of the wafer shots 10a to 10y are corrected, and partial transfer patterns are transferred in turn on the basis of the corrected position, a transfer image in which the respective shots have high joint precision can be obtained, and can accurately overlap any pattern that has already been transferred onto the wafer 10.

In this embodiment, alignment and transfer of partial transfer patterns have been explained. However, the chip alignment method on the wafer 10 can use various methods used in, e.g., a conventional optical exposure apparatus and the like.

In this embodiment, a detailed description of chip alignment on the wafer 10 will be omitted. For example, in the global alignment method, the layout of chips on the wafer 10 is measured, and is compared with a design layout to correct the coordinate system associated with the chip layout. After the wafer stage 11 is driven using the corrected coordinate system, this embodiment can be applied.

Fourth Embodiment

In the first to third embodiments, all the shots are equivalently corrected. However, this embodiment is characterized by dividing a shot matrix into some groups, and making correction in units of groups.

This embodiment which is applied to the 2nd layer will be explained below using the shot layout shown in FIGS. 6A and 6B with reference to FIGS. 12A to 17.

FIGS. 12A to 14B are flow charts for explaining a mask shot transfer method of this embodiment.

Figure 15A:
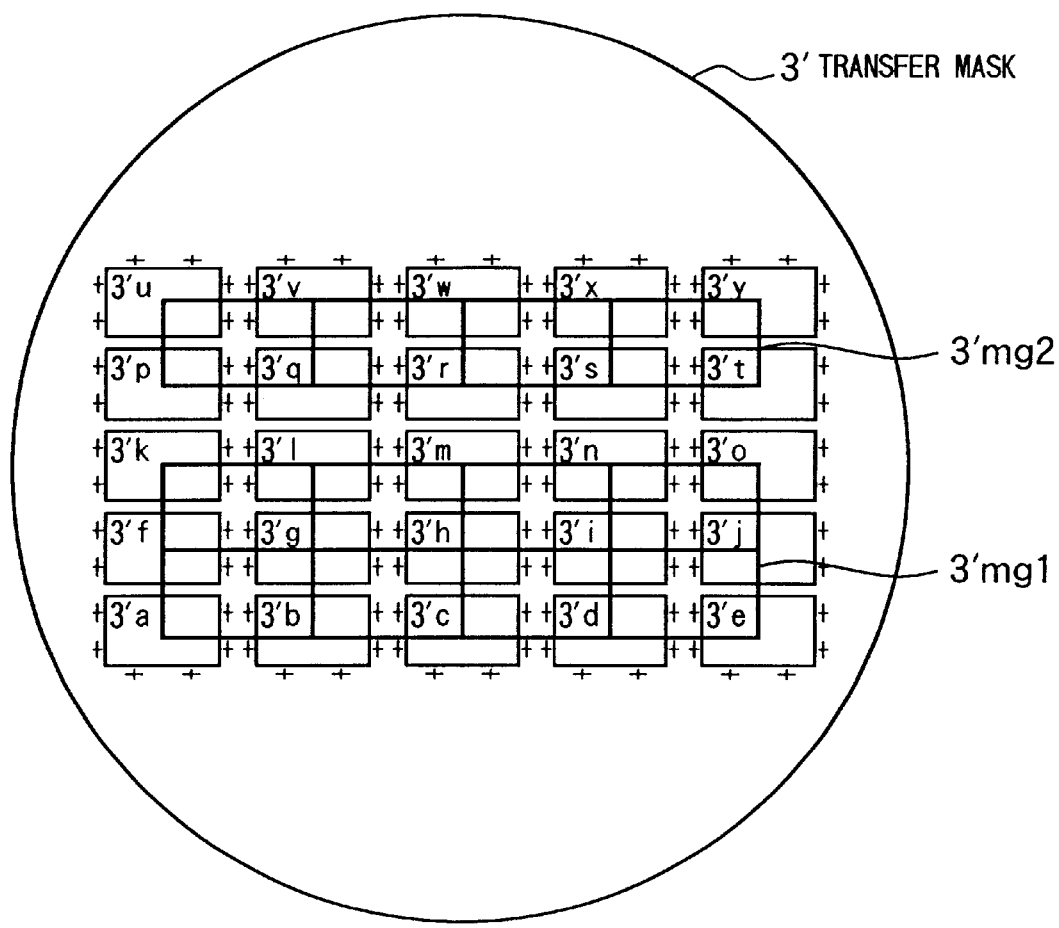
FIGS. 15A and 15B are schematic views for explaining pattern groups of mask shots and wafer shots in the fourth embodiment.
Figure 15B:
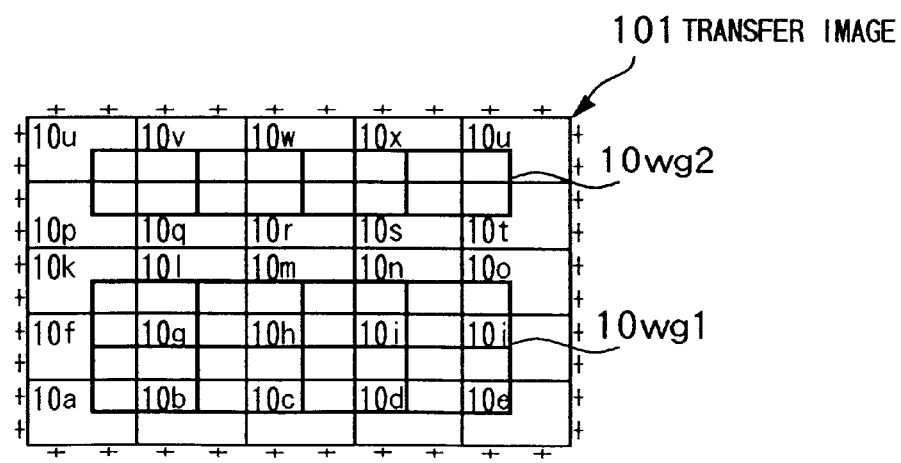
Figure 16:
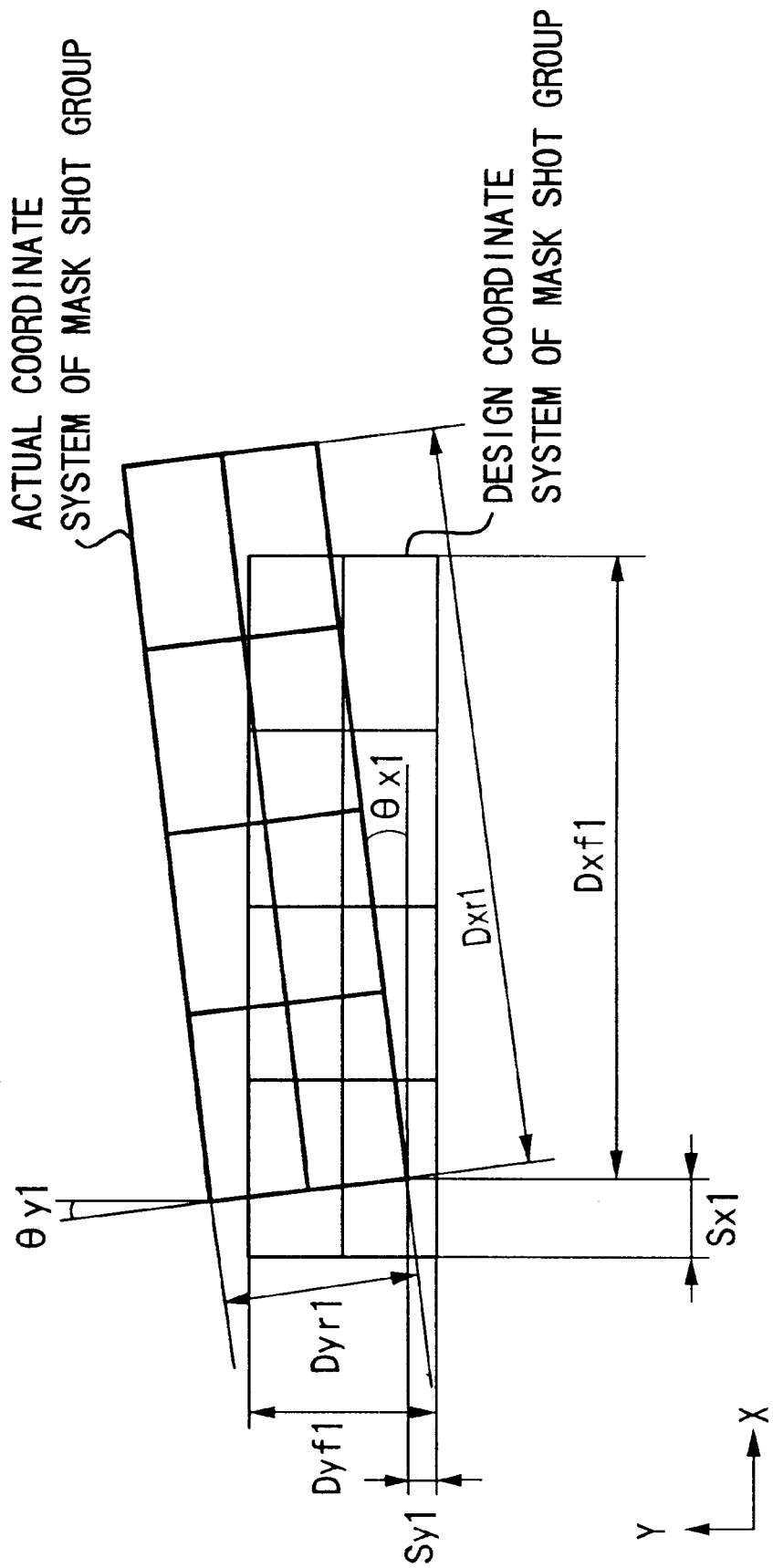
FIG. 16 is a schematic view for explaining shot profiles of mask shot groups in the fourth embodiment.
Figure 17:
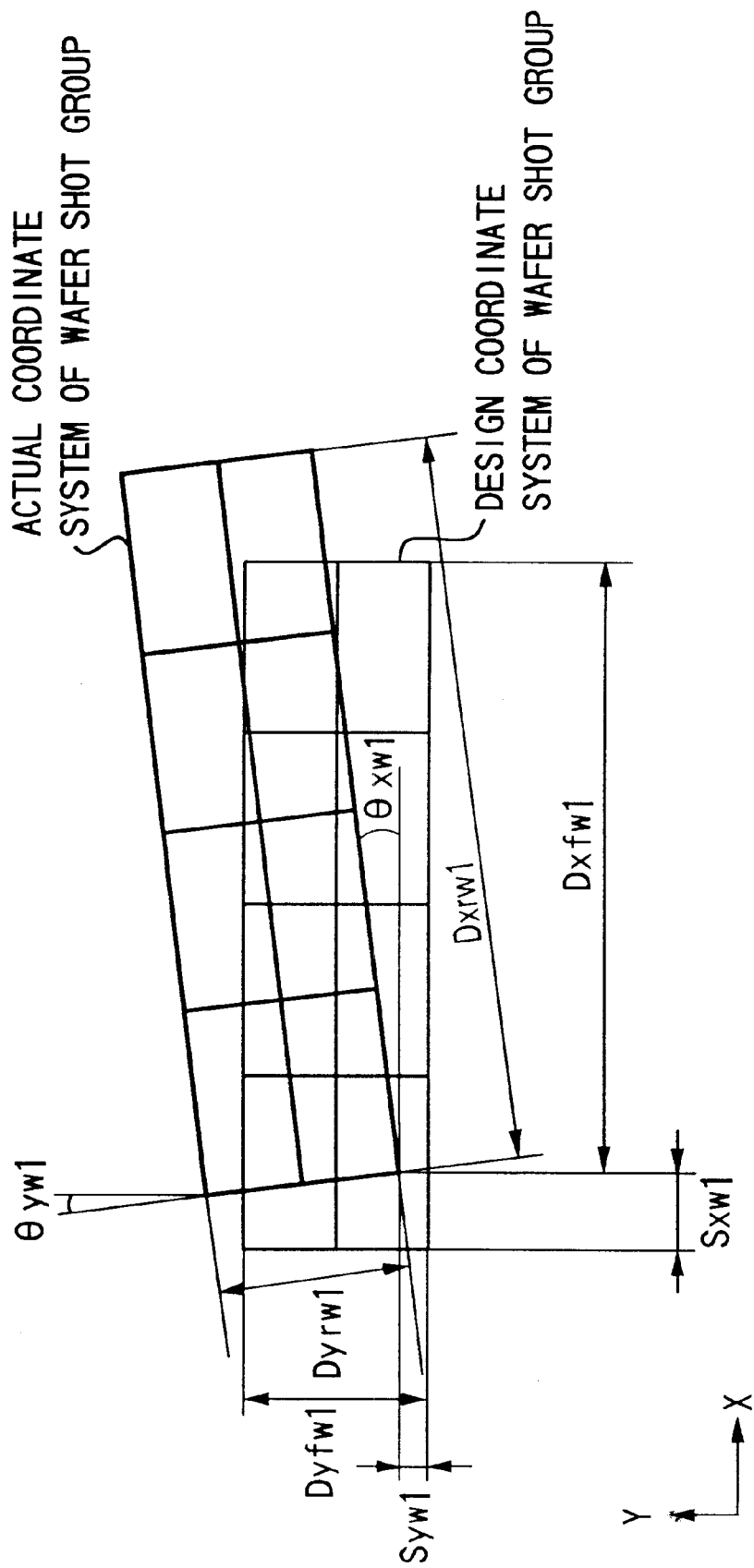
FIG. 17 is a schematic view for explaining shot profiles of wafer shot groups in the fourth embodiment.
Figure 18A:
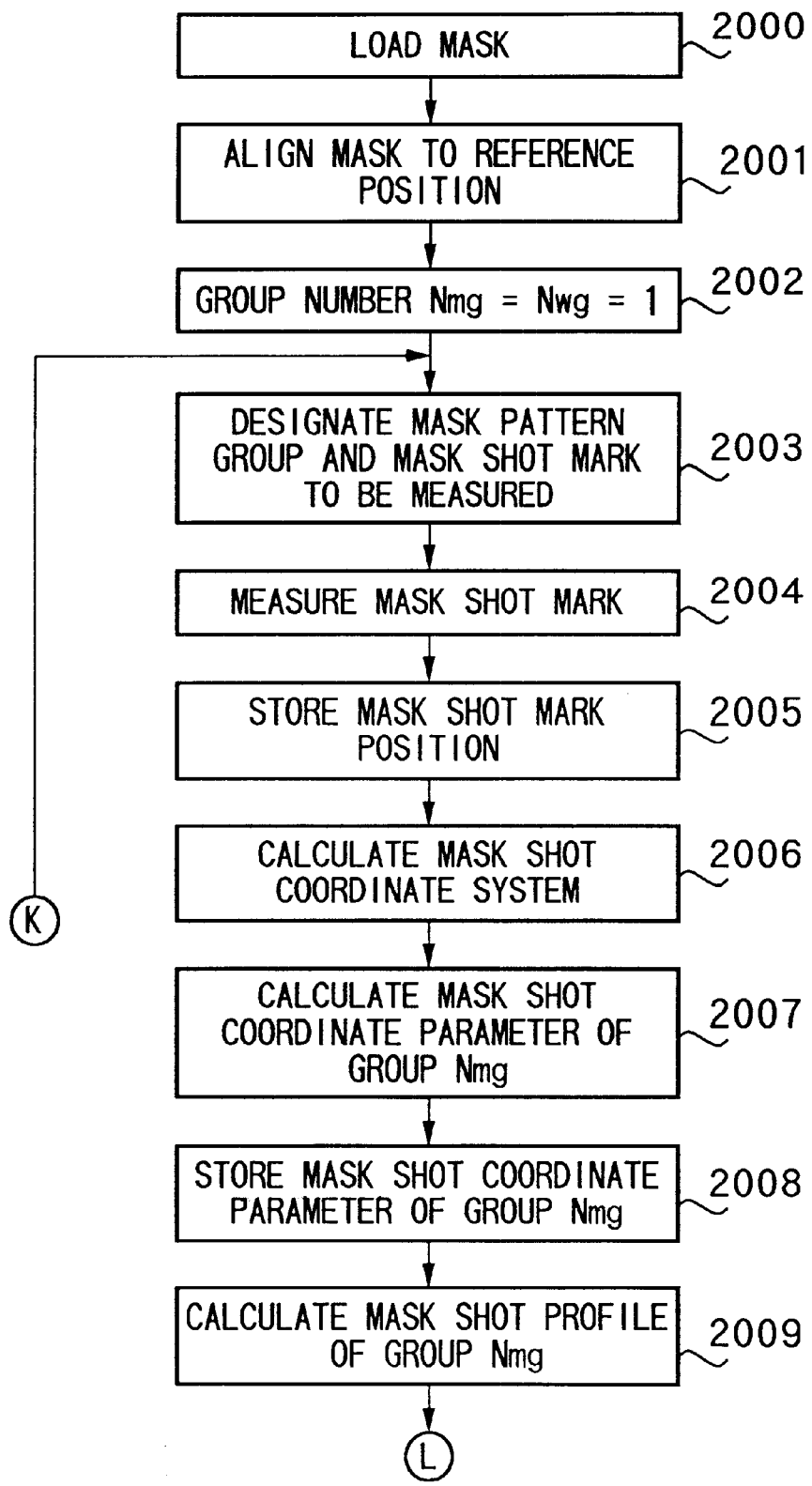
FIGS. 18A and 18B are flow charts for explaining a mask shot transfer method according to the fifth embodiment of the present invention.
Figure 18B:
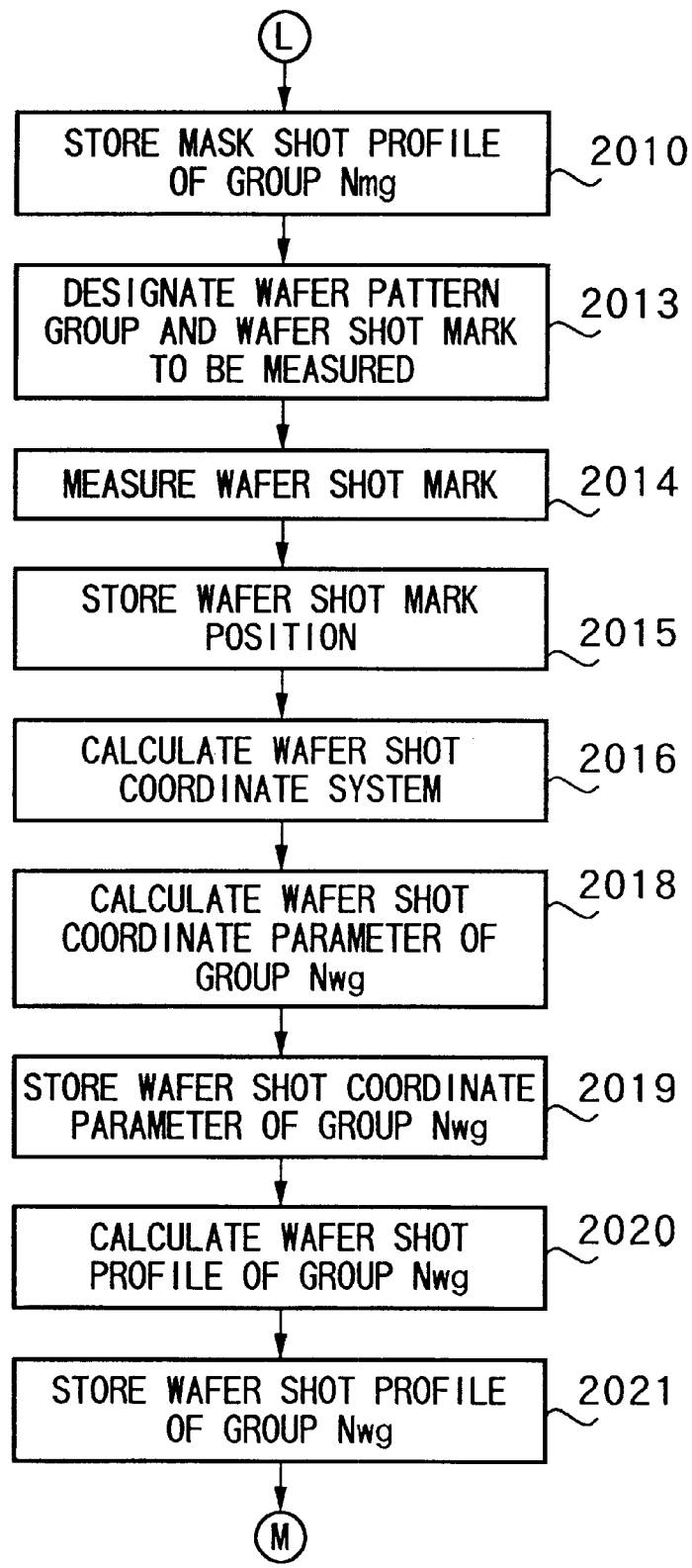
Figure 19:
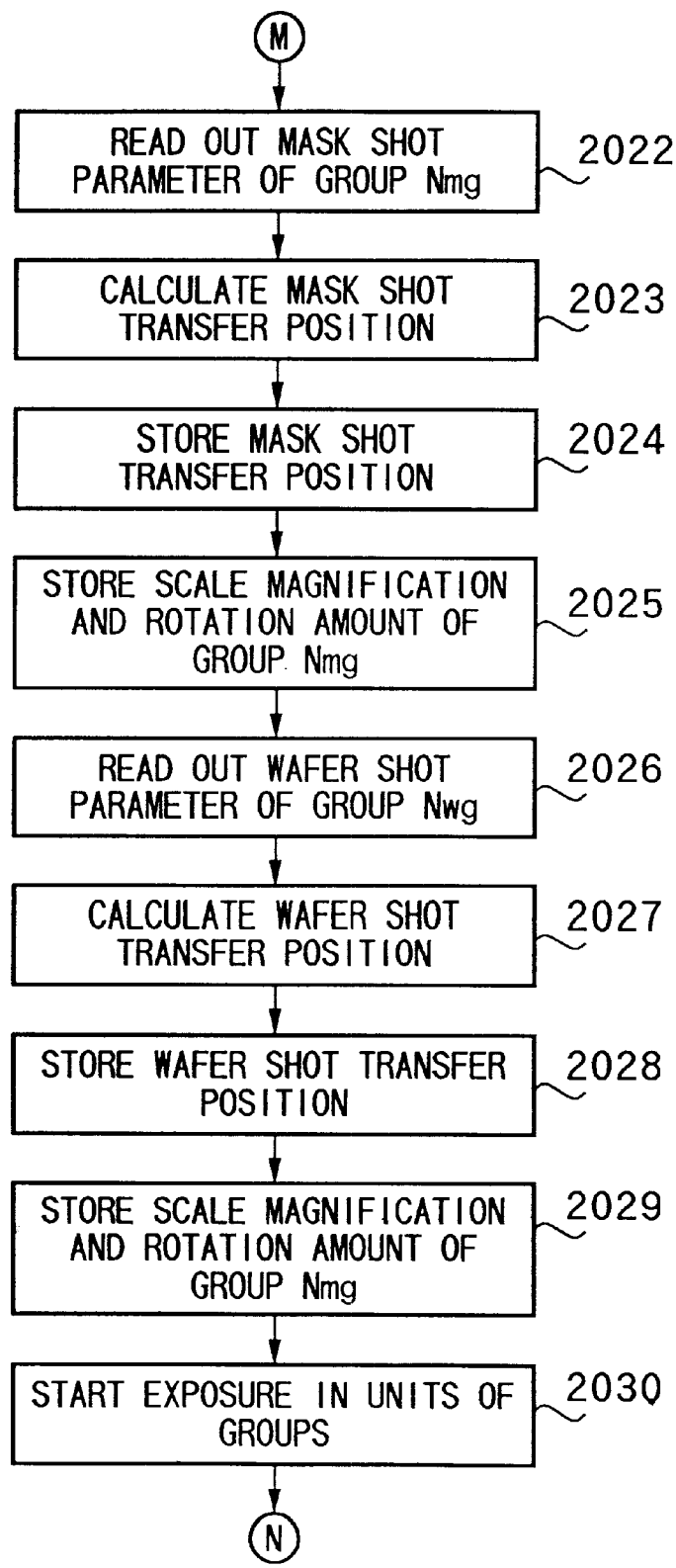
FIG. 19 is a flow chart for explaining a mask shot transfer method according to the fifth embodiment of the present invention.
Figure 20A:
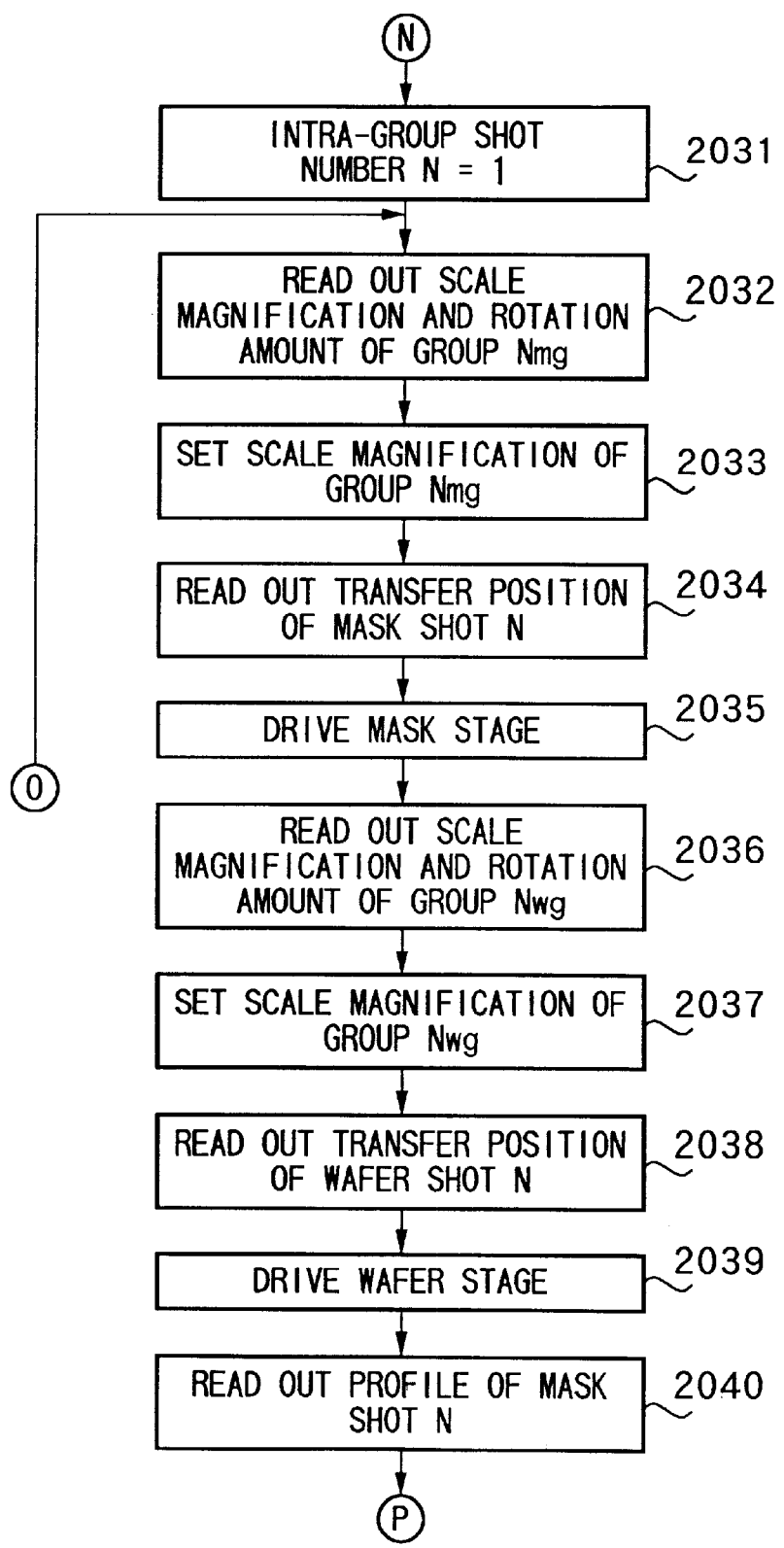
FIGS. 20A and 20B are flow charts for explaining a mask shot transfer method according to the fifth embodiment of the present invention.
Figure 20B:
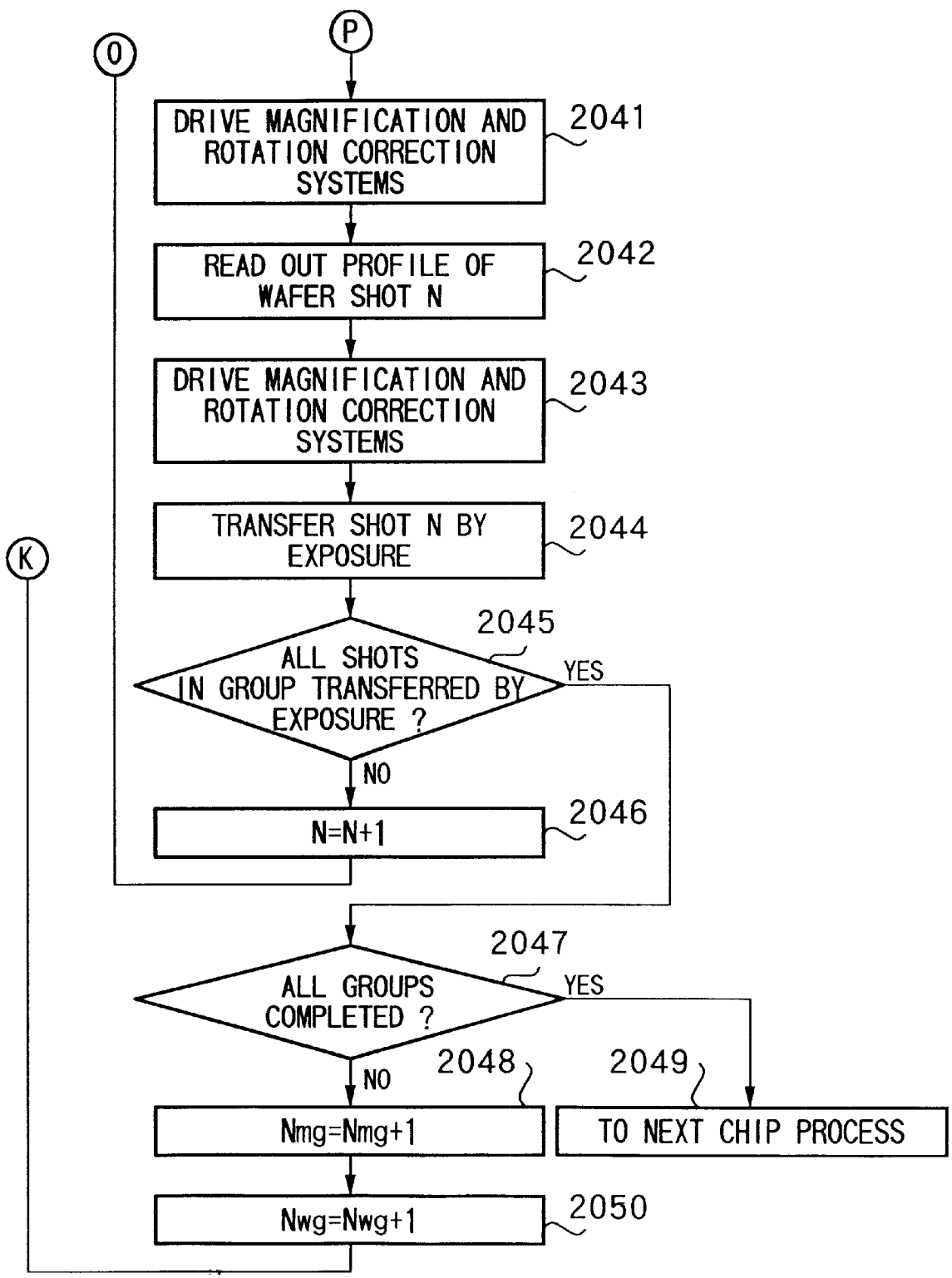

FIGS. 15A and 15B show a state wherein the mask shots 3'a to 3'y and wafer shots 10a to 10y are respectively divided into two groups, FIG. 16 is a schematic view for explaining the shot profiles of a mask shot group, and FIG. 17 is a schematic view for explaining the shot profiles of a wafer shot group.

Grouping of the mask shots on the transfer mask 3' and the wafer shots 10a to 10y of the transfer image 101 on the wafer 10 will be explained first.

In this embodiment, as shown in FIG. 15A, the mask shots are divided into two mask shot pattern groups 3'mg1 and 3'mg2. The mask shot pattern group 3'mg1 is made up of the mask shots 3'a to 3'o, and the mask shot pattern group 3'mg2 is made up of the mask shots 3'p to 3'y.

Similarly, the wafer shots are divided into two wafer shot pattern groups 10wg1 and 10wg2. The wafer shot pattern group 10wg1 is made up of the wafer shots 10a to 10o, and the wafer shot pattern group 10wg2 is made up of the wafer shots 10p to 10y.

Lattices indicated by the mask shot pattern groups 3'mg1 and 3'mg2 and wafer shot pattern groups 10wg1 and 10wg2 represent coordinate systems associated with the corresponding pattern groups.

In this embodiment, the number of groups is two, and the mask shots and wafer shots are similarly grouped. However, upon applying this embodiment, the number of groups and the way the mask shots and wafer shots are grouped are not particularly limited.

After the mask shots and wafer shots are grouped, as described above, the flow charts shown in FIGS. 12A to 14B will be explained in detail below.

Steps 1000 and 1001 are the same as steps 20 and 21 in the third embodiment. That is, the transfer mask 3' is loaded onto the mask stage 6 (step 1000), and the mask stage 6 is driven to align the mask to the reference position (step 1001).

After the transfer mask 3' is located at the reference position, alignment marks used in alignment measurements of the respective mask shots of the transfer mask 3' are designated, and the mask shot pattern groups and the mask shots which belong to these groups are designated (step 1002).

In this example, the alignment marks 3'a1 to 3'a4, 3'c1 to 3'c4, 3'e1 to 3'e4, 3'k1 to 3'k4, 3'm1 to 3'm4, 3'o1 to 3'o4, 3'p1 to 3'p4, 3'r1 to 3'r4, 3't1 to 3't4, 3'u1 to 3'u4, 3'w1 to 3'w4, and 3'y1 to 3'y4 corresponding to the mask shots 3'a, 3'c, 3'e, 3'k, 3'm, 3'o, 3'p, 3'r, 3't, 3'u, 3'w, and 3'y are designated. As has been described above with reference to FIG. 15A, in this example, the mask shot pattern group 3'mg1 consisting of the mask shots 3'a to 3'o and the group 3'mg2 consisting of the mask shots 3'p to 3'y are designated.

Subsequently, the positions of the alignment marks 3'a1 to 3'a4, 3'c1 to 3'c4, 3'e1 to 3'e4, 3'k1 to 3'k4, 3'm1 to 3'm4, 3'o1 to 3'o4, 3'p1 to 3'p4, 3'r1 to 3'r4, 3't1 to 3't4, 3'u1 to 3'u4, 3'w1 to 3'w4, and 3'y1 to 3'y4 corresponding to the mask shots 3'a, 3'c, 3'e, 3'k, 3'm, 3'o, 3'p, 3'r, 3't, 3'u, 3'w, and 3'y designated in step 1002 are measured by the mask alignment system 5 (step 1003), and the measurement results are stored (step 1004).

The positions of the alignment marks 3'a1 to 3'a4, 3'c1 to 3'c4, 3'e1 to 3'e4, 3'k1 to 3'k4, 3'm1 to 3'm4, 3'o1 to 3'o4, 3'p1 to 3'p4, 3'r1 to 3'r4, 3't1 to 3't4, 3'u1 to 3'u4, 3'w1 to 3'w4, and 3'y1 to 3'y4 stored in step 1004 are read out to calculate the actual coordinate system of the mask shots 3'a to 3'y (step 1005).

The subsequent steps 1006 to 1012 are a series of processes for the mask shot pattern groups.

A mask shot pattern group number Nmg is reset to 1 (step 1006). That is, the mask shot pattern group 3'mg1 is designated as the first group to undergo a series of loop processes starting from the next step.

Parameters associated with the coordinate system of the mask shot pattern group indicated by 3'mg1 are calculated (step 1007) and are stored (step 1008). The parameters to be calculated in this step and their calculation method are the same as those in the third embodiment, and the parameters to be calculated include translation (shift) components Sx1 and Sy1 in the x- and y-axis directions, a rotation component θx1 of the overall coordinate system, an orthogonality level component θx1−θy1, an x-magnification (scale magnification) Dxr1/Dxf1, and a y-magnification Dyr1/Dyf1. Note that suffix "1" indicates parameters that pertain to the coordinate system with the mask shot pattern group number Nmg=1.

Furthermore, an average shot magnification Mm1 and average shot rotation amount θm1 in the mask shot group 3'mg1 are calculated (step 1009) and are stored (step 1010). Note that the average values of the profiles are used since not all the shots in the mask shot pattern group are designated in step 1002. Since a series of processes for the mask shot pattern group 3'mg1 have been completed in these steps, the mask shot pattern group number Nmg is incremented by 1 (step 1011), and it is then checked if the processing is complete for all the mask shot pattern groups (step 1012).

If the processing has been completed for all the mask shot pattern groups, the flow advances to the next step; otherwise, the flow returns to step 1007 and the next mask shot pattern group (in this case, the mask shot pattern group 3'mg2) is processed. In this way, the loop of steps 1007 to 1012 repeats itself until the processing is complete for all the mask shot pattern groups.

In the subsequent steps 1013 to 1024, processes equivalent to those in steps 1007 to 1012 associated with the mask shot pattern groups are done for the wafer shot pattern groups.

Initially, alignment marks used in alignment measurements of the respective wafer shots of the transfer image 101 as the 1st layer, i.e., the already transferred pattern, are designated, and the wafer shot pattern groups and the wafer shots that belong to these groups are designated (step 1013). In this example, the alignment marks 10-1, 10-2, 10-5, 10-6, 10-9, 10-10, 10-37, 10-38, 10-13, 10-14, 10-35, 10-36, 10-15, 10-16, 10-33, 10-34, 10-17, 10-18, 10-29, 10-30, 10-25, 10-26, 10-22, and 10-21 corresponding to the wafer shots 10a, 10c, 10e, 10f, 10j, 10k, 10o, 10t, 10u, 10w, and 10y are designated.

As has been described above with the aid of FIG. 17, the wafer shot pattern group 10wg1 consisting of the wafer shots 10a to 10o, and the wafer shot pattern group 10wg2 consisting of the wafer shots 10p to 10y are designated.

Subsequently, the positions of the alignment marks 10-1, 10-2, 10-5, 10-6, 10-9, 10-10, 10-37, 10-38, 10-13, 10-14, 10-35, 10-36, 10-15, 10-16, 10-33, 10-34, 10-17, 10-18, 10-29, 10-30, 10-25, 10-26, 10-22, and 10-21 corresponding to the wafer shots 10a, 10c, 10e, 10f, 10j, 10k, 10o, 10t, 10u, 10w, and 10y designated in step 1013 are measured by the wafer alignment system 14 (step 1014).

After the positions of the alignment marks 10-1, 10-2, 10-5, 10-6, 10-9, 10-10, 10-37, 10-38, 10-13, 10-14, 10-35, 10-36, 10-15, 10-16, 10-33, 10-34, 10-17, 10-18, 10-29, 10-30, 10-25, 10-26, 10-22, and 10-21 corresponding to the wafer shots 10a, 10c, 10e, 10f, 10j, 10k, 10o, 10t, 10u, 10w, and 10y are measured, the measured positions of the alignment marks are stored in units of marks (step 1015).

The positions of the alignment marks 10-1, 10-2, 10-5, 10-6, 10-9, 10-10, 10-37, 10-38, 10-13, 10-14, 10-35, 10-36, 10-15, 10-16, 10-33, 10-34, 10-17, 10-18, 10-29, 10-30, 10-25, 10-26, 10-22, and 10-21 stored in step 1015 are read out to calculate the actual coordinate system of the wafer shots 10a to 107 (step 1016).

The subsequent steps 1017 to 1024 are a series of processes for each wafer shot pattern group.

A wafer shot pattern group number Nwg is reset to 1 (step 1017). That is, the wafer shot pattern group 10wg1 is designated as the first group to undergo a series of processes starting from the next step.

Parameters associated with the coordinate system of the wafer shot pattern group indicated by 10wg1 in FIG. 15B are calculated (step 1018) and are stored (step 1019). The parameters to be calculated in this step and their calculation method are the same as those in the third embodiment, and the parameters to be calculated include translation (shift) components Sxw1 and Syw1 in the x- and y-axis directions, a rotation component θxw1 of the overall coordinate system, an orthogonality level component θxw1−θyw1, an x-magnification (scale magnification) Dxrw1/Dxfw1, and a y-magnification Dyrw1/Dyfw1. Note that suffix "1" indicates parameters that pertain to the coordinate system with the wafer shot pattern group number Nwg=1.

Parameters that represent the relative relationship between the design wafer shot coordinate system, which serves as the reference coordinate system of the apparatus, and the actual wafer shot coordinate system are obtained by comparison. However, since parameters that represent the relative relationship between the design mask shot coordinate system and actual mask shot coordinate system obtained by comparison in association with mask shots are those obtained by comparison with the design coordinate system which serves as the reference coordinate system of the apparatus, parameters may be obtained by comparing the actual mask shot coordinate system and actual wafer shot coordinate system.

Subsequently, an average shot magnification Mmw1 and average shot rotation amount θmw1 in the wafer shot group 10wg1 are calculated (step 1020), and are stored (step 1021). Note that the average values of the profiles are used since not all the shots in the wafer shot pattern group are designated in step 1013. Since a series of processes for the wafer shot pattern group 10wg1 have been completed in these steps, the wafer shot pattern group number Nwg is incremented by 1 (step 1023), and it is checked if the processing is complete for all the wafer shot pattern groups (step 1024).

If the processing has been completed for all the wafer shot pattern groups, the flow advances to the next step; otherwise, the flow returns to step 1018 to process the next wafer shot pattern group (in this case, the wafer shot pattern group 10wg2).

In this fashion, the loop of steps 1018 to 1024 repeats itself until the processing is complete for all the wafer shot pattern groups.

Steps 1025 to 1031 are those of reading out the mask shot parameters in units of mask shot pattern groups, and calculating and storing the transfer positions of the mask shots.

Initially, the mask shot pattern group number Nmg is reset to 1 (step 1025).

The mask shot parameters for the current mask shot pattern group number Nmg, i.e., those for the group 3'mg1 are read out (step 1026), and the transfer positions of the respective mask shots are calculated (step 1027) and are stored (step 1028).

Note that the parameters to be read out and the sequence for calculating the transfer position of each mask shot from these parameters are the same as those in the third embodiment. However, since the scale magnifications Dxr1/Dxf1 and Dyr1/Dyf1 and rotation component θx1 with respect to the mask stage 6 must be corrected in units of mask shot pattern groups, the scale magnifications cannot be immediately set in the mask stage 6 or the θ stage on the mask stage 6 cannot be immediately driven in this step.

For this reason, these scale magnifications Dxr1/Dxf1 and Dyr1/Dyf1 and rotation component θx1 are stored (step 1029).

The mask shot pattern group number Nmg is then incremented by 1 (step 1030), and it is checked if the processing is complete for all the mask shot pattern groups (step 1031).

If the processing has been completed for all the mask shot pattern groups, the flow advances to the next step; otherwise, the flow returns to step 1026 to process the next mask shot pattern group (the mask shot pattern group 3'*mg*2 in this embodiment). In this way, the loop of steps 1026 to 1031 repeats itself until the processing is complete for all the mask shot pattern groups.

In steps 1032 to 1038, processes equivalent to those for the mask shot pattern groups in steps 1025 to 1031 are done for the wafer shot pattern groups.

That is, the wafer shot pattern group number Nwg is reset to 1 (step 1032).

Subsequently, the wafer shot parameters for the current wafer shot pattern group number Nwg, i.e., those for the group 10*wg*1 shown in FIG. 15B, are read out (step 1033), and the positions of the wafer shots are calculated (step 1034) and are stored (step 1035).

Note that the parameters to be read out and the sequence for calculating the transfer position of each mask shot from these parameters are the same as those in the third embodiment. However, like in the mask stage 6 that can neither be set up with scale magnifications nor be driven immediately, since the scale magnifications Dxrw1/Dxfw1 and Dyrw1/Dyfw1 and rotation component θxw1 with respect to the wafer stage 11 must be corrected in units of wafer shot pattern groups, the scale magnifications cannot be immediately set in the wafer stage 11 or the θ stage on the wafer stage 11 cannot be driven in this step.

Hence, these scale magnifications Dxrw1/Dxfw1 and Dyrw1/Dyfw1 and rotation component θxw1 are stored (step 1036).

The mask shot pattern group number Nwg is incremented by 1 (step 1037), and it is checked if the processing is complete for all the wafer shot pattern groups (step 1038).

If the processing has been completed for all the wafer shot pattern groups, the flow advances to the next step; otherwise, the flow returns to step 1033 to process the next wafer shot pattern group (in this case, the wafer shot pattern group 10*wg*2). In this manner, the loop of steps 1033 to 1038 repeats itself until the processing is complete for all the wafer shot pattern groups.

When exposure starts (step 1039), a shot number N is reset to 1 (step 1040), and the control enters the subsequent shot exposure loop. When the number N=1, the mask shot to be transferred is 3'*a*, and the transferred image overlaps the wafer shot 10*a*.

In order to read out and correct the scale magnifications and rotation amounts corresponding to each mask shot pattern group, a mask shot pattern group to which shot N belongs must be designated. For this purpose, the number of the mask shot pattern group to which shot N belongs is substituted in the group number Nmg (step 1041).

The scale magnifications DxrNmg/DxfNmg and DyrNmg/DyfNmg and rotation component θxNmg stored in step 1029 are read out (step 1042). In this case, since shot 1 belongs to the mask shot pattern group 3'*mg*1, the scale magnifications Dxr1/Dxf1 and Dyr1/Dyf1 and rotation component θx1 are read out.

Next, the scale magnifications Dxr1/Dxf1 and Dyr1/Dyf1 are set in the mask stage 6 (step 1043), and the transfer position of mask shot N is read out (step 1044) to drive the mask stage 6. At the same time, the θ stage on the mask stage 6 is driven on the basis of the rotation amount θx1 read out in step 1042, thus correcting the rotation component of the mask shot pattern group 3'*mg*1 (step 1045).

Subsequently, processes equivalent to those for the mask shot pattern group are done for the wafer shot pattern group.

In order to designate a wafer shot pattern group to which shot N belongs, the number of the wafer shot pattern group to which shot N belongs is substituted in the group number Nwg (step 1046).

The scale magnifications DxrwNwg/DxfwNwg and DyrwNwg/DyfwNwg and rotation component θxwNwg stored in step 1036 are read out (step 1047). In this case, since shot 1 belongs to the wafer shot pattern group 10*wg*1, the scale magnifications Dxrw1/Dxfw1 and Dyrw1/Dyfw1 and rotation component θxw1 are read out.

The scale magnifications Dxrw1/Dxfw1 and Dyrw1/Dyfw1 are set in the wafer stage 11 (step 1048), and the transfer position of wafer shot N are read out (step 1049) to drive the wafer stage 11, thus moving shot N to its transfer position. At the same time, the θ stage on the wafer stage 11 is driven on the basis of the rotation amount θxw1 read out in step 1047 to correct the rotation component of the wafer shot pattern group 10*wg*1 (step 1050).

The shot profiles of mask shot N stored in step 1010 are read out (step 1051), the shot magnification is corrected by driving the magnification correction system 8, and the shot rotation amount is corrected by driving the rotation correction system 9 (step 1052).

Since the current shot number is 1, the average shot magnification Mm1 and average shot rotation amount θm1 corresponding to the mask shot pattern group 3'*mg*1 are read out, and the magnification correction system 8 and rotation correction system 9 are driven based on these data.

Likewise, the shot profiles of wafer shot N stored in step 1021 are read out (step 1053), the shot magnification is corrected by driving the magnification correction system 8, and the shot rotation amount is corrected by driving the rotation correction system 9 (step 1054).

More specifically, the average shot magnification Mmw1 and average shot rotation amount θmw1 corresponding to the wafer shot pattern group 10*wg*1 are read out, and the magnification correction system 8 and rotation correction system 9 are driven based on these data.

On the other hand, if all the shots are designated in step 1002 or 1013, the shot magnifications and shot rotation amount in units of shots are read out in steps 1051 and 1052 or steps 1053 and 1054, and the magnification correction system 8 and rotation correction system 9 are driven based on these data.

The beam control system 2 is driven to irradiate the mask shot 3'*a* with the charged beam 12, the image of the mask shot 3'*a* begins to be transferred to overlap the wafer shot 10*a* on the wafer 10, and relative scan exposure is done by moving the mask stage 6 and wafer stage 11 relative to each other (step 1055), thus completing processing for one shot.

After that, if it is determined that exposure has been completed for all the shots (step 1056), the flow branches to the next chip process (step 1058); otherwise, the shot number N is incremented by 1 and the flow returns to step 1041. In this way, the loop of steps 1041 to 1057 repeats itself in correspondence with the number of shots.

As described above, the mask shots and wafer shots are classified into a plurality of shot groups, e.g., the mask shots are classified into the mask shot pattern groups 3'*mg*1 and 3'*mg*2, and the wafer shots are classified into the wafer shot pattern groups 10*wg*1 and 10*wg*2, and actual and design coordinate systems are matched in units of groups using the parameters that represent the relative relationship therebetween. Hence, since the actual coordinate system can be corrected in units of small regions, the joint precision can be improved.

The major advantage of this embodiment is accurate correction of the actual coordinate system in such small regions. When regions that require higher joint precision are extracted from a transfer pattern on the transfer mask on the basis of information of the transfer pattern, and partial transfer patterns in these regions are defined as pattern groups, the advantage of this embodiment can be fully exploited.

The information of the transfer pattern of interest is a group of circuit patterns such as line widths, pattern densities, contact holes, memory cells, and the like, and may be different in units of layers. In this manner, higher-precision joint can be attained.

Fifth Embodiment

In the fourth embodiment, measurements of alignment marks and calculations of their positions are made by batch processing, and the processes of the coordinate systems and shot profiles are executed in units of groups.

In this way, a sufficient effect can be obtained upon dividing a shot matrix into a plurality of groups. When another time problem has occurred, i.e., when the coordinate system of a given group has changed during exposure of a shot of another group, measurements of alignment marks, calculations of coordinate parameters, calculations of shot profiles, and exposure of a shot are continuously executed in units of groups, as will be described in this embodiment.

FIGS. 18A to 20B are flow charts of this embodiment.

Steps in FIGS. 18A to 20B are substantially the same as those in the fourth embodiment. Since the flow of this embodiment is substantially the same as that of the fourth embodiment, except for the order of processes, and the conditions for grouping (i.e., a limitation that makes classification of the mask shot pattern groups common to that of the wafer shot pattern groups), a detailed description thereof will be omitted.

This embodiment is particularly effective when the number of shots is large, e.g., when shots have a 10×20 matrix and the number of shots is as large as 200, and the environment associated with the transfer mask 3, wafer 10, and the like shown in FIG. 21 has changed and influenced their coordinate systems during exposure of first several tens of shots.

In the first and second embodiments, the processing for the 1st layer has been explained, and in the third to fifth embodiments, the processing for the 2nd and subsequent layers has been explained. Normally, by applying the first or second embodiment and one of the third to fifth embodiments, transfer patterns of every layers can be obtained. However, the present invention may be applied to the 2nd and subsequent layers alone. For example, assuming mix and match with an optical exposure apparatus, such cases include when the entire chip of the 1st layer is exposed by batch processing by the optical exposure apparatus, or alignment marks in the present invention are not present on that 1st layer.

Even such case can be apparently processed as the transfer processes of the 1st layer mentioned above using the first or second embodiment. More specifically, upon chip alignment on the wafer 10 side, the position of each chip is detected using a method adopted in a conventional exposure apparatus, e.g., global alignment, and the first or second embodiment of the present invention can be applied to that position, in other words, a chip matrix coordinate system.

As can be seen from the aforementioned first to fifth embodiments, corrections for mask and wafer shots are respectively executed by the mask stage 6 and wafer stage 11. However, since the transfer mask 3 and wafer 10 have a given relative relationship determined by the transfer system therebetween, the mask stage 6 and wafer stage 11 can share components to be corrected. For example, of the components to be corrected, the shift components (x- and y-components) may be corrected by the wafer stage 11 side, and the rotation component may be corrected by the mask stage 6 side. Such components to be shared can be selected depending on the functions, performance, drive precision, and the like of the respective stages, thus further improving shot joint precision.

Since a pattern is transferred by correcting the relative relationship between each mask shot and the transfer medium, the present invention can be applied to all transfer schemes that have a relative relationship between them, e.g., an equal-magnification projection transfer scheme, reduction projection transfer scheme, proximity transfer scheme, contact transfer scheme, and the like.

In the first to fifth embodiments, the present invention is applied to a so-called scanner that uses a scan exposure scheme as a shot exposure scheme. Also, the present invention can be applied to a so-called stepper of the step-and-repeat scheme that uses a still batch transfer scheme as a shot exposure scheme.

As mentioned above, according to one aspect of the present invention, a transfer pattern on a transfer mask is divided into a plurality of partial transfer patterns, and alignment marks are formed around these partial transfer patterns. Using these alignment marks and those transferred onto a transfer substrate, parameters that represent the relative relationship between the coordinate system of the partial transfer patterns on the transfer mask, and the coordinate system of a transfer medium are obtained, and the two coordinate systems are matched based on these parameters, thus transferring a pattern with high throughput while improving joint precision between adjacent patterns. In this way, devices with higher precision than the conventional method can be manufactured within a shorter period of time.

Sixth Embodiment

A transfer method of this embodiment will be explained below taking as an example a process for printing a pattern on a transfer mask 3 as a so-called 1st mask shown in FIG. 25 onto a wafer 10.

Note that the transfer mask used in the following embodiments can be applied to the aforementioned embodiments.

Figure 25:
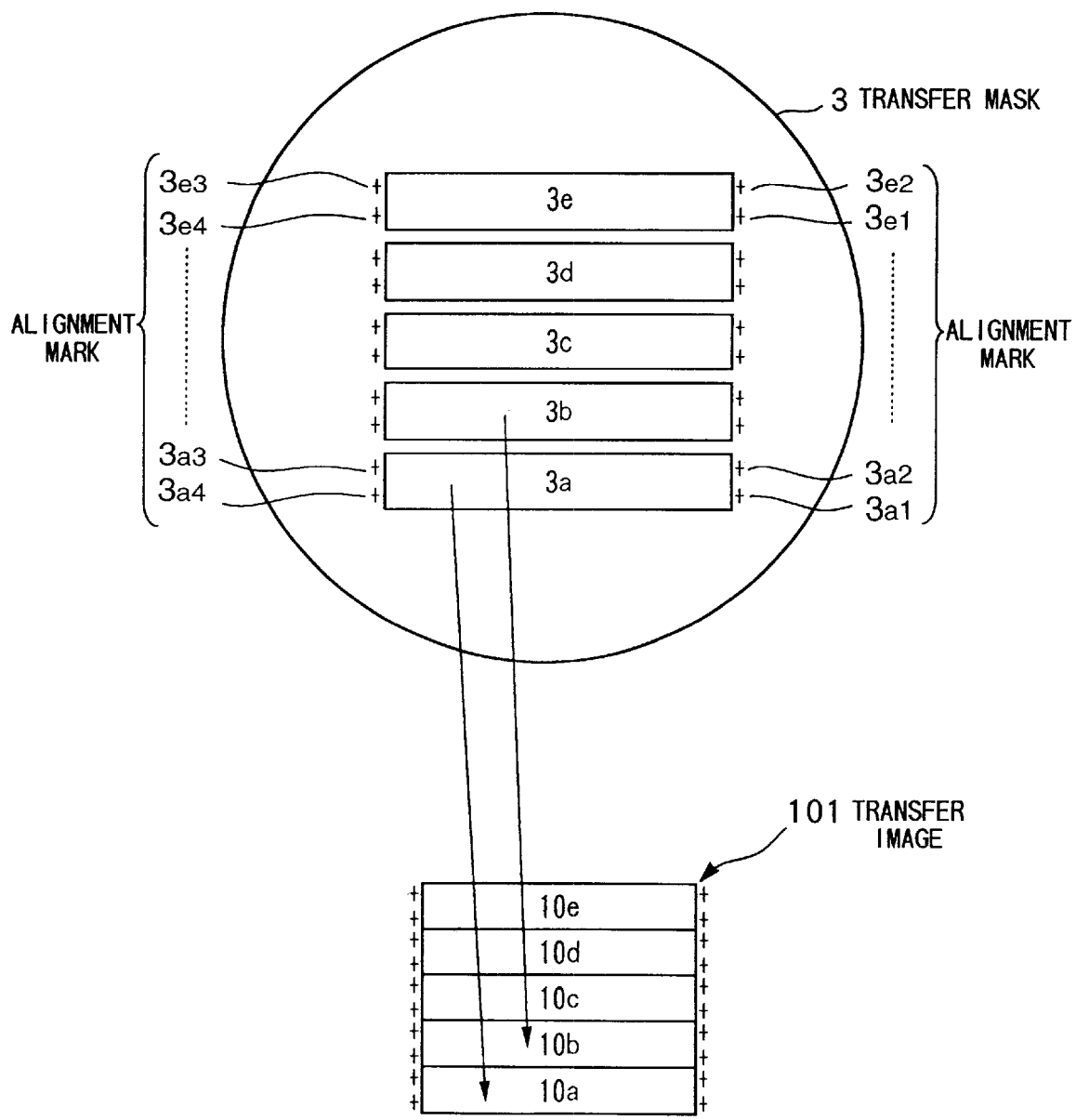
FIG. 25 is a schematic view for explaining mask stripes and wafer stripes in the sixth embodiment.

FIG. 25 shows the transfer mask 3, and a transfer image 101 obtained by printing mask stripes 3*a* to 3*e* as partial transfer patterns on the transfer mask 3 onto the wafer 10. The mask stripes 3*a* to 3*e* are obtained by dividing the transfer image 101 into a plurality of stripes. Alignment marks 3a1 to 3e4 as marks for defining the positions of the mask stripes 3a to 3e on the transfer mask are placed on the two sides of the mask stripes 3a to 3e on the transfer mask 3. For example, the position of the mask stripe 3a is defined by the alignment marks 3a1 to 3a4. These mask stripes 3a to 3e on the transfer mask 3 are transferred onto the wafer 10 without any gaps: the stripe 3a is transferred onto a wafer stripe 10a as a stripe on the wafer 10, the stripe 3b is transferred onto a stripe 10b, and so forth, thus obtaining a desired transfer image 101. In this case, the alignment marks 3a1 to 3e4 of the mask stripes 3a to 3e are also transferred onto the wafer 10, and are used in alignment for the 2nd and subsequent layers, as in embodiments to be described later.

Figure 24:
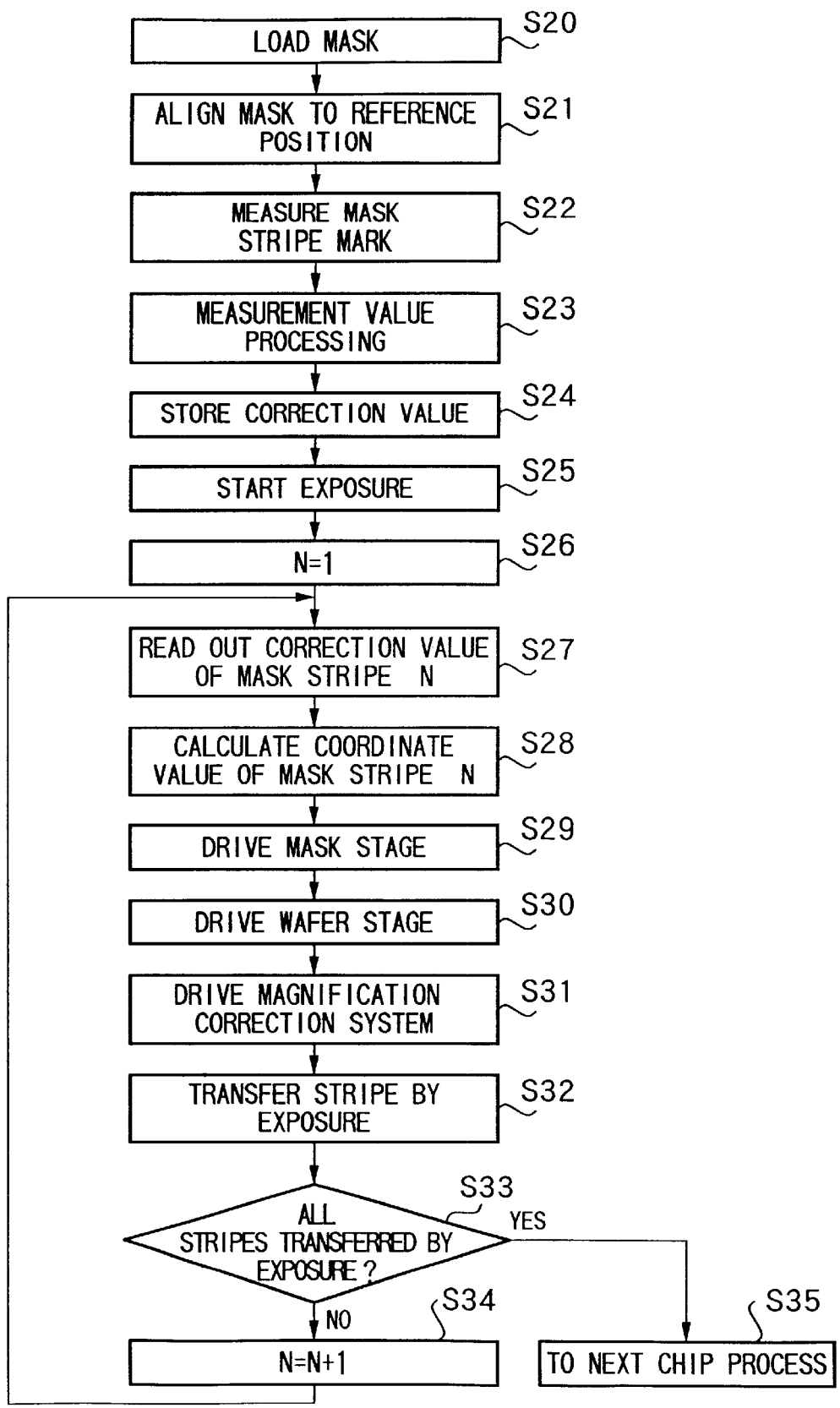
FIG. 24 is a flow chart for explaining a mask stripe transfer method according to the sixth embodiment of the present invention.

FIG. 24 is a flow chart showing the aforementioned process in detail, and a basic flow of the present invention. Note that the wafer 10 has already been loaded into the apparatus.

The transfer mask 3 is loaded onto a mask stage 6 (step S20), its position is measured by a mask alignment system 5, and the mask stage 6 is driven to align the mask to a reference position (step S21). The reference position at that time is a reference axis of a transfer beam 12 or another apparatus reference position.

After the transfer mask 3 is located at the reference position, the positions of the alignment marks 3a1 to 3e4 corresponding to the mask stripes 3a to 3e on the transfer mask 3 are measured by the mask alignment system 5 (step S22). More specifically, in the mask stripe 3a, the positions of the alignment marks 3a1, 3a2, 3a3, and 3a4 are measured. Note that the measurement method uses batch measurement that measures the positions of the alignment marks 3a1 to 3e4 of all the mask stripes 3a to 3e by batch processing.

After the positions of the alignment marks 3a1 to 3e4 of the mask stripes 3a to 3e are measured, deviations between the positions, angles, sizes, and the like of the mask stripes 3a to 3e and their design positions, angles, sizes, and the like are obtained on the basis of the measurement values, and measurement value processing for obtaining correction values that are used for correcting these deviations is done (step S23). The correction values obtained in the measurement value processing are stored (step S24) as they are used in the subsequent exposure process.

When exposure starts (step S25), a mask stripe number N is reset to 1 (step S26), and the controls enters the subsequent stripe exposure loop. When the mask stripe number N=1, the mask stripe to be exposed is the mask stripe 3a. At the beginning of this loop, the correction values for the first mask stripe 3a, which are stored in step S24, are read out (step S27). The correction values read out at that time are x- and y-components, a rotation component, magnifications, and the like as two-dimensional shift amounts of the mask stripe position. The destination coordinate position of the mask stripe 3a is calculated based on the correction values (step S28), and the mask stage 6 having x-, y-, and θ-axes is driven to move the mask stripe 3a to the corrected coordinate position (step S29). Simultaneously with this operation, a wafer stage 11 is driven to move the wafer 10 to a position where the first mask stripe 3a is to be transferred (step S30). Furthermore, at the same time, in order to correct the magnification components of the correction values read out in step S27, a magnification correction system 8 is driven so that the transfer pattern of the mask stripe 3a has a desired size (step S31). After these steps, exposure for this stripe is ready.

A beam control system 2 is driven to irradiate the mask stripe 3a with a transfer beam 12, thus transferring the mask stripe 3a as the wafer stripe 10a on the wafer 10 (step S32). Upon completion of exposure for this stripe, it is checked if exposure is complete for all the stripes (step S33). If exposure has not been completed for all the stripes, and the next stripe is to be exposed, the mask stripe number N is incremented by 1 (step S34), and the flow returns to step S27. This loop of steps S27 to S34 repeats itself to similarly process the mask stripes 3b to 3e. Upon completion of the processing for all the mask stripes 3a to 3e, the control leaves this loop and advances to the next chip process (step S35). In order to transfer a plurality of chips onto the wafer 10, steps S26 to S34 in that flow can be repeated in correspondence with the number of chips.

As mentioned above, since the relative positions between the design and actual positions of the alignment marks 3a1 to 3e4 are corrected by batch processing and partial transfer patterns are transferred in turn on the basis of the corrected positions, the transfer image 101 with high joint precision of the stripes can be obtained.

Seventh Embodiment

Figure 26:
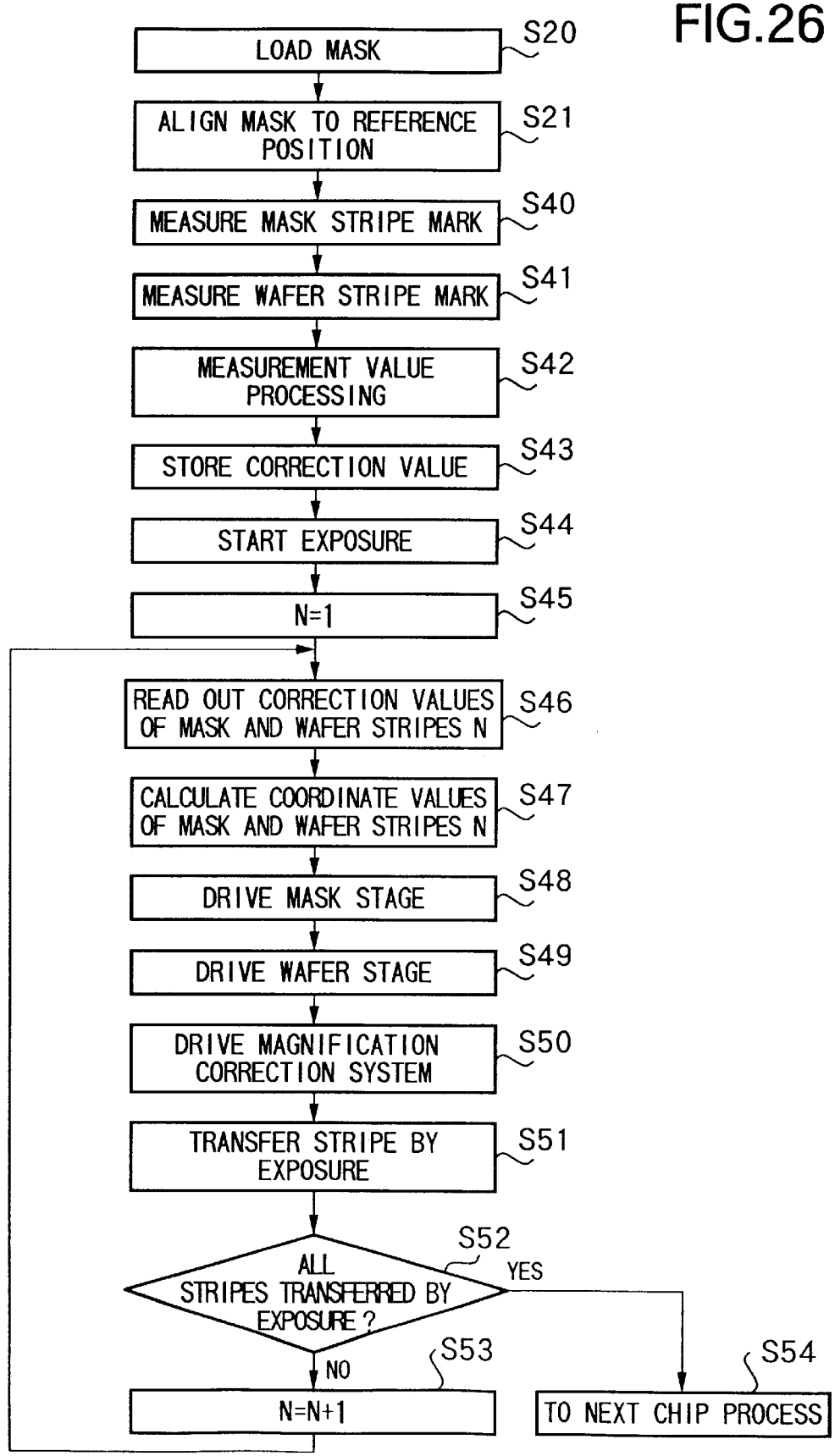
FIG. 26 is a flow chart for explaining a mask stripe transfer method according to the seventh embodiment of the present invention.
Figure 27A:
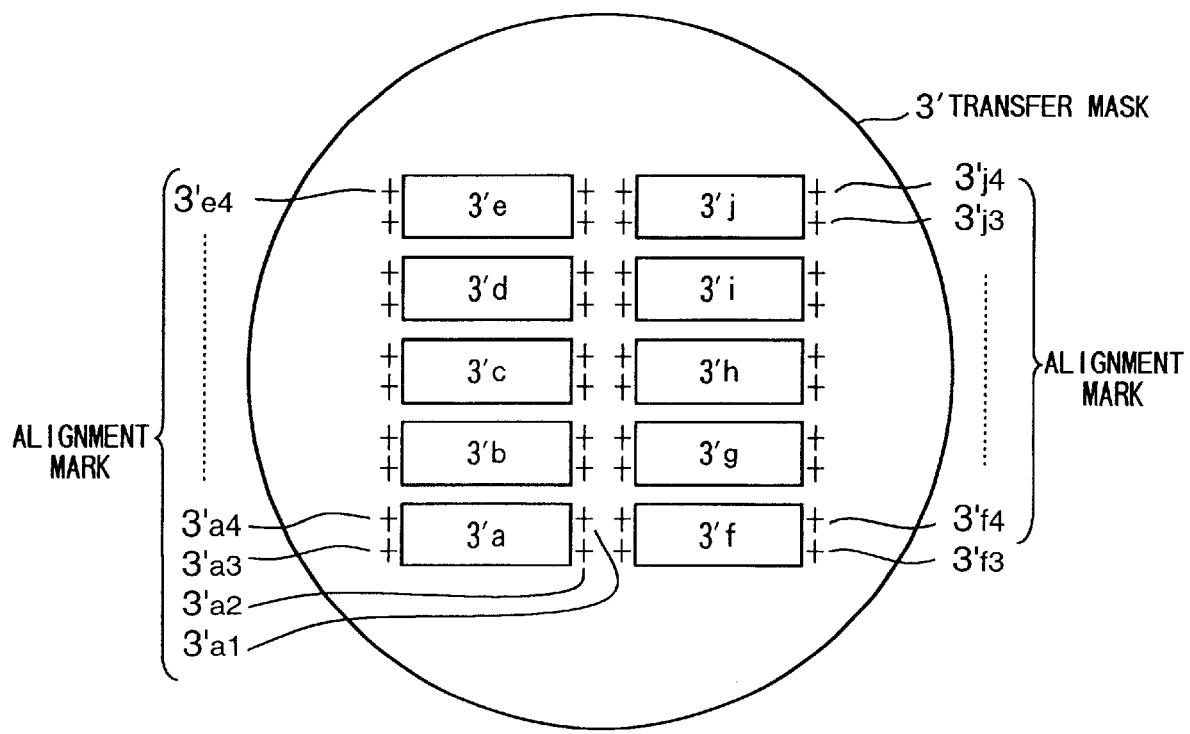
FIGS. 27A and 27B are schematic views for explaining mask stripes and wafer stripes in the seventh and eighth embodiments.
Figure 27B:
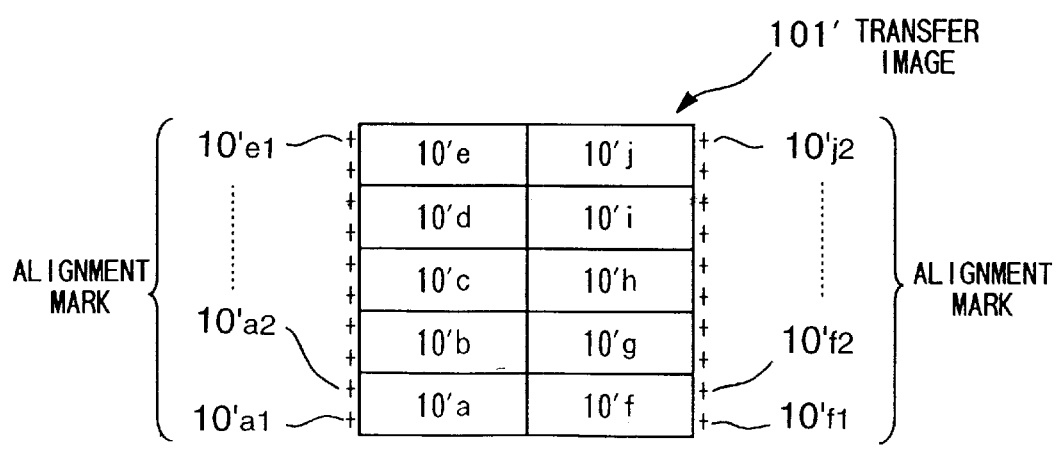

A transfer method for the 2nd and subsequent layers will be explained below using a stripe layout shown in FIGS. 27A and 27B, and the flow chart shown in FIG. 26. Note that the 2nd layer indicates a transfer image 101' to be transferred to overlap the transfer image 101 as the 1st layer, which has already been transferred onto the wafer 10, as has been described in the sixth embodiment. FIGS. 27A and 27B respectively show a transfer mask 3' having mask stripes 3'a to 3'j obtained by further vertically dividing the mask stripes 3a to 3e shown in FIG. 25, and the transfer image 101' obtained by exposing the mask stripes 3'a to 3'j on the transfer mask 3' onto the wafer 10. The mask stripes 3'a to 3'j are obtained by dividing the transfer images 101'. Alignment marks 3'a1 to 3'j4 are formed on the two sides of the mask stripes 3'a to 3'j of the transfer mask 3. On the wafer 10, alignment marks 10'a1 to 10'j2 have already been transferred in the previous process.

In this embodiment, a process for measuring the positions of the alignment marks 3'a1 to 3'j4 and 10'a1 to 10'j2 of the mask stripes 3'a to 3'j and wafer stripes 1'a to 10'j uses batch measurement.

Steps S20 and S21 are the same as those in the sixth embodiment. Then, the positions of the alignment marks 3'a1 to 3'j4 of the mask stripes 3'a to 3'j on the transfer mask 3' are measured by the m ask alignment system 5 (step S40). As in the sixth embodiment, as for the mask stripe 3'a, the positions of the alignment marks 3'a1, 3'a2, 3'a3, and 3'a4 are measured.

Upon completion of measurements of the positions of the alignment marks 3'a1 to 3'j4 of all the mask stripes 3'a to 3'j, the positions of the wafer alignment marks 10'a1 to 10'j2 of the wafer stripes 10'a to 10'j are then measured (step S41). Note that the wafer stripes 10'a to 10'j have the alignment marks 10'a1 to 10'j2 on only transferred sides. That is, the wafer stripe 10a has only the alignment marks 10'a1 and 10'a2.

Subsequently, the measurement value processing is executed (step S42). In this processing, processing similar to that in the sixth embodiment is executed for both the mask stripes 3'a to 3'j and wafer stripes 10'a to 10'j. With this processing, correction values of shift, rotation, and magnification components of the mask stripes 3'a to 3'j and wafer stripes 10'a to 10'j are obtained. The correction values obtained in step S42 are stored (step S43) since they are used in the subsequent exposure process.

When exposure starts (step S44), a stripe number N is reset to 1 (step S45), and the control enters the subsequent stripe exposure loop. When the mask stripe number N=1, the mask stripe to be exposed is the mask stripe 3'a. Then, as in the sixth embodiment, the correction values of shift, rotation, and magnification components for both the mask stripes 3'a to 3'j and wafer stripes 10'a to 10'j are read out (step S46). Furthermore, the coordinate positions of the mask stripes 3'a to 3'j and wafer stripes 10'a to 10'j are calculated on the basis of the correction values stored in step S43 (step S47). After that, the mask stage 6 having x-, y-, and θ-axes and the wafer stage 11 having x-, y-, and θ-axes are driven based on the calculated coordinate positions (steps S48 and S49), thus moving the mask stripes 3'a to 3'j and wafer stripes 10'a to 10'j to the corrected coordinate positions. At the same time, in order to correct the magnification components of the correction values read out in step S46, the magnification correction system 8 is driven so that the transfer pattern of the mask stripe 3'a matches the size of the wafer stripe 10'a (step S50). After these steps, exposure for this stripe is ready, and is executed (step S51).

After that, as in the sixth embodiment, it is checked if exposure is complete for all the mask stripes 3'a to 3'j (step S52). If exposure has not been completed yet for all the mask stripes 3'a to 3'j and the next stripe is to be exposed, the mask stripe number N is incremented by 1 (step S53), and the flow returns to step S46. The loop of steps S46 to S53 repeats itself to similarly process the mask stripes 3'b to 3'j. Upon completion of the processing for all the mask stripes 3'a to 3'j, the control exits this loop and advances to the next chip process (step S54).

As described above, since the relative positions of the alignment marks 3'a1 to 3'j4 of the mask stripes 3'a to 3'j and the alignment marks 10'a1 to 10'j2 of the wafer stripes 10'a to 10'j are corrected by batch processing, and partial transfer patterns are transferred in turn based on the corrected positions, the transfer image 101' with high joint precision of the stripes can be obtained.

Eighth Embodiment

The seventh embodiment uses batch measurement, but this embodiment uses the stripe-by-stripe scheme that corrects in each stripe exposure process.

The eighth embodiment of the present invention will be described below using the stripe layout shown in FIGS. 27A and 27B, and the flow chart shown in FIG. 28.

Figure 28:
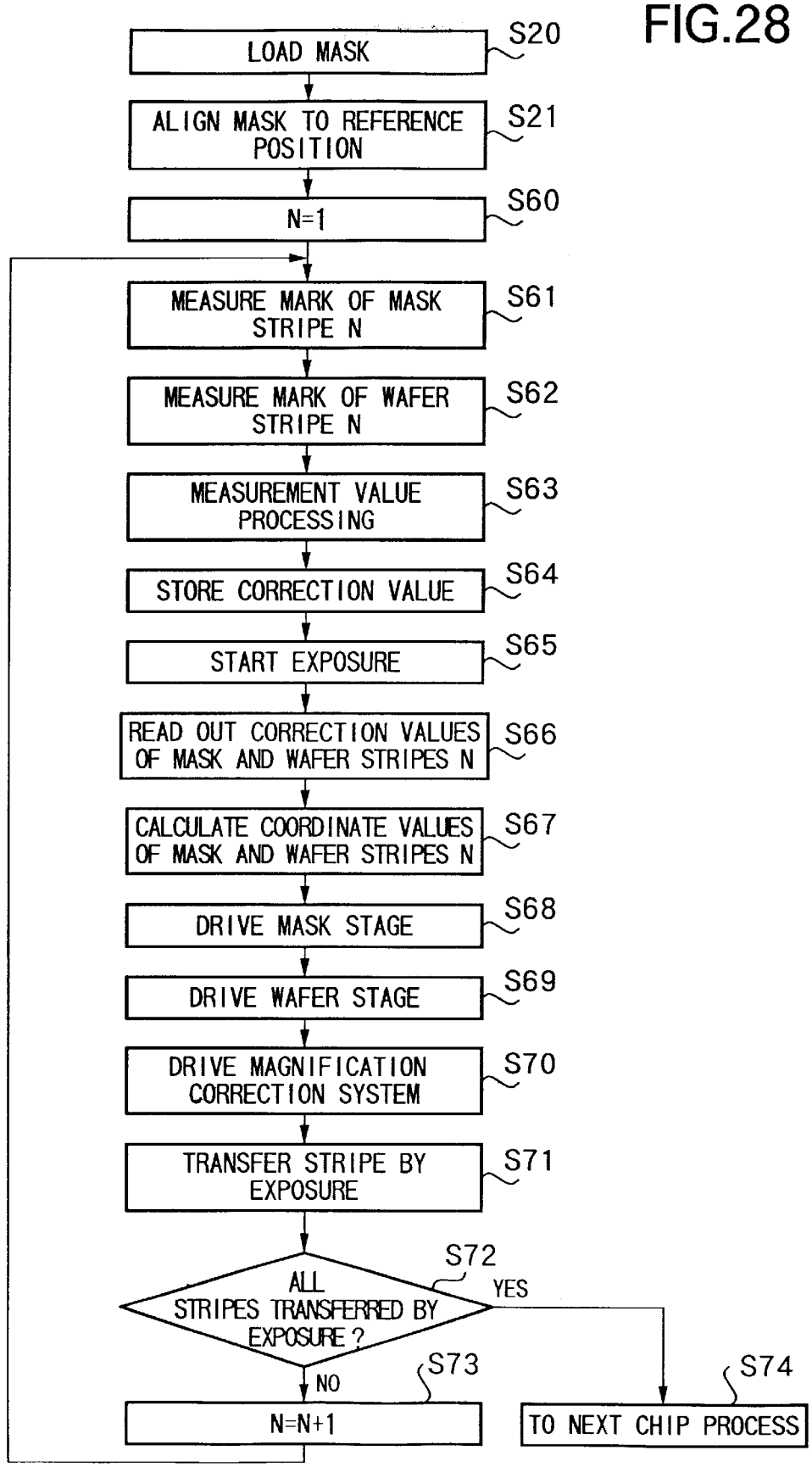
FIG. 28 is a flow chart for explaining a mask stripe transfer method according to the eighth embodiment of the present invention.

Referring to FIG. 28, steps S20 and S21 are the same as those in the aforementioned embodiments. Then, a stripe number N is reset to 1 (step S60). When the mask stripe number N=1, the mask stripe used in exposure is the mask stripe 3'a. In the stripe-by-stripe method, a series of loop processes start from the next step. At the beginning of the loop, the positions of the alignment marks 3'a1 to 3'a4 of the mask stripe 3'a are measured (step S61). Similarly, the positions of the alignment marks 10'a1 and 10'a2 of the wafer stripe 10'a are measured (step S62). The wafer stripe 10'a has only two alignment marks 10'a1 and 10'a2, as has been explained in the seventh embodiment. Correction values for shift, rotation, and magnification components for the mask stripe 3'a and wafer stripe 10'a are obtained (step S63), and are stored (step S64). When the control enters the exposure process (step S65), the correction values of the mask stripe 3'a and wafer stripe 10'a are read out (step S66), and their coordinate values are calculated (step S67). The following processing is the same as that in the seventh embodiment described above. That is, the mask stage 6 having x-, y-, and θ-axes is driven (step S68) and, likewise, the wafer stage 11 having x-, y-, and θ-axes is driven (step S69), thus moving the mask stripe 3'a and wafer stripe 10'a to their corrected coordinate positions. At the same time, in order to correct the magnification components of the correction values read out in step S66, the magnification correction system 8 is driven so that the transfer pattern of the mask stripe 3'a matches the size of the wafer stripe 10'a (step S70). After exposure of the stripe starts (step S71), as in the sixth and seventh embodiments, it is checked if exposure is complete for all the mask stripes 3'a to 3'j (step S72) If exposure has not been completed yet for all the mask stripes 3'a to 3'j and the next stripe is to be exposed, the mask stripe number N is incremented by 1 (step S73), and the flow returns to step S61. The loop of steps S61 to S73 repeats itself to similarly process the mask stripes 3'b to 3'j. Upon completion of the processing for all the mask stripes 3'a to 3'j, the control exits this loop, and advances to the next chip process (step S74).

As described above, since the relative positions of the alignment marks 3'a1 to 3'j4 of the mask stripes 3'a to 3'j and the alignment marks 10'a 1 to 10'j2 of the wafer stripes 1'a to 10'j are corrected and transferred in turn in units of stripes, the transfer image 101' with high joint precision of the stripes can be obtained.

Ninth Embodiment

In this embodiment, the global scheme is used in measurements and processing. This scheme is effective for a layout shown in FIGS. 30A and 30B. More specifically, on a transfer mask 3", mask shots (partial transfer patterns) 3"a to 3"t, which are divided to be smaller than those in the seventh or eighth embodiment described above, are formed in a matrix. The mask shots 3"a to 3"t are obtained by dividing a transfer image 101" into a plurality of shots.

Figure 30A:
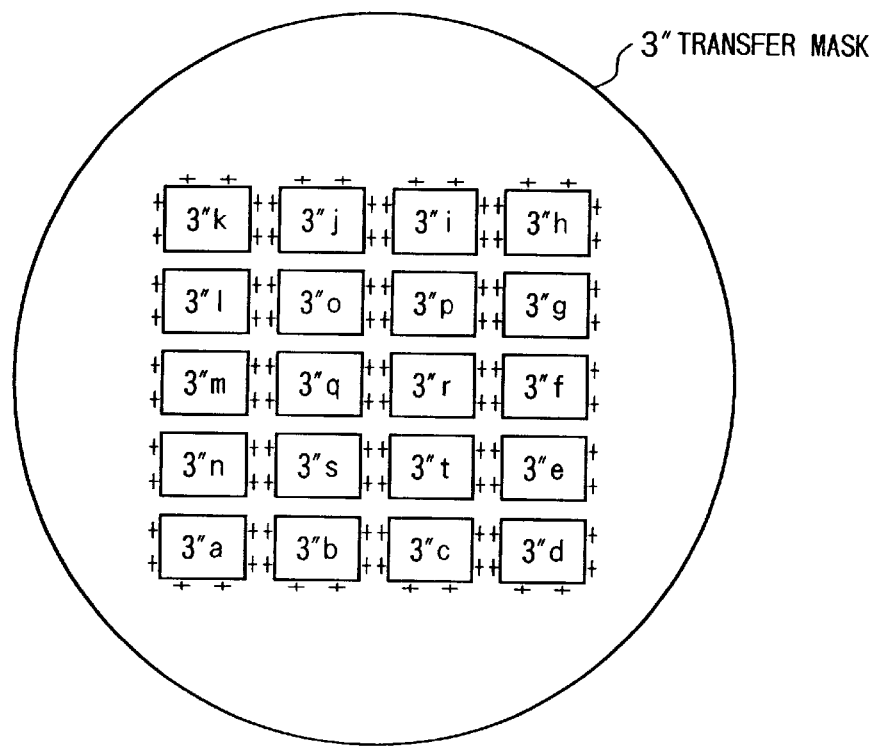
FIGS. 30A and 30B are schematic views for explaining mask stripes and wafer stripes in the ninth embodiment.
Figure 30B:
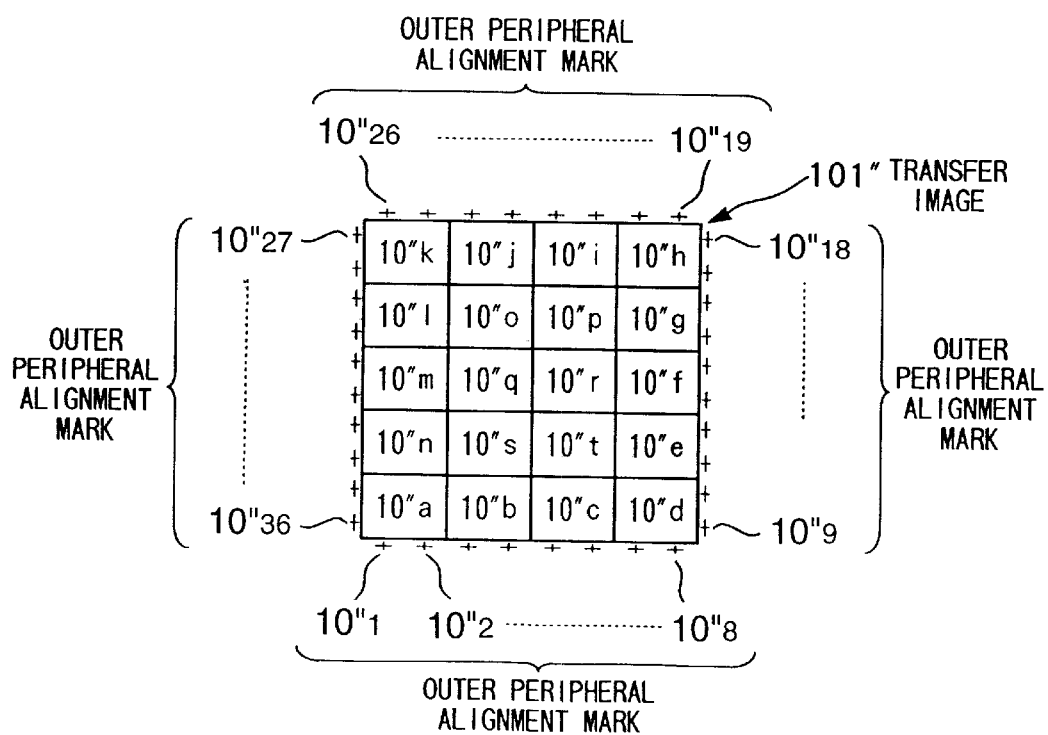
Figure 31:
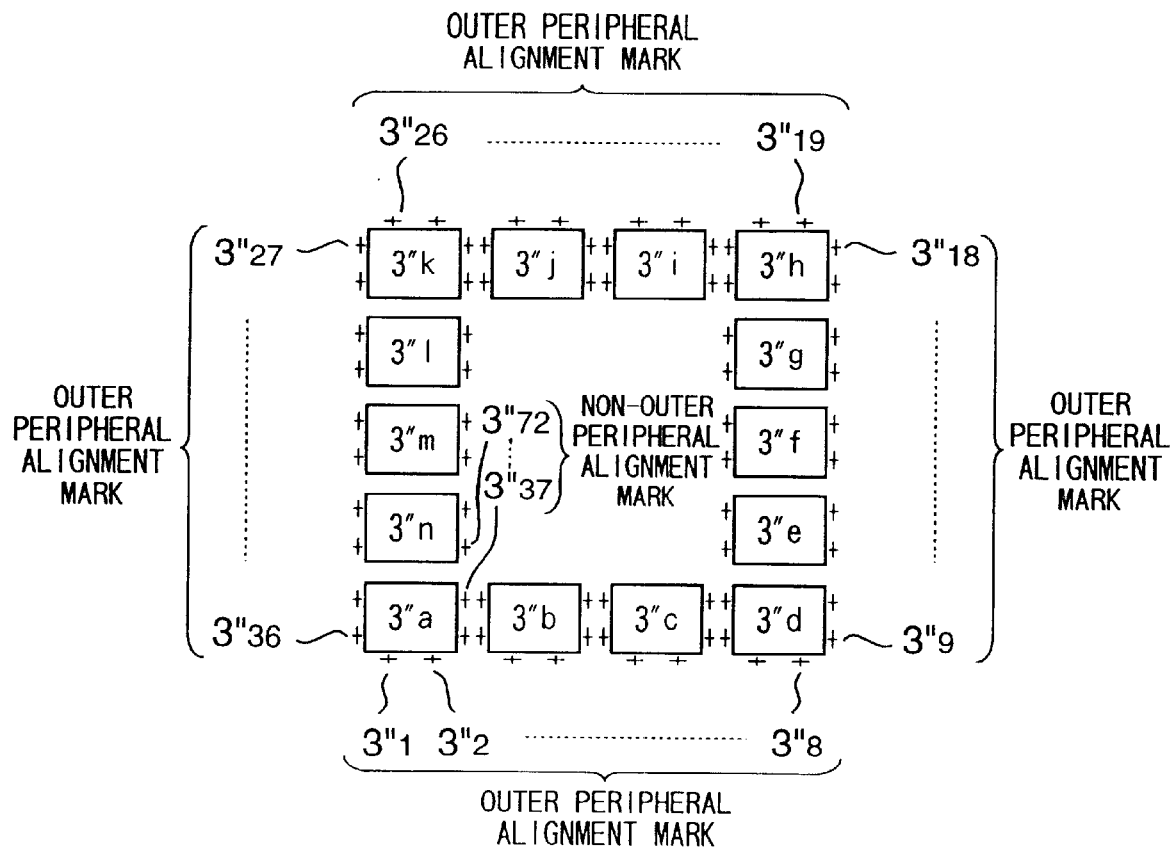
FIG. 31 is a view for explaining the relationship between outer peripheral mask stripes and alignment marks in the ninth embodiment.
Figure 32:
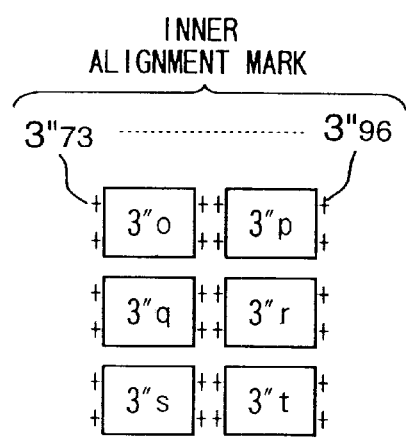
FIG. 32 is a view for explaining the relationship between inner mask stripes and alignment marks in the ninth embodiment.

FIG. 31 shows the relationship among the mask shots 3"a to 3"n, which are located on the outer periphery side of the matrix, of the mask stripes 3"a to 3"t on the transfer mask 3" shown in FIGS. 30A and 30B, outer peripheral alignment marks $3"_1$ to $3"_{36}$, which define the positions of these shots, and non-outer peripheral alignment marks $3"_{37}$ to $3"_{72}$. The outer peripheral alignment marks $3"_1$ to $3"_{36}$ are located around the mask shots 3"a to 3"n which form the outer sides of the matrix. On the other hand, the non-outer peripheral alignment marks $3"_{37}$ to $3"_{72}$ are on other sides of the mask shots 3"a to 3"n. FIG. 32 shows the relationship between the mask shots 3"o to 3"t inside the matrix of the mask shots 3"a to 3"t on the transfer mask 3" shown in FIGS. 30A and 30B, and inner alignment marks $3"_{73}$ to $3"_{96}$. The inner alignment marks $3"_{73}$ to $3"_{96}$ are on the right or left sides of the mask shots 3"o to 3"t.

In the shot layout shown in FIGS. 30A and 30B, the positions of wafer shots 10"o to 10"t cannot be directly defined since the inner alignment marks $3"_{73}$ to $3"_{96}$ of the mask shots 3"o to 3"t in a region inside the matrix cannot be transferred onto the wafer 10.

Figure 29A:
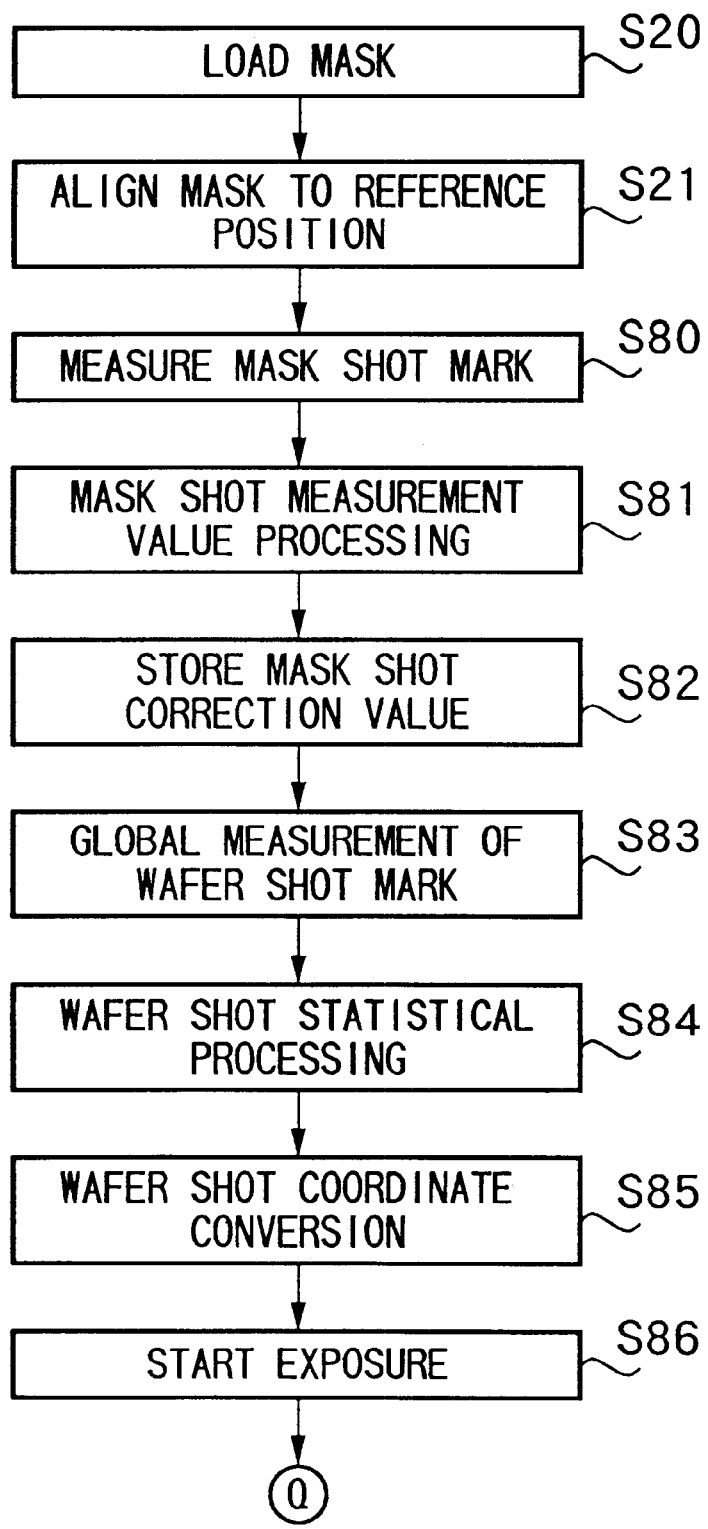
FIGS. 29A and 29B are flow charts for explaining a mask stripe transfer method according to the ninth embodiment of the present invention.
Figure 29B:
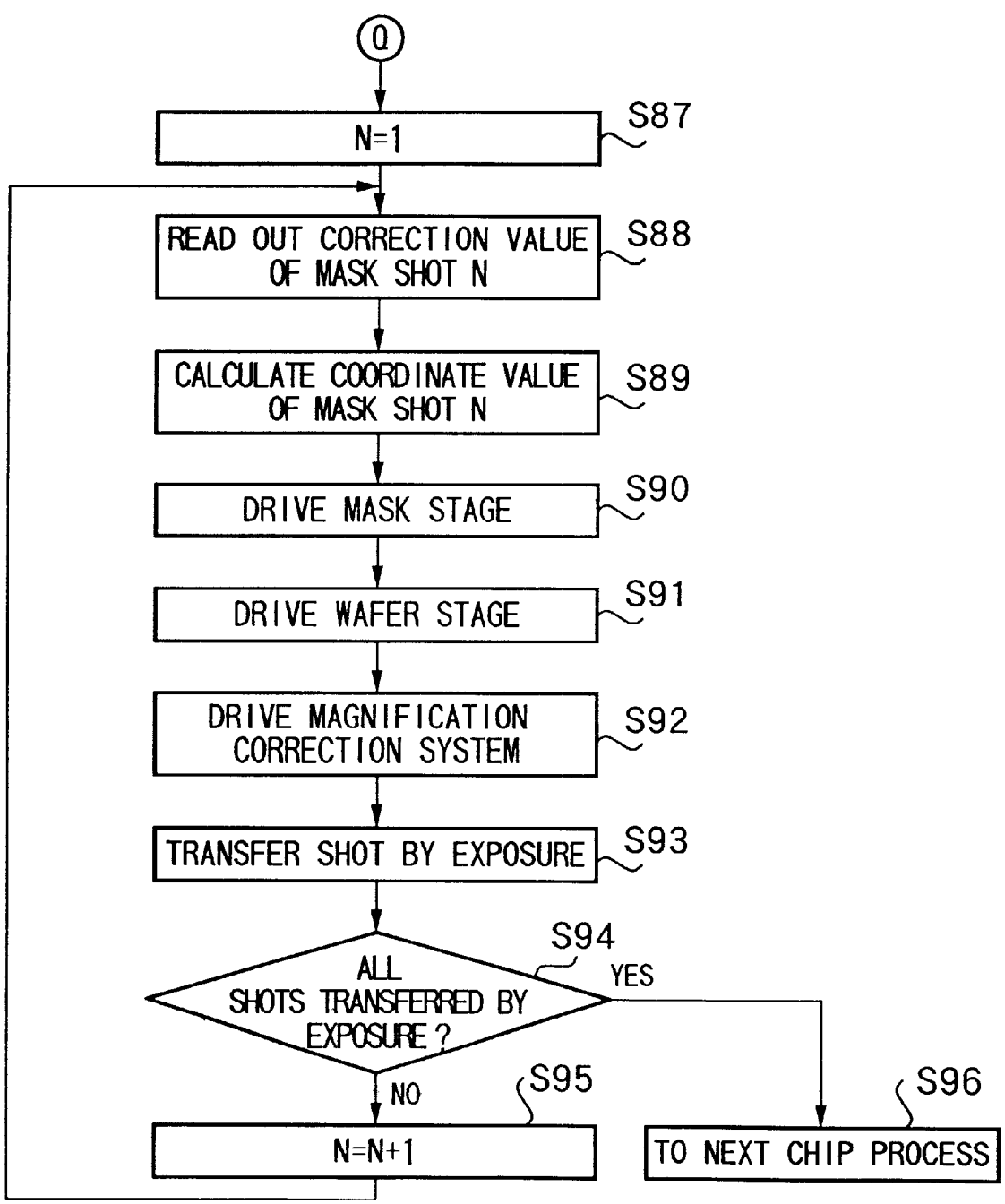

To solve such problem, the present invention proposes a global method, as will be described below. This embodiment will be explained using the flow charts shown in FIGS. 29A and 29B with reference to FIGS. 30A to 32.

In steps S20 and S21, the same processing as in the above embodiments is executed. In steps S80, S81, and S82, the positions of the alignment marks $3"_1$ to $3"_{96}$ of the mask shots 3"a to 3"t on the transfer mask 3" are measured, and correction values for shift, angle, and magnification components of the mask shots 3"a to 3"t are calculated and stored, as in the above-mentioned embodiments. Subsequently, the positions of outer peripheral alignment marks $10''_1$ to $10''_{36}$ of wafer shots $10''a$ to $10''n$ are measured (step S83).

Furthermore, in order to detect a virtual lattice that has assimilated evaluation results of deviations such as shift components, magnification components, rotation components, and the like of the measured positions of the wafer shots $10''a$ to $10''t$ with respect to a theoretical coordinate lattice of the wafer shots $10''a$ to $10''t$ $b$, e.g., the method of least squares or the like, the measurement values obtained in step S83 are statistically processed (step S84), and the current coordinate positions of the wafer shots $10''a$ to $10''t$ are mapped onto the coordinate system of the obtained virtual lattice to attain coordinate conversion (step S85). The processing after step S86 is the same as that in steps S27 to S35 in the sixth embodiment. That is, in step S87, a mask shot number N=1 is set. At this time, the mask shot used in exposure is the shot $3''a$. Then, the same processing (steps S88 to S93) as in the sixth embodiment is done, and it is checked if exposure is complete for all the mask shots $3''a$ to $3''t$ (step S94) If exposure has not been completed yet for all the mask shots $3''a$ to $3''t$, and the next shot is to be exposed, the mask shot number N is incremented by 1 (step S95), and the flow returns to step S88. The loop of steps S88 to S95 repeats itself to similarly process the mask shots $3''b$ to $3''t$. Upon completion of the processing for all the mask shots $3''a$ to $3''t$, the control leaves this loop, and advances to the next chip process (step S96).

To recapitulate, in this embodiment, even when the wafer shots $10''a$ to $10''t$ that form a chip or pattern include the wafer shots $10''o$ to $10''t$ having no marks that define their positions, transfer can be done, and the joint precision of the shots can be improved. Upon measuring the wafer shots $10''a$ to $10''t$, not all the shots that can be measured are measured, but the number of shots to be measured is decreased to shorten the measurement time.

As can be seen from the sixth to ninth embodiments described above, the mask shots (stripes) and wafer shots (stripes) are respectively corrected by the mask stage and wafer stage. However, since the mask and wafer have a given relative relationship determined by the transfer system therebetween, the mask stage and wafer stage can share components to be corrected. For example, of the components to be corrected, the shift components (x- and y-components) may be corrected by the wafer stage side, and the rotation component may be corrected by the mask stage side. Such components to be shared can be selected depending on the functions, performance, drive precision, and the like of the respective stages, thus further improving shot joint precision. Also, since a pattern is transferred by correcting the relative relationship between each mask shot and the transfer medium, the present invention can be applied to all transfer schemes that have a relative relationship between them, for example, step-and-repeat transfer schemes such as an equal-magnification projection transfer scheme, reduction projection transfer scheme, proximity transfer scheme, contact transfer scheme, and the like, and their scan transfer schemes.

Figure 22:
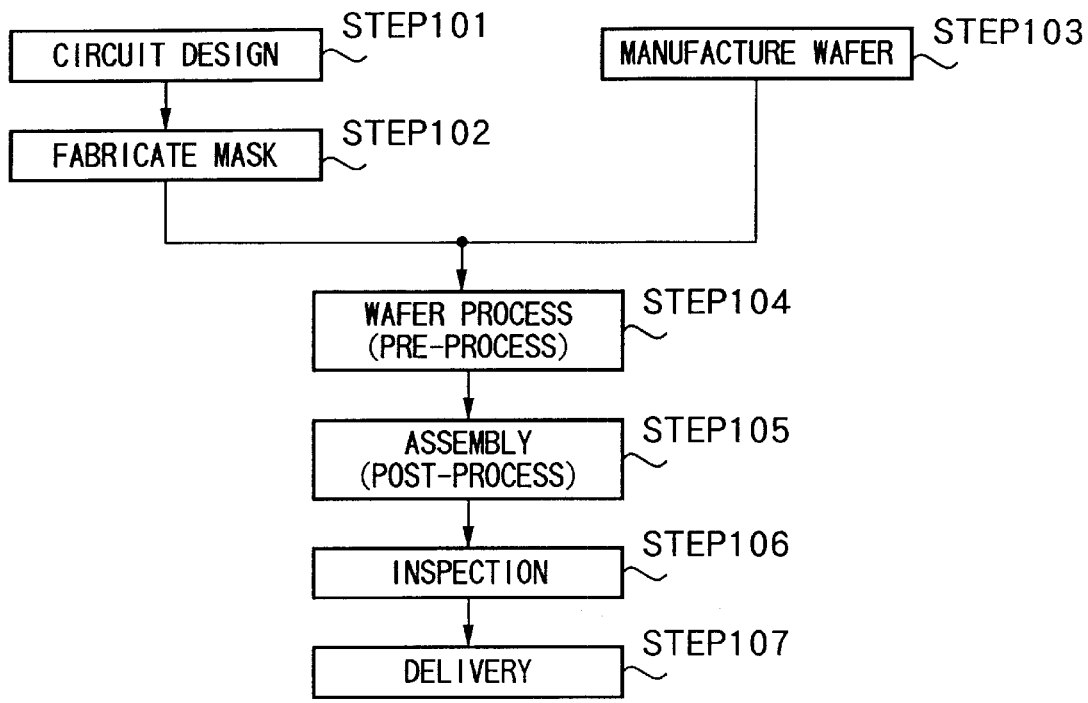
FIG. 22 is a flow chart showing the device manufacturing process.

An embodiment of a device manufacturing method using the aforementioned mask pattern transfer method will be explained below. FIG. 22 shows the flow in the manufacture of a microdevice (semiconductor chips such as ICs, LSIs, and the like, liquid crystal devices, thin film magnetic heads, micromachines, and the like). In step 101 (circuit design), the pattern design of a device is made. In step 102 (manufacture mask), a mask formed with the designed pattern is manufactured. In step 103 (fabricate wafer), a wafer is fabricated using materials such as silicon, glass, and the like. Step 104 (wafer process) is called a pre-process, and an actual circuit is formed by lithography using the prepared mask and wafer. The next step 105 (assembly) is called a post-process, in which semiconductor chips are assembled using the wafer obtained in step 104, and includes an assembly process (dicing, bonding), a packaging (encapsulating chips), and the like. In step 106 (inspection), inspections such as operation tests, durability tests, and the like of semiconductor devices assembled in step 105 are run. Semiconductor devices are completed via these processes, and are delivered (step 107).

Figure 23:
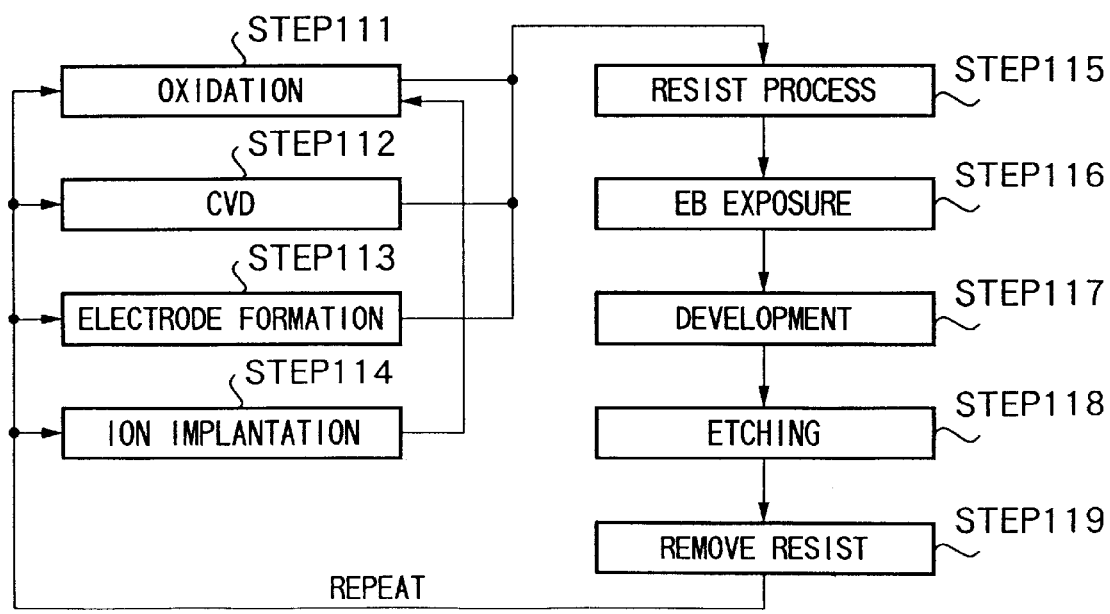
FIG. 23 is a flow chart showing the wafer processing shown in FIG. 22 in detail.

FIG. 23 shows the detailed flow of the wafer process. In step 111 (oxidation), the surface of the wafer is oxidized. In step 112 (CVD), an insulating film is formed on the wafer surface. In step 113 (electrode formation), electrodes are formed by deposition on the wafer. In step 114 (ion implantation), ions are implanted into the wafer. In step 115 (resist process), a resist is applied on the wafer. In step 116 (exposure), the circuit pattern on the mask is printed on a plurality of shot regions on the wafer by exposure using the above-mentioned exposure apparatus or method. In step 117 (development), the exposed wafer is developed. In step 118 (etching), the portion other than the developed resist image is removed by etching. In step 119 (remove resist), the resist film which has become unnecessary after etching is removed. By repeating these steps, multiple circuit patterns are formed on the wafer. Using the manufacturing method of this embodiment, a large-scale device, which can hardly be manufactured by a conventional method, can be manufactured with low cost.

The present invention is not limited to the above embodiments and various changes and modifications can be made within the spirit and scope of the present invention. Therefore, to apprise the public of the scope of the present invention the following claims are made.

What is claimed is:

1. A transfer method which uses a transfer mask formed with a plurality of partial transfer patterns and a plurality of alignment marks, and transfers the partial transfer patterns in turn onto a transfer medium, and consequently transfers a pattern obtained by joining the plurality of partial transfer patterns, said method comprising:

a measurement step of measuring positions of the alignment marks formed on the transfer mask;

a coordinate system determination step of determining an actual coordinate system of a matrix of the plurality of partial transfer patterns formed on the transfer mask on the basis of measurement results in the measurement step; and an alignment step of sequentially aligning the partial transfer patterns to the transfer medium on the basis of the actual coordinate system determined in the coordinate system determination step.

2. The method according to claim 1, wherein the alignment step has a parameter calculation step of calculating parameters that represent a relationship between the actual coordinate system of the matrix of the plurality of partial transfer patterns and a design coordinate system of the matrix of the plurality of partial transfer patterns, and includes a step of sequentially aligning the partial transfer patterns to the transfer medium on the basis of the parameters.

3. The method according to claim 2, further comprising the steps of:

calculating a fabrication coordinate system of the plurality of partial transfer patterns; and correcting the actual coordinate system on the basis of the fabrication coordinate system, and wherein the parameter calculation step includes the step of calculating parameters that represent a relationship between the corrected actual coordinate system and the design coordinate system.

4. The method according to claim 3, wherein the step of correcting the actual coordinate system includes a step of calculating a difference between an actual position and a design position of each of the partial transfer patterns and correcting the actual coordinate system on the basis of the difference.

5. The method according to claim 2, wherein the alignment step further has a transfer position determination step of determining positions of the partial transfer patterns and the transfer medium upon transferring the partial transfer patterns onto the transfer medium on the basis of the parameters, and includes the step of moving each of the partial transfer patterns and the transfer medium in turn to the positions determined in units of partial transfer patterns.

6. The method according to claim 1, further comprising a designation step of designating the alignment marks to be measured in the measurement step of the transfer mask, and wherein the measurement step includes the step of measuring the positions of the alignment marks designated in the designation step.

7. The method according to claim 1, further comprising a profile calculation step of calculating profiles that indicate discrepancy levels between design and actual partial transfer patterns in units of partial transfer patterns on the basis of the measurement results in the measurement step, and wherein the alignment step has a correction step of matching each of the actual partial transfer patterns with each of the corresponding design partial transfer patterns by moving the transfer mask on the basis of the calculated profiles every time each of the partial transfer patterns is transferred.

8. The method according to claim 1, further comprising a profile calculation step of calculating profiles that indicate rotation amounts and/or magnifications between design and actual partial transfer patterns in units of partial transfer patterns on the basis of the measurement results in the measurement step, and wherein the alignment step has a correction step of matching each of the actual partial transfer patterns with each of the corresponding design partial transfer patterns by moving the transfer mask on the basis of the calculated profiles every time each of the partial transfer patterns is transferred.

9. The method according to claim 1, further comprising a profile calculation step of calculating a profile that represents discrepancy levels between design and actual partial transfer patterns on the basis of the measurement results in the measurement step, and wherein the alignment step has a correction step of matching a plurality of actual partial transfer patterns with a plurality of design partial transfer patterns by moving the transfer mask on basis of the calculated profile.

10. The method according to claim 1, further comprising a profile calculation step of calculating a profile that represents rotation amounts and/or magnifications between design and actual partial transfer patterns on the basis of the measurement results in the measurement step, and wherein the alignment step has a correction step of matching a plurality of actual partial transfer patterns with a plurality of design partial transfer patterns by moving the transfer mask on basis of the calculated profile.

11. The method according to claim 1, wherein a charged beam is used upon transferring the partial transfer patterns in turn onto the transfer medium.

12. The method according to claim 1, wherein a charged beam having an arcuated section is used upon transferring the partial transfer patterns in turn onto the transfer medium.

13. A transfer method which uses a transfer mask formed with a plurality of partial transfer patterns and a plurality of alignment marks, and transfers the partial transfer patterns in turn onto a transfer medium formed with a lower-layer pattern and a plurality of alignment marks, and consequently transfers an upper-layer pattern obtained by joining the plurality of partial transfer patterns to overlap the lower-layer pattern on the transfer medium, said method comprising:

a first measurement step of measuring positions of the alignment marks formed on the transfer mask;

a first coordinate system determination step of determining a first coordinate system as an actual coordinate system of a matrix of the plurality of partial transfer patterns formed on the transfer mask on the basis of measurement results in the first measurement step;

a second measurement step of measuring positions of the alignment marks formed on the transfer medium;

a second coordinate system determination step of determining a second coordinate system as an actual coordinate system of the lower-layer pattern on the transfer medium on the basis of measurement results in the second measurement step; and an alignment step of sequentially aligning the partial transfer patterns to the lower-layer pattern on the basis of the first and second coordinate systems.

14. The method according to claim 13, wherein the alignment step includes the step of sequentially aligning the partial transfer patterns to the transfer medium while correcting positions of the transfer mask and transfer medium to match both the first and second coordinate systems with a reference coordinate system.

15. The method according to claim 13, further comprising:

a first parameter calculation step of calculating first parameters that represent a relationship between the first coordinate system and a reference coordinate system; and a second parameter calculation step of calculating second parameters that represent a relationship between the second coordinate system and the reference coordinate system, and wherein the alignment step includes the step of sequentially aligning the partial transfer patterns to the transfer medium on the basis of the first and second parameters.

16. The method according to claim 15, further comprising the steps of:

calculating a fabrication coordinate system of the plurality of partial transfer patterns; and correcting the first coordinate system on the basis of the fabrication coordinate system, and wherein the first parameter calculation step includes the step of calculating first parameters that represent a relationship between the corrected first coordinate system and the reference coordinate system.

17. The method according to claim 16, wherein the step of correcting the first coordinate system includes the step of calculating a difference between an actual position and a design position of each of the partial transfer patterns and correcting the first coordinate system on the basis of the difference.

18. The method according to claim 15, wherein the alignment step has:

a first transfer position determination step of determining positions to which the partial transfer patterns are to be moved upon transferring the partial transfer patterns onto the transfer medium in units of partial transfer patterns on the basis of the first parameters; and a second transfer position determination step of determining positions to which the transfer medium is to be moved upon transferring the partial transfer patterns onto the transfer medium in units of partial transfer patterns on the basis of the second parameters, and the alignment step includes the step of moving each of the partial transfer patterns and the transfer medium to the positions determined in the first and second transfer position determination steps every time each of the partial transfer patterns is transferred.

19. The method according to claim 13, further comprising a designation step of designating the alignment marks to be measured in the first measurement step of the transfer mask, and wherein the first measurement step includes the step of measuring positions of the alignment marks designated in the designation step.

20. The method according to claim 13, further comprising a designation step of designating the alignment marks to be measured in the second measurement step of the transfer medium, and wherein the second measurement step includes the step of measuring positions of the alignment marks designated in the designation step.

21. The method according to claim 13, further comprising:

a first designation step of designating the alignment marks to be measured in the first measurement step of the transfer mask; and a second designation step of designating the alignment marks to be measured in the second measurement step of the transfer medium; and wherein the first measurement step includes a step of measuring positions of the alignment marks designated in the first designation step, and the second measurement step includes a step of measuring positions of the alignment marks designated in the second designation step.

22. The method according to claim 13, further comprising a profile calculation step of calculating profiles that indicate discrepancy levels between design and actual partial transfer patterns in units of partial transfer patterns on the basis of the measurement results in the first measurement step, and wherein the alignment step has a correction step of matching each of the actual partial transfer patterns with each of the corresponding design partial transfer patterns by moving the transfer mask on the basis of the calculated profiles every time each of the partial transfer patterns is transferred.

23. The method according to claim 13, further comprising a profile calculation step of calculating profiles that indicate rotation amounts and/or magnifications between design and actual partial transfer patterns in units of partial transfer patterns on the basis of the measurement results in the first measurement step, and wherein the alignment step has a correction step of matching each of the actual partial transfer patterns with each of the corresponding design partial transfer patterns by moving the transfer mask on the basis of the calculated profiles every time each of the partial transfer patterns is transferred.

24. The method according to claim 13, further comprising a profile calculation step of calculating a profile that represents discrepancy levels between design and actual partial transfer patterns on the basis of the measurement results in the first measurement step, and wherein the alignment step has a correction step of matching a plurality of actual partial transfer patterns with a plurality of design pattern transfer patterns by moving the transfer mask on the basis of the calculated profile.

25. The method according to claim 13, wherein the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns on the transfer mask for the lower layer, said method further comprises a calculation step of calculating profiles that indicate discrepancy levels between design and actual partial patterns on the transfer medium in units of partial patterns on the basis of the measurement results in the second measurement step, and the alignment step has a correction step of correcting an image to be transferred onto the transfer medium via each of the partial transfer patterns on the basis of the calculated profiles every time each of the partial transfer patterns is transferred, thereby aligning each of the partial transfer patterns to each of the partial patterns on the transfer medium.

26. The method according to claim 13, wherein the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns on the transfer mask for the lower layer, said method further comprises a calculation step of calculating profiles that indicate rotation amounts and/or magnifications between design and actual partial patterns on the transfer medium in units of partial patterns on the basis of the measurement results in the second measurement step, and the alignment step has a correction step of correcting an image to be transferred onto the transfer medium via each of the partial transfer patterns on the basis of the calculated profiles every time each of the partial transfer patterns is transferred, thereby aligning each of the partial transfer patterns to each of the partial patterns on the transfer medium.

27. The method according to claim 13, wherein the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns, said method further comprises a calculation step of calculating a profile that represents discrepancy levels between design and actual partial patterns on the transfer medium on the basis of the measurement results in the second measurement step, and the alignment step has a correction step of commonly correcting a plurality of images to be transferred onto the transfer medium via the plurality of partial transfer patterns on the basis of the calculated profile, thereby aligning the partial transfer patterns to the corresponding partial patterns on the transfer medium.

28. The method according to claim 13, wherein the lower-layer pattern formed on the transfer medium is formed using a transfer mask for a lower layer having a plurality of partial transfer patterns to be joined on the transfer medium, and alignment marks corresponding to the partial transfer patterns, and the transfer medium is formed with alignment marks in correspondence with a plurality of partial patterns formed by transferring the plurality of partial transfer patterns, said method further comprises:
   a first profile calculation step of calculating first profiles that represent discrepancy levels between design and actual partial transfer patterns on the basis of the measurement results in the first measurement step, and
   a calculation step of calculating second profiles that represent discrepancy levels between design and actual partial patterns on the transfer medium on the basis of the measurement results in the second measurement step, and
   the alignment step has:
      a first correction step of matching each of the actual partial transfer patterns with the corresponding design partial transfer patterns by moving the transfer mask on the basis of the calculated first profiles; and
      a second correction step of correcting an image to be transferred onto the transfer medium via each of the partial transfer patterns on the basis of the calculated second profiles, thereby aligning the partial transfer patterns to the corresponding partial patterns on the transfer medium.

29. The method according to claim 13, wherein a charged beam is used upon transferring the partial transfer patterns in turn onto the transfer medium.

30. The method according to claim 13, wherein a charged beam having an arcuated section is used upon transferring the partial transfer patterns in turn onto the transfer medium.

31. A transfer method which uses a transfer mask formed with a plurality of partial transfer patterns and a plurality of alignment marks, and transfers the partial transfer patterns in turn onto a transfer medium, and consequently transfers a pattern obtained by joining the plurality of partial transfer patterns, said method comprising:

a dividing step of dividing the plurality of partial transfer patterns into a plurality of groups;

a measurement step of measuring positions of the alignment marks corresponding to the partial transfer patterns that belong to the divided groups;

a coordinate system determination step of determining actual coordinate systems of matrices of the partial transfer patterns that belong to the groups on the basis of measurement results in the measurement step; and an alignment step of sequentially aligning the partial transfer patterns that belong to the group of interest to the transfer medium in units of groups on the basis of the coordinate system of the group of interest determined in the coordinate system determination step.

32. A transfer method which uses a transfer mask formed with a plurality of partial transfer patterns and a plurality of alignment marks, and transfers the partial transfer patterns in turn onto a transfer medium, and consequently transfers a pattern obtained by joining the plurality of partial transfer patterns, said method comprising:

a dividing step of dividing the plurality of partial transfer patterns into a plurality of groups; and executing, in units of groups:

a measurement step of measuring positions of the alignment marks corresponding to the partial transfer patterns that belong to the group of interest;

a coordinate system determination step of determining actual coordinate systems of a matrix of the partial transfer patterns that belong to the group of interest on the basis of measurement results in the measurement step; and an alignment step of sequentially aligning the partial transfer patterns that belong to the group of interest to the transfer medium on the basis of the coordinate system of the group of interest determined in the coordinate system determination step.

33. A method of manufacturing a device using lithography, said method comprising the steps of:
   applying a resist on a substrate;
   transferring a pattern onto the resist by the transfer method of claim 1; and
   developing the resist with the transferred pattern.

34. A method of manufacturing a device using lithography, said method comprising the steps of:
   applying a resist on a substrate;
   transferring a pattern onto the resist by the transfer method of claim 13; and
   developing the resist with the transferred pattern.

35. A method of manufacturing a device using lithography, said method comprising the steps of:
   applying a resist on a substrate;
   transferring a pattern onto the resist by the transfer method of claim 31; and
   developing the resist with the transferred pattern.

36. A method of manufacturing a device using lithography, said method comprising the steps of:
   applying a resist on a substrate;
   transferring a pattern onto the resist by the transfer method of claim 32; and
   developing the resist with the transferred pattern.

37. The method according to claim 1, wherein transfer is effected every time alignment is made in the alignment step.

38. The method according to claim 13, wherein transfer is effected every time alignment is made in the alignment step.

39. The method according to claim 31, wherein transfer is effected every time alignment is made in the alignment step.

40. The method according to claim 32, wherein transfer is effected every time alignment is made in the alignment step.

* * * * *

UNITED STATES PATENT AND TRADEMARK OFFICE
CERTIFICATE OF CORRECTION

PATENT NO. : 6,455,211 B1
DATED : September 24, 2002
INVENTOR(S) : Yoshikiyo Yui et al.

It is certified that error appears in the above-identified patent and that said Letters Patent is hereby corrected as shown below:

Column 12,
Line 17, "3c4" should read -- 3c4, -- and "3e4" should read -- 3e4, --.
Line 27, "3c4" should read -- 3c4, -- and "3e4" should read -- 3e4, --.
Line 39, "3c4" should read -- 3c4, -- and "3e4" should read -- 3e4, --.
Line 45, "3c4" should read -- 3c4, -- and "3e4" should read -- 3e4, --.

Column 27,
Line 64, "layers" should read -- layer --.

Column 30,
Line 46, "m ask" should read -- mask --.

Column 32,
Line 12, "S72)" should read -- S72). --.

Signed and Sealed this

Eighteenth Day of February, 2003

JAMES E. ROGAN
*Director of the United States Patent and Trademark Office*